United States Patent
Moore et al.

(10) Patent No.: US 12,025,435 B2
(45) Date of Patent: *Jul. 2, 2024

(54) MULTI-STAGE DEVICE AND PROCESS FOR PRODUCTION OF A LOW SULFUR HEAVY MARINE FUEL OIL

(71) Applicant: Magēmā Technology LLC, Houston, TX (US)

(72) Inventors: Michael Joseph Moore, Houston, TX (US); Bertrand Ray Klussmann, Houston, TX (US); Carter James White, Houston, TX (US)

(73) Assignee: Magēmā Technology LLC, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/856,867

(22) Filed: Jul. 1, 2022

(65) Prior Publication Data
US 2022/0381547 A1    Dec. 1, 2022

Related U.S. Application Data

(63) Continuation-in-part of application No. 17/199,148, filed on Mar. 11, 2021, now Pat. No. 11,441,084,
(Continued)

(51) Int. Cl.
*G01B 7/14*    (2006.01)
*G01N 22/00*    (2006.01)
(Continued)

(52) U.S. Cl.
CPC ............. *G01B 7/14* (2013.01); *G01N 22/00* (2013.01); *G01R 27/00* (2013.01); *G01R 27/02* (2013.01);
(Continued)

(58) Field of Classification Search
CPC .... G01R 27/04; G01R 27/00; G01R 27/2605; G01R 27/06; G01R 27/02; G01R 23/00;
(Continued)

(56) References Cited

U.S. PATENT DOCUMENTS 3,163,593 A    12/1964 Webster et al.
3,227,645 A    1/1966 Frumkin et al.
(Continued)

FOREIGN PATENT DOCUMENTS

CA    1054130    5/1979
CA    1060370    8/1979
(Continued)

OTHER PUBLICATIONS

James G. Speight, The Desulfurization of Heavy Oils and Residua, 2nd Ed. 1999, Chapter 5, pp. 168-205, Marcel Dekker Inc. New York NY US.
(Continued)

*Primary Examiner* — Prem C Singh
*Assistant Examiner* — Brandi M Doyle
(74) *Attorney, Agent, or Firm* — Carter J White

(57) ABSTRACT

A multi-stage process for the production of an ISO 8217 Table 2 residual marine fuel Product Heavy Marine Fuel Oil from a Feedstock Heavy Marine Fuel Oil that is ISO 8217:2017 Table 2 compliant except for the Environmental Contaminants involves a Reaction System composed of one or more reactor vessels selected from a group reactor wherein said one or more reactor vessels contains one or more reaction sections configured to promote the transformation of the Feedstock Heavy Marine Fuel Oil to the Product Heavy Marine Fuel Oil. The Product Heavy Marine Fuel Oil has an Environmental Contaminant level less than 0.5 wt % and preferably a maximum sulfur content (ISO 14596 or ISO 8754) between the range of 0.05 mass % to 0.5
(Continued)

mass %. A process plant for conducting the process for conducting the process is also disclosed.

8 Claims, 11 Drawing Sheets

Related U.S. Application Data which is a continuation of application No. 16/681,063, filed on Nov. 12, 2019, now Pat. No. 10,954,456, which is a continuation of application No. 16/103,895, filed on Aug. 14, 2018, now Pat. No. 10,563,133, application No. 17/856,867 is a continuation-in-part of application No. 16/103,884, filed on Aug. 14, 2018, now abandoned, which is a continuation-in-part of application No. PCT/US2018/017863, filed on Feb. 12, 2018, and a continuation-in-part of application No. PCT/US2018/017855, filed on Feb. 12, 2018.

(60) Provisional application No. 62/589,479, filed on Nov. 21, 2017, provisional application No. 62/458,002, filed on Feb. 12, 2017.

(51) Int. Cl.
G01R 27/00 (2006.01)
G01R 27/02 (2006.01)
G01R 27/04 (2006.01)
G01R 27/06 (2006.01)
G01R 27/26 (2006.01)
H03K 17/955 (2006.01)
G01R 21/00 (2006.01)
G01R 23/00 (2006.01)
G01R 27/32 (2006.01)
H03K 17/96 (2006.01)

(52) U.S. Cl.
CPC .............. *G01R 27/04* (2013.01); *G01R 27/06* (2013.01); *G01R 27/2605* (2013.01); *H03K 17/955* (2013.01); *G01R 21/00* (2013.01); *G01R 23/00* (2013.01); *G01R 27/32* (2013.01); *H03K 2017/9606* (2013.01)

(58) Field of Classification Search
CPC ........ G01R 21/00; G01R 27/32; G01N 22/00; C10L 1/08; G01B 21/32; G01B 7/14; C10G 65/04; C10G 45/04; H03K 17/955; H03K 2017/9606
See application file for complete search history.

(56) References Cited

U.S. PATENT DOCUMENTS

| | | |
|---|---|---|
| 3,234,121 A | 2/1966 | Maclaren |
| 3,287,254 A | 11/1966 | Paterson |
| 3,306,845 A | 2/1967 | Poll |
| 3,531,398 A | 9/1970 | Adams |
| 3,544,452 A | 12/1970 | Jaffe |
| 3,551,328 A | 12/1970 | Cole et al. |
| 3,562,800 A | 2/1971 | Carlson et al. |
| 3,577,353 A | 5/1971 | White |
| 3,658,681 A | 4/1972 | Wilson et al. |
| 3,668,116 A | 6/1972 | Adams et al. |
| 3,684,688 A | 8/1972 | Roselius |
| 3,749,664 A | 7/1973 | Mickleson |
| 3,809,644 A | 5/1974 | Johonson et al. |
| 3,814,683 A | 6/1974 | Christman et al. |
| 3,859,199 A | 1/1975 | Gatsis |
| 3,880,598 A | 4/1975 | Van Der Toorn |
| 3,893,909 A | 7/1975 | Selvidge |
| 3,902,991 A | 9/1975 | Christensen et al. |
| 3,910,834 A | 10/1975 | Anderson |
| 3,968,026 A | 7/1976 | Frayer et al. |
| 4,006,076 A | 2/1977 | Christensen et al. |
| 4,017,382 A | 4/1977 | Bonnell et al. |
| 4,051,021 A | 9/1977 | Hamner |
| 4,054,508 A | 10/1977 | Milstein et al. |
| 4,089,774 A | 5/1978 | Oleck et al. |
| 4,115,248 A | 9/1978 | Mulaskey |
| 4,118,310 A | 10/1978 | Frayer et al. |
| 4,138,227 A | 2/1979 | Wilson et al. |
| 4,225,421 A | 9/1980 | Hensley, Jr. et al. |
| 4,267,033 A | 5/1981 | Heck et al. |
| 4,306,964 A | 12/1981 | Angevine |
| 4,357,263 A | 11/1982 | Heck et al. |
| 4,404,097 A | 9/1983 | Angevine et al. |
| 4,420,388 A | 12/1983 | Bertolacini et al. |
| 4,430,198 A | 2/1984 | Heck et al. |
| 4,460,707 A | 7/1984 | Simpson |
| 4,498,972 A | 2/1985 | Toulhoat et al. |
| 4,499,203 A | 2/1985 | Toulhoat et al. |
| 4,510,042 A | 4/1985 | Billon et al. |
| 4,548,710 A | 10/1985 | Simpson |
| 4,552,650 A | 11/1985 | Toulhoat et al. |
| 4,604,185 A | 8/1986 | McConaghy, Jr. et al. |
| 4,645,584 A | 2/1987 | Didchenko et al. |
| 4,925,554 A | 5/1990 | Sato et al. |
| 5,167,796 A | 12/1992 | Didchenko et al. |
| 5,306,419 A | 4/1994 | Harrison et al. |
| 5,342,507 A | 8/1994 | Dai et al. |
| 5,374,350 A | 12/1994 | Heck et al. |
| 5,389,595 A | 2/1995 | Simpson et al. |
| 5,391,304 A | 2/1995 | Lantos |
| 5,401,392 A | 3/1995 | Courty et al. |
| 5,417,846 A | 5/1995 | Renard |
| 5,543,036 A | 8/1996 | Chang et al. |
| 5,591,325 A | 1/1997 | Higashi |
| 5,620,592 A | 4/1997 | Threlkel |
| 5,622,616 A | 4/1997 | Porter et al. |
| 5,686,375 A | 11/1997 | Iyer et al. |
| 5,759,385 A | 6/1998 | Aussillous et al. |
| 5,779,992 A | 7/1998 | Higashi |
| 5,827,421 A | 10/1998 | Sherwood, Jr. |
| 5,837,130 A | 11/1998 | Crossland |
| 5,868,923 A | 2/1999 | Porter et al. |
| 5,882,364 A | 3/1999 | Dilworth |
| 5,888,379 A | 3/1999 | Ushio et al. |
| 5,897,768 A | 4/1999 | McVicker et al. |
| 5,917,101 A | 6/1999 | Munoz |
| 5,922,189 A | 7/1999 | Santos |
| 5,928,501 A | 7/1999 | Sudhakar et al. |
| 5,948,239 A | 9/1999 | Virdi et al. |
| 5,958,816 A | 9/1999 | Neuman et al. |
| 5,961,709 A | 10/1999 | Hayner et al. |
| 5,976,361 A | 11/1999 | Hood et al. |
| 5,997,723 A | 12/1999 | Wiehe et al. |
| 6,017,443 A | 1/2000 | Buchanan |
| 6,117,306 A | 9/2000 | Morel et al. |
| 6,136,179 A | 10/2000 | Sherwood, Jr. et al. |
| 6,160,193 A | 12/2000 | Gore |
| 6,162,350 A | 12/2000 | Soled et al. |
| 6,171,477 B1 | 1/2001 | Morel et al. |
| 6,171,478 B1 | 1/2001 | Cabrera et al. |
| 6,193,766 B1 | 2/2001 | Jordan |
| 6,203,695 B1 | 3/2001 | Harle et al. |
| 6,207,041 B1 | 3/2001 | Morel et al. |
| 6,217,749 B1 | 4/2001 | Espeillac et al. |
| 6,251,262 B1 | 6/2001 | Hatanaka et al. |
| 6,251,263 B1 | 6/2001 | Hatanaka et al. |
| 6,265,629 B1 | 7/2001 | Fava et al. |
| 6,299,759 B1 | 10/2001 | Bradway et al. |
| 6,303,531 B1 | 10/2001 | Lussier et al. |
| 6,306,287 B1 | 10/2001 | Billon et al. |
| 6,306,289 B1 | 10/2001 | Hayashi et al. |
| 6,328,880 B1 | 12/2001 | Yoshita et al. |
| 6,344,136 B1 | 2/2002 | Butler et al. |
| 6,383,975 B1 | 5/2002 | Rocha et al. |
| 6,402,940 B1 | 6/2002 | Rappas |
| 6,406,615 B1 | 6/2002 | Iwamoto et al. |
| 6,531,054 B1 | 3/2003 | Gerritsen et al. |

(56) References Cited

U.S. PATENT DOCUMENTS

| | | |
|---|---|---|
| 6,540,904 B1 | 4/2003 | Gun et al. |
| 6,554,994 B1 | 4/2003 | Reynolds et al. |
| 6,566,296 B2 | 5/2003 | Plantenga et al. |
| 6,576,584 B1 | 6/2003 | Ijima et al. |
| 6,589,908 B1 | 7/2003 | Ginestra et al. |
| 6,620,313 B1 | 9/2003 | Soled et al. |
| 6,649,042 B2 | 11/2003 | Dassori et al. |
| 6,656,348 B2 | 12/2003 | Dassori et al. |
| 6,656,349 B1 | 12/2003 | Fujita et al. |
| 6,673,230 B2 | 1/2004 | Hagen |
| 6,673,245 B2 | 1/2004 | Nasser, Jr. et al. |
| 6,712,955 B1 | 3/2004 | Soled et al. |
| 6,733,659 B1 | 5/2004 | Kure et al. |
| 6,774,275 B2 | 8/2004 | Smith, Jr. et al. |
| 6,783,661 B1 | 8/2004 | Briot et al. |
| 6,797,153 B1 | 9/2004 | Fukuyama et al. |
| 6,827,845 B2 | 12/2004 | Gong et al. |
| 6,858,132 B2 | 2/2005 | Kumagai et al. |
| 6,860,987 B2 | 3/2005 | Plantenga et al. |
| 6,863,803 B1 | 3/2005 | Riley et al. |
| 6,929,738 B1 | 8/2005 | Riley et al. |
| 6,984,310 B2 | 1/2006 | Ginstra et al. |
| 7,001,503 B1 | 2/2006 | Koyama et al. |
| 7,108,779 B1 | 9/2006 | Thakkar |
| 7,119,045 B2 | 10/2006 | Magna et al. |
| 7,166,209 B2 | 1/2007 | Dassori |
| 7,169,294 B2 | 1/2007 | Abe et al. |
| 7,232,515 B1 | 6/2007 | Demmin et al. |
| 7,244,350 B2 | 7/2007 | Martin et al. |
| 7,265,075 B2 | 9/2007 | Tsukada et al. |
| 7,276,150 B2 | 10/2007 | Nagamatsu et al. |
| 7,288,182 B1 | 10/2007 | Soled et al. |
| 7,384,537 B2 | 6/2008 | Nagamatsu et al. |
| 7,402,547 B2 | 7/2008 | Wellington et al. |
| 7,413,646 B2 | 8/2008 | Wellington et al. |
| 7,416,653 B2 | 8/2008 | Wellington |
| 7,449,102 B2 | 11/2008 | Kalnes |
| 7,491,313 B2 | 2/2009 | Toshima et al. |
| 7,507,325 B2 | 3/2009 | Gueret et al. |
| 7,513,989 B1 | 4/2009 | Soled et al. |
| 7,517,446 B2 | 4/2009 | Lott |
| 7,534,342 B2 | 5/2009 | Bhan et al. |
| 7,585,406 B2 | 9/2009 | Khadzhiev et al. |
| 7,588,681 B2 | 9/2009 | Bhan et al. |
| 7,651,604 B2 | 1/2010 | Juarez et al. |
| 7,651,605 B2 | 1/2010 | Sahara et al. |
| 7,695,610 B2 | 4/2010 | Bolshakov et al. |
| 7,713,905 B2 | 5/2010 | Dufresne et al. |
| 7,718,050 B2 | 5/2010 | Gueret et al. |
| 7,754,162 B2 | 7/2010 | Dassori |
| 7,901,569 B2 | 3/2011 | Farshid et al. |
| 7,938,955 B2 | 5/2011 | Araki et al. |
| 7,943,035 B2 | 5/2011 | Chornet et al. |
| 8,012,343 B2 | 9/2011 | Plantenga et al. |
| 8,021,538 B2 | 9/2011 | Klein |
| 8,114,806 B2 | 2/2012 | Bhan et al. |
| 8,133,446 B2 | 3/2012 | McGehee et al. |
| 8,163,166 B2 | 4/2012 | Wellington et al. |
| 8,173,570 B2 | 5/2012 | Maesen et al. |
| 8,193,401 B2 | 6/2012 | McGehee et al. |
| 8,241,489 B2 | 8/2012 | Bhan et al. |
| 8,268,164 B2 | 9/2012 | Wellington et al. |
| 8,318,000 B2 | 11/2012 | Bhan et al. |
| 8,318,628 B2 | 11/2012 | Brun et al. |
| 8,343,887 B2 | 1/2013 | Maesen et al. |
| 8,371,741 B2 | 2/2013 | Hassan |
| 8,372,268 B2 | 2/2013 | Ginestra et al. |
| 8,394,254 B2 | 3/2013 | Wellington et al. |
| 8,394,262 B2 | 3/2013 | Guichard et al. |
| 8,475,651 B2 | 7/2013 | Nemec et al. |
| 8,506,794 B2 | 8/2013 | Bhan et al. |
| 8,546,626 B2 | 10/2013 | Daudin et al. |
| 8,563,456 B2 | 10/2013 | Dillon et al. |
| 8,608,938 B2 | 12/2013 | Wellington et al. |
| 8,608,946 B2 | 12/2013 | Bhan et al. |
| 8,613,851 B2 | 12/2013 | Wellington et al. |
| 8,652,817 B2 | 2/2014 | Wood et al. |
| 8,663,453 B2 | 3/2014 | Wellington et al. |
| 8,679,319 B2 | 3/2014 | Milam et al. |
| 8,679,322 B2 | 3/2014 | Marzin et al. |
| 8,702,970 B2 | 4/2014 | Maesen et al. |
| 8,716,164 B2 | 5/2014 | Dillon et al. |
| 8,721,871 B1 | 5/2014 | Dindi et al. |
| 8,722,558 B2 | 5/2014 | Konno et al. |
| 8,722,563 B2 | 5/2014 | Soled et al. |
| 8,722,564 B2 | 5/2014 | Soled et al. |
| 8,741,129 B2 | 6/2014 | Brown et al. |
| 8,747,659 B2 | 6/2014 | Kiss et al. |
| 8,764,972 B2 | 7/2014 | Bhan et al. |
| 8,784,646 B2 | 7/2014 | Sanchez et al. |
| 8,795,514 B2 | 8/2014 | Kimura et al. |
| 8,821,714 B2 | 9/2014 | Chaumonnot et al. |
| 8,877,040 B2 | 11/2014 | Hoehn et al. |
| 8,894,838 B2 | 11/2014 | Dindi et al. |
| 8,926,826 B2 | 1/2015 | Dindi et al. |
| 8,946,110 B2 | 2/2015 | Toledo Antonio et al. |
| 8,962,514 B2 | 2/2015 | Seki et al. |
| 8,987,537 B1 | 3/2015 | Droubi et al. |
| 8,999,011 B2 | 4/2015 | Stern |
| 9,057,035 B1 | 6/2015 | Kraus et al. |
| 9,074,143 B2 | 7/2015 | McGehee et al. |
| 9,102,884 B2 | 8/2015 | Xu et al. |
| 9,109,176 B2 | 8/2015 | Stern et al. |
| 9,127,215 B2 | 9/2015 | Choi et al. |
| 9,127,218 B2 | 9/2015 | Banerjee et al. |
| 9,139,782 B2 | 9/2015 | Dindi et al. |
| 9,206,363 B2 | 12/2015 | Woo et al. |
| 9,212,323 B2 | 12/2015 | Dindi et al. |
| 9,216,407 B2 | 12/2015 | Duma et al. |
| 9,234,145 B2 | 1/2016 | Banerjee et al. |
| 9,260,671 B2 | 2/2016 | Shafi et al. |
| 9,278,339 B2 | 3/2016 | Bellussi et al. |
| 9,340,733 B2 | 5/2016 | Marchand et al. |
| 9,359,561 B2 | 6/2016 | Bazer-Bachi et al. |
| 9,365,781 B2 | 6/2016 | Dindi |
| 9,365,782 B2 | 6/2016 | Dindi |
| 9,387,466 B2 | 7/2016 | Rana et al. |
| 9,434,893 B2 | 9/2016 | Dufresne |
| 9,458,396 B2 | 10/2016 | Weiss et al. |
| 9,487,718 B2 | 11/2016 | Kraus et al. |
| 9,499,758 B2 | 11/2016 | Droubi et al. |
| 9,512,319 B2 | 12/2016 | Chatron-Michaud et al. |
| 9,540,573 B2 | 1/2017 | Bhan |
| 9,546,327 B2 | 1/2017 | Krasu et al. |
| 9,605,215 B2 | 3/2017 | Lott et al. |
| 9,624,448 B2 | 4/2017 | Joo et al. |
| 9,650,312 B2 | 5/2017 | Baldassari et al. |
| 9,650,580 B2 | 5/2017 | Merdrignac |
| 9,657,236 B2 | 5/2017 | Yang et al. |
| 9,675,968 B2 | 6/2017 | Alonso Nunez et al. |
| 9,737,883 B2 | 8/2017 | Yamane et al. |
| 9,803,152 B2 | 10/2017 | Kar |
| 9,896,630 B2 | 2/2018 | Weiss et al. |
| 9,908,105 B2 | 3/2018 | Duma et al. |
| 9,908,107 B2 | 3/2018 | Osaki et al. |
| 9,919,293 B1 | 3/2018 | Rana et al. |
| 9,920,270 B2 | 3/2018 | Robinson et al. |
| 10,072,221 B2 | 9/2018 | Bazer-Bachi et al. |
| 10,138,438 B2 | 11/2018 | Houten |
| 10,144,882 B2 | 12/2018 | Dindi et al. |
| 10,150,930 B2 | 12/2018 | Houten |
| 10,260,009 B2 | 4/2019 | Ackerson et al. |
| 10,308,884 B2 | 6/2019 | Klussman et al. |
| 10,443,006 B1 | 10/2019 | Fruchey et al. |
| 10,501,699 B2 | 12/2019 | Robinson et al. |
| 10,518,251 B2 | 12/2019 | Matsushita et al. |
| 10,533,141 B2 | 1/2020 | Moore et al. |
| 10,563,133 B2 | 2/2020 | Moore et al. |
| 10,584,287 B2 | 3/2020 | Klussman et al. |
| 10,597,591 B2 | 3/2020 | Weiss et al. |
| 10,597,594 B1 | 3/2020 | Fruchey et al. |
| 10,604,709 B2 | 3/2020 | Moore et al. |
| 10,640,718 B2 | 5/2020 | Wohaibi et al. |
| 10,668,451 B2 | 6/2020 | Boualleg et al. |

(56) References Cited

U.S. PATENT DOCUMENTS

| | | |
|---|---|---|
| 10,683,461 B2 | 6/2020 | Wohaibi et al. |
| 10,876,053 B2 | 6/2020 | Klussmann et al. |
| 10,717,938 B2 | 7/2020 | Ackerson et al. |
| 10,760,020 B2 | 9/2020 | Kashio et al. |
| 10,800,982 B2 | 10/2020 | Peer et al. |
| 10,870,804 B2 | 12/2020 | Wohaibi et al. |
| 10,883,056 B2 | 1/2021 | Wohaibi et al. |
| 10,899,983 B1 | 1/2021 | Kar et al. |
| 10,920,160 B2 | 2/2021 | Wohaibi et al. |
| 10,954,456 B2 | 3/2021 | Moore et al. |
| 10,961,468 B2 | 3/2021 | Moore et al. |
| 10,995,290 B2 | 5/2021 | Anderson et al. |
| 11,001,768 B2 | 5/2021 | Liu et al. |
| 11,015,133 B2 | 5/2021 | Wohaibi et al. |
| 11,015,134 B2 | 5/2021 | Wohaibi et al. |
| 11,118,120 B2 | 9/2021 | Brown et al. |
| 11,118,122 B2 | 9/2021 | Ramaseshan et al. |
| 11,124,714 B2 | 9/2021 | Eller et al. |
| 11,149,217 B2 | 10/2021 | Marques et al. |
| 11,168,264 B2 | 11/2021 | Brahem et al. |
| 11,203,724 B2 | 12/2021 | Pereira Almao et al. |
| 11,236,281 B2 | 2/2022 | Rogel et al. |
| 11,261,387 B2 | 3/2022 | Wei et al. |
| 11,345,865 B2 | 5/2022 | Zhang et al. |
| 11,384,301 B2 | 7/2022 | Eller et al. |
| 11,396,633 B2 | 7/2022 | Kar et al. |
| 11,421,166 B2 | 8/2022 | Weiss et al. |
| 11,459,514 B2 | 10/2022 | Pupat |
| 11,466,222 B2 | 10/2022 | Markkanen |
| 2001/0001036 A1 | 5/2001 | Espeillac et al. |
| 2001/0013484 A1 | 8/2001 | Zeuthen et al. |
| 2002/0037806 A1 | 3/2002 | Dufresne et al. |
| 2002/0045540 A1 | 4/2002 | Bartholdy |
| 2002/0056664 A1 | 5/2002 | Chabot |
| 2002/0070147 A1 | 6/2002 | Sonnemans et al. |
| 2002/0117426 A1 | 8/2002 | Holder |
| 2002/0144932 A1 | 10/2002 | Gong et al. |
| 2002/0148757 A1 | 10/2002 | Huff et al. |
| 2002/0157990 A1 | 10/2002 | Feimer et al. |
| 2002/0195375 A1 | 12/2002 | Chapus et al. |
| 2003/0042172 A1 | 3/2003 | Sharivker et al. |
| 2003/0125198 A1 | 7/2003 | Ginestra et al. |
| 2003/0131526 A1 | 7/2003 | Kresnyak et al. |
| 2003/0146133 A1 | 8/2003 | Nagamatsu et al. |
| 2003/0217951 A1 | 11/2003 | Marchal-George et al. |
| 2004/0007501 A1 | 1/2004 | Sughrue et al. |
| 2004/0020829 A1 | 2/2004 | Magna et al. |
| 2004/0040890 A1 | 3/2004 | Morton et al. |
| 2004/0055934 A1 | 3/2004 | Tromeur et al. |
| 2004/0134837 A1 | 7/2004 | Dassori |
| 2004/0178117 A1 | 9/2004 | Morton et al. |
| 2004/0186014 A1 | 9/2004 | Tsukada et al. |
| 2004/0209771 A1 | 10/2004 | Abe et al. |
| 2004/0232041 A1 | 11/2004 | Kiser et al. |
| 2004/0256293 A1 | 12/2004 | Abe et al. |
| 2005/0020446 A1 | 1/2005 | Choudhary et al. |
| 2005/0101480 A1 | 5/2005 | Ackerman et al. |
| 2005/0109674 A1 | 5/2005 | Klein |
| 2005/0113250 A1 | 5/2005 | Schleicher et al. |
| 2005/0133405 A1 | 6/2005 | Wellington et al. |
| 2005/0133406 A1 | 6/2005 | Wellington et al. |
| 2005/0133411 A1 | 6/2005 | Zeuthen et al. |
| 2005/0133416 A1 | 6/2005 | Bhan et al. |
| 2005/0133417 A1 | 6/2005 | Bhan et al. |
| 2005/0135997 A1 | 6/2005 | Wellington et al. |
| 2005/0139512 A1 | 6/2005 | Wellington et al. |
| 2005/0139520 A1 | 6/2005 | Bhan et al. |
| 2005/0139522 A1 | 6/2005 | Bhan et al. |
| 2005/0145537 A1 | 7/2005 | Wellington et al. |
| 2005/0145538 A1 | 7/2005 | Wellington et al. |
| 2005/0145543 A1 | 7/2005 | Bhan et al. |
| 2005/0148487 A1 | 7/2005 | Brownscombe et al. |
| 2005/0150156 A1 | 7/2005 | Karas et al. |
| 2005/0150818 A1 | 7/2005 | Bhan et al. |
| 2005/0155906 A1 | 7/2005 | Wellington et al. |
| 2005/0167321 A1 | 8/2005 | Wellington et al. |
| 2005/0167327 A1 | 8/2005 | Bhan et al. |
| 2005/0167328 A1 | 8/2005 | Bhan et al. |
| 2005/0167329 A1 | 8/2005 | Bhan et al. |
| 2005/0167331 A1 | 8/2005 | Bhan et al. |
| 2005/0269245 A1 | 12/2005 | Huve |
| 2006/0052235 A1 | 3/2006 | Bai et al. |
| 2006/0060501 A1 | 3/2006 | Gauthier et al. |
| 2006/0060509 A1 | 3/2006 | Miyauchi et al. |
| 2006/0060510 A1 | 3/2006 | Bhan |
| 2006/0102522 A1 | 5/2006 | Turaga et al. |
| 2006/0115392 A1 | 6/2006 | Dassori |
| 2006/0175229 A1 | 8/2006 | Montanari et al. |
| 2006/0211900 A1 | 9/2006 | Iki et al. |
| 2006/0231456 A1 | 10/2006 | Bhan |
| 2006/0231465 A1 | 10/2006 | Bhan |
| 2006/0234876 A1 | 10/2006 | Bhan |
| 2006/0234877 A1 | 10/2006 | Bhan |
| 2006/0249429 A1 | 11/2006 | Iki et al. |
| 2006/0281638 A1 | 12/2006 | Zaid et al. |
| 2006/0289340 A1 | 12/2006 | Brownscombe et al. |
| 2007/0000808 A1 | 1/2007 | Bhan et al. |
| 2007/0000810 A1 | 1/2007 | Bhan et al. |
| 2007/0012595 A1 | 1/2007 | Brownscombe et al. |
| 2007/0072765 A1 | 3/2007 | Soled et al. |
| 2007/0084753 A1 | 4/2007 | Iki et al. |
| 2007/0105714 A1 | 5/2007 | Turaga et al. |
| 2007/0108098 A1 | 5/2007 | Flint et al. |
| 2007/0131584 A1 | 6/2007 | Kalnes |
| 2007/0138055 A1 | 6/2007 | Farshid et al. |
| 2007/0170096 A1 | 7/2007 | Shan et al. |
| 2007/0175797 A1 | 8/2007 | Iki et al. |
| 2007/0187294 A1* | 8/2007 | Ancheyta Juarez ....... C10G 45/02 208/254 R |
| 2007/0284285 A1 | 12/2007 | Stepanik et al. |
| 2008/0017551 A1 | 1/2008 | Kiriyama et al. |
| 2008/0047875 A1 | 2/2008 | Karas et al. |
| 2008/0073247 A1 | 3/2008 | Bolshakov et al. |
| 2008/0085225 A1 | 4/2008 | Bhan et al. |
| 2008/0135453 A1 | 6/2008 | Bhan |
| 2008/0149531 A1 | 6/2008 | Roy-Auberger et al. |
| 2008/0167180 A1 | 7/2008 | Van Den Brink et al. |
| 2008/0210595 A1 | 9/2008 | Bolshakov et al. |
| 2008/0223755 A1 | 9/2008 | Roy-Auberger et al. |
| 2008/0230440 A1 | 9/2008 | Graham et al. |
| 2008/0245700 A1 | 10/2008 | Wellington et al. |
| 2008/0245702 A1 | 10/2008 | Wellington et al. |
| 2008/0262115 A1 | 10/2008 | Calis et al. |
| 2008/0272027 A1 | 11/2008 | Wellington et al. |
| 2008/0272028 A1 | 11/2008 | Wellington et al. |
| 2008/0308459 A1 | 12/2008 | Hideshi et al. |
| 2009/0048097 A1 | 2/2009 | Jones et al. |
| 2009/0057194 A1 | 3/2009 | Farshid et al. |
| 2009/0057197 A1 | 3/2009 | Bhan et al. |
| 2009/0062590 A1 | 3/2009 | Nadler et al. |
| 2009/0114569 A1 | 5/2009 | Osaheni et al. |
| 2009/0134064 A1 | 5/2009 | Reynolds |
| 2009/0139902 A1 | 6/2009 | Kressmann et al. |
| 2009/0166260 A1 | 7/2009 | Magalie et al. |
| 2009/0178951 A1 | 7/2009 | Balthasar et al. |
| 2009/0230022 A1 | 9/2009 | Gorbaty et al. |
| 2009/0234166 A1 | 9/2009 | Gorbaty et al. |
| 2009/0255850 A1 | 10/2009 | Bhan et al. |
| 2009/0255851 A1 | 10/2009 | Bhan et al. |
| 2009/0275788 A1 | 11/2009 | Bedard et al. |
| 2009/0283444 A1 | 11/2009 | Bhan et al. |
| 2009/0288987 A1 | 11/2009 | Bhan et al. |
| 2009/0288989 A1 | 11/2009 | Wellington et al. |
| 2009/0308791 A1 | 12/2009 | Bhan et al. |
| 2009/0308812 A1 | 12/2009 | Osaheni et al. |
| 2009/0314686 A1 | 12/2009 | Zimmerman |
| 2010/0006475 A1 | 1/2010 | Ginestra |
| 2010/0018902 A1 | 1/2010 | Brownscombe et al. |
| 2010/0025291 A1 | 2/2010 | Shafi et al. |
| 2010/0044274 A1 | 2/2010 | Brun et al. |
| 2010/0055005 A1 | 3/2010 | Bhan et al. |
| 2010/0098602 A1 | 4/2010 | Bhan et al. |
| 2010/0155293 A1* | 6/2010 | Verstraete ............. C10G 65/12 208/49 |

(56) References Cited

U.S. PATENT DOCUMENTS

| | | |
|---|---|---|
| 2010/0155301 A1 | 6/2010 | Guichard et al. |
| 2010/0200463 A1 | 8/2010 | Patron et al. |
| 2010/0213103 A1 | 8/2010 | Patron et al. |
| 2010/0243526 A1 | 9/2010 | Ginestra et al. |
| 2010/0243532 A1 | 9/2010 | Myers et al. |
| 2010/0264067 A1 | 10/2010 | Osaheni et al. |
| 2010/0294698 A1 | 11/2010 | e Mello et al. |
| 2010/0326890 A1 | 12/2010 | Bhan |
| 2011/0017637 A1 | 1/2011 | Reynolds et al. |
| 2011/0079542 A1 | 4/2011 | Ellis et al. |
| 2011/0083997 A1 | 4/2011 | Silva et al. |
| 2011/0094938 A1 | 4/2011 | Morel |
| 2011/0108461 A1 | 5/2011 | Gabrielov et al. |
| 2011/0127194 A1 | 6/2011 | Zhang et al. |
| 2011/0155558 A1 | 6/2011 | Cardoso et al. |
| 2011/0155644 A1 | 6/2011 | Bhattacharyya et al. |
| 2011/0174681 A1 | 7/2011 | Milam et al. |
| 2011/0178346 A1 | 7/2011 | Milam et al. |
| 2011/0186477 A1 | 8/2011 | Milam et al. |
| 2011/0186480 A1 | 8/2011 | Milam et al. |
| 2011/0203971 A1 | 8/2011 | Kiss et al. |
| 2011/0218097 A1 | 9/2011 | Rayo Mayoral et al. |
| 2011/0240517 A1 | 10/2011 | Chornet et al. |
| 2011/0277377 A1 | 11/2011 | Novak et al. |
| 2012/0018352 A1 | 1/2012 | Seki et al. |
| 2012/0103868 A1 | 5/2012 | Dindi et al. |
| 2012/0116145 A1 | 5/2012 | Bhan et al. |
| 2012/0145528 A1 | 6/2012 | Myers et al. |
| 2012/0175285 A1 | 7/2012 | Bhan et al. |
| 2012/0175286 A1 | 7/2012 | Bhan et al. |
| 2012/0181219 A1 | 7/2012 | Seki et al. |
| 2013/0037447 A1 | 2/2013 | Zimmerman |
| 2013/0081977 A1 | 4/2013 | Woo et al. |
| 2013/0105357 A1 | 5/2013 | Bhan |
| 2013/0105364 A1 | 5/2013 | Bhan |
| 2013/0126393 A1 | 5/2013 | Ginestra et al. |
| 2013/0171039 A1 | 7/2013 | Graham et al. |
| 2013/0186806 A1 | 7/2013 | Diehl et al. |
| 2013/0225400 A1 | 8/2013 | Liang et al. |
| 2013/0256190 A1 | 10/2013 | Van Wees et al. |
| 2013/0267409 A1 | 10/2013 | Lee et al. |
| 2013/0277273 A1 | 10/2013 | Mazyar |
| 2013/0288885 A1 | 10/2013 | Domokos et al. |
| 2013/0306517 A1 | 11/2013 | Kester et al. |
| 2013/0319910 A1 | 12/2013 | Koseoglu |
| 2014/0001089 A1 | 1/2014 | Bazer-Bachi |
| 2014/0027351 A1 | 1/2014 | Bazer-Bachi et al. |
| 2014/0061094 A1 | 3/2014 | Xu et al. |
| 2014/0073821 A1 | 3/2014 | Mitsui et al. |
| 2014/0076783 A1 | 3/2014 | Bhan |
| 2014/0097125 A1 | 4/2014 | Bazer-Bachi et al. |
| 2014/0166540 A1 | 6/2014 | Guichard et al. |
| 2014/0174980 A1 | 6/2014 | Brown et al. |
| 2014/0174983 A1 | 6/2014 | Klein et al. |
| 2014/0183098 A1 | 7/2014 | Cooper et al. |
| 2014/0183099 A1 | 7/2014 | Ginestra et al. |
| 2014/0291201 A1 | 10/2014 | Banerjee et al. |
| 2014/0291203 A1 | 10/2014 | Molinari et al. |
| 2014/0299515 A1 | 10/2014 | Weiss et al. |
| 2014/0305843 A1 | 10/2014 | Kraus et al. |
| 2014/0315712 A1 | 10/2014 | Smegal |
| 2014/0323779 A1 | 10/2014 | Alphazan et al. |
| 2014/0326642 A1 | 11/2014 | Tanaka et al. |
| 2014/0332444 A1 | 11/2014 | Weiss et al. |
| 2014/0353210 A1 | 12/2014 | Graham et al. |
| 2015/0057205 A1 | 2/2015 | Morishima et al. |
| 2015/0108039 A1 | 4/2015 | Bhan |
| 2015/0111726 A1 | 4/2015 | Bhan et al. |
| 2015/0144531 A1 | 5/2015 | Ginstra et al. |
| 2015/0144532 A1 | 5/2015 | He et al. |
| 2015/0217261 A1 | 8/2015 | Norling |
| 2015/0224476 A1 | 8/2015 | Plecha et al. |
| 2015/0240174 A1 | 8/2015 | Kraus et al. |
| 2015/0315480 A1 | 11/2015 | Hanks et al. |
| 2015/0321177 A1 | 11/2015 | Rana et al. |
| 2015/0337225 A1 | 11/2015 | Droubi et al. |
| 2015/0337226 A1 | 11/2015 | Droubi et al. |
| 2015/0344791 A1 | 12/2015 | Banerjee et al. |
| 2015/0353848 A1 | 12/2015 | Patron |
| 2015/0353851 A1 | 12/2015 | Buchanan |
| 2016/0001272 A1 | 1/2016 | Daudin |
| 2016/0017240 A1 | 1/2016 | Duma et al. |
| 2016/0024396 A1 | 1/2016 | Zink et al. |
| 2016/0060549 A1 | 3/2016 | Ancheyta Juarez et al. |
| 2016/0074840 A1 | 3/2016 | Duma et al. |
| 2016/0075954 A1 | 3/2016 | Monson et al. |
| 2016/0122666 A1 | 5/2016 | Weiss et al. |
| 2016/0129428 A1 | 5/2016 | Bhan |
| 2016/0145503 A1 | 5/2016 | Xu et al. |
| 2016/0145508 A1 | 5/2016 | Xu et al. |
| 2016/0145509 A1 | 5/2016 | Mukherjee et al. |
| 2016/0152901 A1 | 6/2016 | Dufresne |
| 2016/0160139 A1 | 6/2016 | Robinson et al. |
| 2016/0177205 A1 | 6/2016 | Evans et al. |
| 2016/0200990 A1 | 7/2016 | Mori et al. |
| 2016/0220985 A1 | 8/2016 | Osaki et al. |
| 2016/0220986 A1 | 8/2016 | Osaki et al. |
| 2016/0230102 A1 | 8/2016 | Osaki et al. |
| 2016/0243528 A1 | 8/2016 | He et al. |
| 2016/0250622 A1 | 9/2016 | He et al. |
| 2016/0256856 A1 | 9/2016 | Kester et al. |
| 2016/0264887 A1 | 9/2016 | Davydov |
| 2016/0304794 A1 | 10/2016 | Majcher et al. |
| 2016/0312130 A1 | 10/2016 | Merdrignac |
| 2016/0340597 A1 | 11/2016 | Baldassari et al. |
| 2016/0348012 A1 | 12/2016 | Zhao et al. |
| 2016/0348013 A1 | 12/2016 | Adkat et al. |
| 2016/0362615 A1 | 12/2016 | Ancheyta Juarez et al. |
| 2017/0002273 A1 | 1/2017 | Rubin-Pitel et al. |
| 2017/0002279 A1 | 1/2017 | Brown et al. |
| 2017/0009163 A1 | 1/2017 | Kraus et al. |
| 2017/0022433 A1 | 1/2017 | Brown et al. |
| 2017/0029723 A1 | 2/2017 | Bazer-Bachi et al. |
| 2017/0037325 A1 | 2/2017 | Ackerson et al. |
| 2017/0044451 A1 | 2/2017 | Kar et al. |
| 2017/0058205 A1 | 3/2017 | Ho et al. |
| 2017/0058223 A1 | 3/2017 | Droubi et al. |
| 2017/0066979 A1 | 3/2017 | Lei et al. |
| 2017/0073592 A1 | 3/2017 | Nonaka et al. |
| 2017/0120224 A1 | 5/2017 | Boualleg et al. |
| 2017/0120228 A1 | 5/2017 | Boualleg et al. |
| 2017/0120229 A1 | 5/2017 | Boualleg et al. |
| 2017/0121612 A1 | 5/2017 | Boualleg et al. |
| 2017/0128912 A1 | 5/2017 | Boualleg et al. |
| 2017/0136446 A1 | 5/2017 | Carati et al. |
| 2017/0137725 A1 | 5/2017 | Boualleg et al. |
| 2017/0165639 A1 | 6/2017 | Klein et al. |
| 2017/0175012 A1 | 6/2017 | Schleiffer et al. |
| 2017/0183575 A1 | 6/2017 | Rubin-Pitel et al. |
| 2017/0183582 A1 | 6/2017 | Hoehn et al. |
| 2017/0192126 A1 | 7/2017 | Koseoglu |
| 2017/0232414 A1 | 8/2017 | Hassan |
| 2017/0260463 A1 | 9/2017 | Schleiffer et al. |
| 2017/0267937 A1 | 9/2017 | Schleiffer et al. |
| 2017/0306250 A1 | 10/2017 | Ginestra |
| 2017/0306252 A1 | 10/2017 | Malek Abbaslou et al. |
| 2017/0335206 A1 | 11/2017 | Mukherjee et al. |
| 2017/0349846 A1 | 12/2017 | Ding et al. |
| 2017/0355913 A1 | 12/2017 | Mountainland et al. |
| 2017/0355914 A1 | 12/2017 | Weiss et al. |
| 2017/0362514 A1 | 12/2017 | Hanks et al. |
| 2018/0016505 A1 | 1/2018 | Matsushita |
| 2018/0104676 A1 | 4/2018 | Yamane et al. |
| 2018/0134965 A1 | 5/2018 | Brown et al. |
| 2018/0134972 A1 | 5/2018 | Brown et al. |
| 2018/0134974 A1 | 5/2018 | Weiss et al. |
| 2018/0147567 A1 | 5/2018 | Matsushita et al. |
| 2018/0154340 A1 | 6/2018 | Boualleg et al. |
| 2018/0155647 A1 | 6/2018 | Robinson et al. |
| 2018/0195013 A1 | 7/2018 | Dreillard et al. |
| 2018/0207622 A1 | 7/2018 | Boualleg et al. |
| 2018/0230387 A1 | 8/2018 | Moore et al. |
| 2018/0230388 A1 | 8/2018 | Li et al. |
| 2018/0230389 A1 | 8/2018 | Moore et al. |

(56) References Cited

U.S. PATENT DOCUMENTS

| | | |
|---|---|---|
| 2018/0251690 A1 | 9/2018 | Mountainland et al. |
| 2018/0291291 A1 | 10/2018 | Brown et al. |
| 2018/0340126 A1 | 11/2018 | Klussman et al. |
| 2018/0346828 A1 | 12/2018 | Liu et al. |
| 2018/0355263 A1 | 12/2018 | Moore et al. |
| 2018/0371343 A1 | 12/2018 | Rubin-Patel et al. |
| 2019/0002772 A1 | 1/2019 | Moore et al. |
| 2019/0010405 A1 | 1/2019 | Moore et al. |
| 2019/0010406 A1 | 1/2019 | Moore et al. |
| 2019/0010407 A1 | 1/2019 | Moore et al. |
| 2019/0010408 A1 | 1/2019 | Moore et al. |
| 2019/0016972 A1 | 1/2019 | Moore et al. |
| 2019/0016974 A1 | 1/2019 | Moore et al. |
| 2019/0040329 A1 | 2/2019 | Moore et al. |
| 2019/0078027 A1 | 3/2019 | Deimund et al. |
| 2019/0093026 A1 | 3/2019 | Wohaibi et al. |
| 2019/0136144 A1 | 5/2019 | Wohaibi et al. |
| 2019/0153340 A1 | 5/2019 | Weiss et al. |
| 2019/0153942 A1 | 5/2019 | Wohaibi et al. |
| 2019/0185772 A1 | 6/2019 | Berkhous et al. |
| 2019/0203130 A1 | 7/2019 | Mukherjee |
| 2019/0233732 A1 | 8/2019 | Sun |
| 2019/0233741 A1 | 8/2019 | Moore et al. |
| 2019/0256784 A1 | 8/2019 | Klussman et al. |
| 2019/0300806 A1 | 10/2019 | Kashio et al. |
| 2019/0338203 A1 | 11/2019 | Umansky et al. |
| 2019/0338205 A1 | 11/2019 | Ackerson et al. |
| 2019/0382668 A1 | 12/2019 | Klussmann et al. |
| 2020/0095508 A1 | 3/2020 | Moore et al. |
| 2020/0095509 A1 | 3/2020 | Moore et al. |
| 2020/0123458 A1 | 4/2020 | Moore et al. |
| 2020/0131443 A1 | 4/2020 | Moore et al. |
| 2020/0131446 A1 | 4/2020 | Wohaibi et al. |
| 2020/0131447 A1 | 4/2020 | Wohaibi et al. |
| 2020/0140765 A1 | 5/2020 | Moore et al. |
| 2020/0172819 A1 | 6/2020 | Wohaibi et al. |
| 2020/0172820 A1 | 6/2020 | Wohaibi et al. |
| 2020/0199462 A1 | 6/2020 | Klussmann et al. |
| 2020/0199463 A1 | 6/2020 | Klussmann et al. |
| 2020/0199465 A1 | 6/2020 | Wohaibi et al. |
| 2020/0199466 A1 | 6/2020 | Wohaibi et al. |
| 2020/0199467 A1 | 6/2020 | Wohaibi et al. |
| 2020/0216766 A1 | 7/2020 | Wohaibi et al. |
| 2020/0224108 A1 | 7/2020 | Moore et al. |
| 2020/0231886 A1 | 7/2020 | Kraus et al. |
| 2020/0248080 A1 | 8/2020 | Peer et al. |
| 2020/0291317 A1 | 9/2020 | Anderson et al. |
| 2020/0339894 A1 | 10/2020 | Marques et al. |
| 2020/0385644 A1 | 12/2020 | Rogel et al. |
| 2021/0017458 A1 | 1/2021 | Wohaibi et al. |
| 2021/0017459 A1 | 1/2021 | Wohaibi et al. |
| 2021/0017460 A1 | 1/2021 | Wohaibi et al. |
| 2021/0017461 A1 | 1/2021 | Wohaibi et al. |
| 2021/0024838 A1 | 1/2021 | Wohaibi et al. |
| 2021/0024839 A1 | 1/2021 | Wohaibi et al. |
| 2021/0024840 A1 | 1/2021 | Wohaibi et al. |
| 2021/0024842 A1 | 1/2021 | Fruchey et al. |
| 2021/0032551 A1 | 2/2021 | Wohaibi et al. |
| 2021/0062096 A1 | 3/2021 | Hodgkins et al. |
| 2021/0102130 A1 | 4/2021 | Marques et al. |
| 2021/0155858 A1 | 5/2021 | Koseoglu et al. |
| 2021/0238487 A1 | 8/2021 | Moore et al. |
| 2021/0246391 A1 | 8/2021 | Anderson et al. |
| 2021/0253960 A1 | 8/2021 | Eller et al. |
| 2021/0253965 A1 | 8/2021 | Woodchick et al. |
| 2021/0253964 A1 | 9/2021 | Eller et al. |
| 2021/0284919 A1 | 9/2021 | Moore et al. |
| 2021/0292661 A1 | 9/2021 | Klussmann et al. |
| 2021/0363434 A1 | 11/2021 | Zhang et al. |
| 2021/0363444 A1 | 11/2021 | Kar et al. |
| 2022/0073830 A1 | 3/2022 | Harada et al. |
| 2022/0235275 A1 | 7/2022 | Iversen et al. |
| 2022/0411702 A1 | 12/2022 | Sarjovaara et al. |

FOREIGN PATENT DOCUMENTS

| | | | |
|---|---|---|---|
| CA | 1238005 A | 6/1988 | |
| CA | 1248513 | 1/1989 | |
| EP | 1041133 A1 | 10/2000 | |
| EP | 1050572 A2 | 11/2000 | |
| EP | 1052015 A1 | 11/2000 | |
| EP | 2130895 A1 | 12/2009 | |
| EP | 2947133 A1 | 11/2015 | |
| EP | 2992070 A2 | 3/2016 | |
| EP | 1637576 * | 3/2024 | ............ C10G 49/02 |
| FR | 2681871 | 4/1993 | |
| FR | 3011004 A | 3/2015 | |
| FR | 3011004 A1 | 3/2015 | |
| FR | 3013723 A | 5/2015 | |
| FR | 3013723 A1 | 5/2015 | |
| FR | 3053356 | 1/2018 | |
| GB | 1324167 | 7/1973 | |
| GB | 1502915 | 3/1978 | |
| GB | 1504586 | 3/1978 | |
| GB | 1505886 | 3/1978 | |
| GB | 2124252 | 2/1984 | |
| GB | 2121252 B | 6/1986 | |
| JP | 4801344 B2 | 10/2011 | |
| JP | 2015059220 A | 3/2015 | |
| JP | 20200122450 | 8/2020 | |
| RU | 2700705 | 9/2019 | |
| WO | 9113951 A1 | 9/1991 | |
| WO | 9820969 | 5/1998 | |
| WO | 9820969 A1 | 5/1998 | |
| WO | 0197971 A1 | 12/2001 | |
| WO | 0209870 A2 | 2/2002 | |
| WO | 2004052534 A1 | 6/2004 | |
| WO | 2004053028 A1 | 6/2004 | |
| WO | 2005028596 A1 | 3/2005 | |
| WO | 2005063933 A2 | 7/2005 | |
| WO | 2009001314 A1 | 12/2008 | |
| WO | 2011071705 A2 | 6/2011 | |
| WO | 2013083662 | 6/2013 | |
| WO | 2014096703 A | 6/2014 | |
| WO | 2014096703 A1 | 6/2014 | |
| WO | 2014096704 A | 6/2014 | |
| WO | 2014177424 A2 | 11/2014 | |
| WO | 2015034521 A1 | 3/2015 | |
| WO | 2015147222 A1 | 10/2015 | |
| WO | 2015147223 A1 | 10/2015 | |
| WO | 2017168312 A1 | 10/2017 | |
| WO | 2018073018 A1 | 4/2018 | |
| WO | 2018075017 | 4/2018 | |
| WO | 2018053323 A1 | 3/2019 | |
| WO | 2019104243 A1 | 5/2019 | |
| WO | 2019125674 A1 | 6/2019 | |
| WO | 2019133880 A1 | 7/2019 | |
| WO | 2019178701 A1 | 9/2019 | |
| WO | 2020262078 A1 | 12/2020 | |
| WO | 2021066265 A1 | 4/2021 | |

OTHER PUBLICATIONS

James G. Speight, The Desulfurization of Heavy Oils and Residua, 2nd Ed. 1999, Chapter 6, pp. 206-253, Marcel Dekker Inc. New York Ny US.

James G. Speight, The Desulfurization of Heavy Oils and Residua, 2nd Ed. 1999, Chapter 8, pp. 302-334, Marcel Dekker Inc. New York Ny US.

James G. Speight, The Desulfurization of Heavy Oils and Residua, 2nd Ed. 1999, Chapter 9, pp. 335-385, Marcel Dekker Inc. New York Ny US.

Mohammad Farhat Ali, et al. A review of methods for the demetallization of residual fuel oils, Fuel Processing Technology, Mar. 8, 2006, pp. 573-584, vol. 87, Elsevier B.V.

Mohan S. Rana, et al., A review of recent advances on process technologies for upgrading of heavy oils and residua, Fuel, Available online Sep. 7, 2006, pp. 1216-1231, vol. 86, Elsevier B.V.

Carolina Leyva, et al., Activity and surface properties of NiMo/ $SiO_2$—$Al_2O_3$ catalysts for hydroprocessing of heavy oils, Applied Catalysis A: General, Available online Feb. 28, 2012, pp. 1-12, vol. 425-426, Elsevier B.V.

(56) References Cited

OTHER PUBLICATIONS

Oliver C. Mullins et al., Asphaltenes Explained for the Nonchemist, Petrophysics, Jun. 2015, pp. 266-275, vol. 56, No. 3.
M. Ghasemi, et al., Phase Behavior and Viscosity Modeling of Athabasca Bitumen and Light Solvent Mixtures, SPE165416, Jun. 2013, pp. 1-26, Society of Petroleum Engineers.
Marten Ternan, Catalytic Hydrogenation and Asphaltene Conversion of Athabasca Bitumen, The Canadian Journal of Chemical Engineering, Oct. 1983, pp. 689-696, vol. 61.
Jeremi'as Marti'nez, et al., Comparison of correlations to predict hydrotreating product properties during hydrotreating of heavy oils, Catalysis Today, Available online Dec. 5, 2009, pp. 300-307, vol. 150, Elsevier B.V.
Luis C. Castnteda, et al., Current situation of emerging technologies for upgrading of heavy oils, Catalysis Today, Available online Jul. 4, 2013, pp. 248-273, vol. 220-222, Elsevier B.V.
C. Ferreira, et al., Hydrodesulfurization and hydrodemetallization of different origin vacuum residues: Characterization and reactivity, Fuel, Available online Apr. 14, 2012, pp. 1-11, http://dx.doi.org/10.1016/j.fuel.2012.03.054, Elsevier B.V.
C.V. Philip, et al. GPC Characterization for Assessing Compatibility Problems with Heavy Fuel Oils, Fuel Processing Technology 1984: pp. 189-201., Elsevier B.V.
Muhammad A. Altajam & Marten Ternan, Hydrocracking of Athabasca bitumen using Co—Mo catalysts supported on wide pore carbon extrudates, Fuel, Aug. 1989, pp. 955-960, Butterworth & Co. Publishers Ltd.
J.W. Holmes & J.A. Bullin, Fuel Oil Compatibility Probed, Hydrocarbon Processing, Sep. 1983: pp. 101-103.
Charles J. Glover, & Jerry A. Bullin, Identification of Heavy Residual Oils by GC and GCMS, Journal of Environmental Science and Health A24(1), 1989: pp. 57-75.
H. Puron, et al., Kinetic analysis of vacuum residue hydrocracking in early reaction stages, Fuel, Available online Sep. 27, 2013, pp. 408-414, vol. 117, Elsevier B.V.
Yanet Villasna, et al. Upgrading and Hydrotreating of Heavy Oils and Residua, Energy Science and Technology, vol. 3, Oil and Natural Gas, 2015, pp. 304-328, Stadium Press LLC, Houston TX USA.
A. M. Aitani, M.F. Ali, H.H. Al-Ali, "A Review of Non-Conventional Methods for the Desulfurization of Residual Fuel Oil", Petroleum Science and Technology, 2000 18:5-6, 537-553, Marcel Dekker Inc. New York, New York USA.
Daniel Monzon, et al. "Petroleum refiners and shippers struggle over marine fuel", Author D Little opinion/ position paper, May 9, 2017, pp. 1-4, Arthur D. Little, https://www.adlittle.com/sites/default/files/viewpoints/adl_petroleum_refiners_and_shippers_struggle_over_marine_fuel.pdf.
Gulam Gaush Zeelani, et al. "Catalystic Oxidative Desulfurization of Liquid Fuel: A Review", International Research Journal of Engineering and Technology, May 2016 pp. 331-336, vol. 3; Issue 5, Fast Track Publications, Tamilnadu, India.
Kristin Rist Sorheim et al. "Characterization of Low Sulfur Fuel Oils (LSFO)—A new generation of marine fuel pils", Oct. 7, 2020, pp. 1-22 , Report No. OC2020 A-050, Project No. 302004929, Version 3.1, SINTEF Ocean AS, Trondheim, Norway.
S. Brynolf et al. "Compliance possibilities for the future ECA regulations through the use of abatement technologies or change of fuels", Transportation Research Part D May 2014, pp. 6-18, vol. 28, Elsevier Ltd. London United Kingdom.
Alun Lewis, "Composition, Properties and Classification of Heavy Fuel Oils" Third R&D Forum on High-density Oil Spill Response, Mar. 11, 2002, pp. 11-25, Intype, London United Kingdom.
Tong-Rong Ling et al. "Desulfurization of Vacuum Gasoil By MCM 41 Supported Molybdenum-Nickel" , Ind. Eng. Chem. Res. Jan. 14, 2009, vol. 48, pp. 1797-1803, American Chemical Society.
S.K. Maity et al. "Early Stage Deactivation of Heavy Crude Oil Hydroprocessing Catalysts", Fuel, vol. 100 (Nov. 23, 2011), pp. 17-23, Elsevier Ltd. London United Kingdom.
Kevin Cullinane et al. "Emission Control Areas and Their Impact On Maritime Transport", Transportation Research Part D May 2014, pp. 1-5, vol. 28, Elsevier Ltd. London United Kingdom.
Selma Brynolf, "Environmental Assessment of Present and Future Marine Fuels", Thesis for the Degree of Doctor of Philosophy, 2014, pp. 1-105, Department of Shipping and Marine Technology, Chalmers University of Technology SE-412 96 Gothenburg, Sweden.
Alexey Y. Kirgizov, et al. "Ex Situ Upgrading of Extra Heavy Oil: The Effect of Pore Shape pf Co—Mo/—Al2O3 Catalysts", Catalysts Oct. 18, 2022, vol. 12, pp. 1271-1284, MDPI, Basel Switzerland https://doi.org/10.3390/catal12101271.
Sundaramurthy Vedachalam, et al., "Hydrotreating and oxidative desulfurization of heavy fuel oil into low sulfur marine fuel over dual function NiMo/γ-Al2O3 catalyst" Catalysis Today. Vol. 407 (2023) pp. 165-171, available on-line Jan. 19, 2022, Elsevier Ltd. London United Kingdom.
Susana Trasobares, et al., "Kinetics of Conradson Carbon Residue Conversion in the Catalytic Hydroprocessing of a Maya Residue", Ind. Eng. Chem. Res. Jan. 5, 1998, vol. 37, pp. 11-17, American Chemical Society.
Jiang Zongxuan, et al., "Oxidative Desulfurization of Fuel Oils", Chin. J. Catal., 2011, vol. 32: pp. 707-715. Elsevier Ltd. London United Kingdom.
Sara Houda, et al., "Oxidative Desulfurization of Heavy Oils with High Sulfur Content: A Review", Catalysts Aug. 23, 2018, vol. 8, pp. 344-370. MDPI, Basel Switzerland , www.mdpi.com/journal/catalysts.
Fawzi M. Elfghi & N.A.S.AMIN, "Parametric Study of Hydrodesulfurization and Hydrodearomatization of Gasoil in Hydrotreating Process of Over CoMo—S Catalyst Using a Pilot Plant Integral Reactor", Jurnal Teknologi, Dec. 2011, vol. 56, pp. 53-73. Penerbit UTM Press, Universiti Teknologi Malaysia.
Jose Luis Garcia-Gutierrez, et al., "R & D in Oxidative Desulfurization of Fuels Technologies: From Chemistry to Patents", Recent Patents on Chemical Engineering, Dec. 2012, vol. 5, pp. 174-196.
Antoine Halff, et al., "The likely implications of the new IMO standards on the shipping industry", Energy Policy, Nov. 2018, vol. 126, pp. 277-286, Elsevier Ltd. London United Kingdom.
S. Houda, et al., "Ultrasound assisted oxidative desulfurization of marine fuels on MoO3/Al2O3 catalyst" Catalysis Today, Oct. 17, 2020, vol. 377, pp. 221-228, Elsevier Ltd. London United Kingdom.
Tesoro Refining & Marketing Co. Material Safety Data Sheet—Marine Gas Oil, pp. 1-11, Nov. 17, 2012, San Antonio, Texas, US.
Coutrymark Refining and Logistics, LLC, Material Safety Data Sheet—No. 6 Fuel Oil, Dec. 2012, pp. 1-4, Mt. Vernon, Indiana US.
BP Australia PTY LTD., Material Safety Data Sheet—BP380 Marine Fuel, Oct. 27, 2011. pp. 1-6, Docklands, Victoria Australia.
Dawoud Bahzad, Jamal Al-Fadhli, Ayyad Al-Dhafeeri, Ali Abdal, Assessment of Selected Apparent Kinetic Parameters of the HDM and HDS reactions of Two Kuwaiti Residual Oils, Using Two Types of Commercial ARDS Catalysts, Energy & Fuels, vol. 24, Jan. 8, 2010, pp. 1495-1501, American Chemical Society, Washington DC US.
DNV GL Maritime, Hong Kong Requires Ocean-Going Vessels to Comply with 0.50% M/M Sulphur Limit While at Berth, Statutory Update No. 1, Mar. 2015, p. 1, DNV GL Maritime, Hamburg Germany.
Ekaterina V. Parkhomchuk, Anton I. Lysikov, Alexey G. Okunev, Pavel D. Parunin, Victoria S. Semeikina, Artem B. Ayupov, Valentina A. Trunova, Valentin N. Parmon, Meso / Macroporous CoMo Alumina Pellets for Hydrotreating of Heavy Oil, Industrial & Engineering Chemistry Research, vol. 15 Nov. 13, 2013, pp. 17117-17125 American Chemical Society, Washington DC US.
Abdul Waheed Bhutto, Rashid Abro, Shurong Goa, Tauqeer Abbas, Xiaochun Chen, Guangren Yu, Oxidative Desulfurization of Fuel Oils Using Ionic Liquids: A Review, Journal of the Taiwan Institute of Chemical Engineers, vol. 62, Feb. 28, 2016, pp. 84-97, Elsevier B.V. Amsterdam The Netherlands.
*Phillips 66, Phillips 66*, Petitioner v *Magēmā Technology LLC*, Patent Owner, Petition for Inter Parties Review, Case PR2021-01168, U.S. Pat. No. 10,308,884 B2, Dated Jul. 7, 2021, All pages.

(56) References Cited

OTHER PUBLICATIONS

*Phillips 66, Phillips 66*, Petitioner v *Magēmā Technology LLC*, Patent Owner, Petition for Inter Parties Review, Case PR2021-01173, U.S. Pat. No. 10,584,287 B2, Dated Jul. 12, 2021, All pages.
*Phillips 66, Phillips 66*, Petitioner v *Magēmā Technology LLC*, Patent Owner, Petition for Inter Parties Review, Case PR2021-01174, U.S. Pat. No. 10,604,709 B2, Dated Jul. 13, 2021, All pages.
*Phillips 66, Phillips 66*, Petitioner v *Magēmā Technology LLC*, Patent Owner, Petition for Inter Parties Review, Case PR2021-01175, U.S. Pat. No. 10,533,141 B2, Dated Jul. 14, 2021, All pages.
International Organization for Standardization. Petroleum products—Fuels (class F)—Specifications of marine fuels (ISO Standard No. 8217:2017(E)), 2017. pp. 1-30 as presented in Petitioner's Exhibit 1003 in PR2021-01168; IPR2021-01173; IPR2021-01174; IPR2021-01175.
Phillips 66, Petitioner's Exhibit 1015 Defendants Supplemental Preliminary Invalidity Contentions pp. 1-50, as presented in IPR2021-01168; IPR2021-01173; IPR2021-01174; IPR2021-01175.
Mafalda Silva, Life Cycle Assessment of Marine Fuel Production, Jul. 2017, Norwegian University of Science and Technology, pp. 16-18, 32-35, 66 as presented Petitioner's Exhibit 1055 in IPR2021-01168; IPR2021-01173; PR2021-01174; IPR2021-01175 and cited in Petitioner's Exhibit 1015 in IPR2021-01168; IPR2021-01173; PR2021-01174; IPR2021-01175.
Cambiaso Risso Group, Challenges of IMO's 0.5% Global Bunker Sulfur Cap, Dec. 12, 2016, p. 9, as presented In Petitioner's Exhibit 1057 in IPR2021-01168; IPR2021-01173; IPR2021-01174; IPR2021-01175 and cited in Petitioner's Exhibit 1015 in IPR2021-01168; IPR2021-01173; IPR2021-01174; IPR2021-01175.
Phillips 66, Petitioner's Exhibit 1082 Declaration of Edward L. Sughrue II, pp. 1-84 as presented in IPR2021-01168; IPR2021-01173; IPR2021-01174; IPR2021-01175.
Surinder Parkash, Petroleum Fuels Manufacturing Handbook, 2010, R.R Donnelley, Publisher, pp. 82, 83, 84, 94, 95, 96 as presented in Petitioner's Exhibit 1102 in IPR2021-01174.
International Search Report issued in corresponding International Application No. PCT/US2018/017855 dated Apr. 27, 2018 (3 pages).
International Search Report issued in corresponding International Application No. PCT/US2018/017863 dated Apr. 27, 2018 (3 pages).
Tesoro Refining & Marketing Co. Material Safety Data Sheet—Fuel Oil, pp. 1-10, Jul. 26, 2012, San Antonio, Texas, US.
Tesoro Refining & Marketing Co. Material Safety Data Sheey—Marine Gas Oil, pp. 1-11, Nov. 17, 2012, San Antonio, Texas, US.
Tesoro Refining & Marketing Co. Material Safety Data Sheet—Resid pp. 1-10, Apr. 6, 2015, San Antonio, Texas, US.
Coutrymark Refining and Logistics, LLc, Material Safety Data Sheet—No. 6 Fuel Oil, Dec. 2012, bages 1-4, Mt. Vernon, Indiana US.
Valero Marekting & Supply Company, Material Safety Data Sheet—Residual Fuel Oil, Dec. 4, 2010, pp. 1-14, San Antonio, Texas US.
Oceanbat Sa. Material Safety Data Sheet—Marine Fuel Oil, Jul. 2013, pp. 1-7, Guayaquil Ecuador.
Exxonmobilcorporation, Material Safety Data Sheet—Marine Fuel Oil, pp. 1-12, Sep. 18, 2013, Fairfax Virginia US.
Shell Trading (US) Company, Material Safety Data Sheet—Ultra Low Sulfur Fuel Oil, pp. 1-21, Jun. 19, 2018, Houston, Texas US.
Suncor Energy Inc., Material Safety Data Sheet—Heating Fuel Oil Type 6 / Residual Marine Fuel, pp. 1-11, Jun. 7, 2018, Calgary Alberta Canada.
Marathon Petroleum Company LP, Material Safety Data Sheet—Marathon No. 6 Fuel Oil, Dec. 7, 2010, pp. 1-14., Findlay, Ohio US.
Bp Australia Pty Ltd., Material Safety Data Sheet—BP380 Marine Fuel, Oct. 27, 2011. pages 1-6, Docklands, Victoria Australia.
U.S. Oil & Refining Co., Material Safety Data Sheet—Residual Fuel Oil, Dec. 18, 2008, pp. 1-11. Tacoma, Washington US.
American Bureau of Shipping, Publication 31 Notes On Heavy Fuel Oil, 1984, pp. 1-68, Houston Texas US.
American Bureau of Shipping, Notes Use of Low Sulphur Marine Fuel for Main and Auxiliary Diesel Engines, Jan. 1, 2010, pp. 1-68, Houston Texas US ( https://www.eagle.org/eagleExternalPortalWEB/ShowProperty/BEA%20Repository/pdfs/Regulatory/Docs/LowSulphurNote_Engine).
Shuyi Zhang, Dong Liu, Wenan Deng, Guohe Que, A Review of Slurry-Phase Hydrocracking Heavy Oil Technology, Energy & Fuels, vol. 21, No. 6, Nov. 2007, pp. 3057-3062, American Chemical Society, Washington DC US.
Peiman Pourmoghaddam, Susan Davari, Zahra Delavar Moghaddam, A Technical And Economic Assessment of Fuel Oil Hydrotreating Technology For Steam Power Plant SO2 and NOx Emissions Control, Advances In Environmental Technology vol. 2, Issue 1, Accepted Oct. 3, 2016, pp. 45-54, Iranian Research Organization For Science and Technology, Tehran Islamic Republic of Iran.
Dawoud Bahzad, Jamal Al-Fadhli, Ayyad Al-Dhafeeri, Ali Abdal, Assessment of Selected Apparent Kinetic Parameters of the HDM and HDS reactions of Two Kuwaiti Residual Oils, Using Two Types of Commercial ARDS Catalysts, Energy & Fuels, vol. 24, Jan. 8, 2010, pp. 1495-1501, American Chemical Society, Washington Dc Js.
A. Marafi, A. Hauser, a Stanislaus, Atmospheric Residual Desulfurization Process for Residual Oil Upgrading: An Investigation of the Effect of Catalyst Type and Operation Severity on Product Oil Quality, Energy & Fuels, vol. 20, Apr. 4, 2006, pp. 1145-1149, American Chemical Society, Washington DC US.
M.M. Boduszynki, C.E. Rechsteiner, A.S.G. Shafzadeh, R.M.K. Carlson, Composition and Properties of Heavy Crudes, No. 1998. 202 UNITAR Centre for Heavy Crude and Tar Sands, 1998, pp. 1-12, Canada.
Gard AS, Bunkers and Bunkering—A selection of articles previously published by Gard AS, Jan. 2014, pp. 1-53, Arendal Norway.
Monique B. Vermeire Everything You Need to Know About Marine Fuels, Jun. 2012, pp. 1-32, Ghent Belgium.
Chevron Lummus Group, Product web page—RDS / VRDS, 2013-2018, pp. 1-2, http://www.chevrontechnologymarketing.com/CLGtech/rds_vrds.aspx.
T.M. Saleh, H. Ismail, J.E.Corbett, R.S. Bali, Commercial Experience in the Operation of Atmospheric Residue Desulfurization Unit in Kuwait national Petroleum Company At Mina Al-Ahmadi Refinery, Catalyst in Petroleum Refining, 1989, pp. 175-189, Elsevier Science Publishers B.V., Amsterdam The Netherlands.
Victor S. Semeykina, Ekaterina V. Parkhomchuk, Alexander V. Polukhin, Pavel D. Parunin, Anton I. Lysikov, Artem B. Ayupov, Svetlana V. Cherepanova, Vladislav V. Kanazhevskiy, Vasil V. Kaichev, Tatyana S. Glazneva, Valentina V. Zvereva, CoMoNi Catalyst Texture and Surface Properties In Heavy Oil Processing. Part I: Hierarchical Macro / Mesoporous Alumina Support, Industrial & Engineering Chemistry Research, vol. 55, Feb. 29, 2016, pp. 3535-3545 American Chemical Society, Washington Dc US.
Victor S. Semeykina, Ekaterina V. Parkhomchuk, Alexander V. Polukhin, Pavel D. Parunin, Anton I. Lysikov, Artem B. Ayupov, Svetlana V. Cherepanova, Vladislav V. Kanazhevskiy, Vasil V. Kaichev, Tatyana S. Glazneva, Valentina V. Zvereva, CoMoNi Catalyst Texture and Surface Properties In Heavy Oil Processing. Part II: Macroporous Sepiolite-Like Mineral, Industrial & Engineering Chemistry Research, vol. 55, Aug. 1, 2016, pp. 9129-9139 American Chemical Society, Washington Dc US.
Andre Hauser, Abdulazim Marafi, Adel Almutairi, Anthony Stanislaus, Comparative Study of Hydrodemetallization (HDM) Catalyst Aging by Boscan Feed and Kuwait Atmospheric Residue, Energy & Fuels, vol. 22 Aug. 27, 2008, pp. 2952-2932, American Chemical Society, Washington Dc US.
Criterion Catalysts & Technologies Lp, Residue Upgrading Using Fixed-Bed Hydroconversion Product Brochure , pp. 1-2, downloaded Jan. 9, 2018.
Criterion Catalysts & Technologies LP, Residue Upgrading Product Information Sheet, pp. 1-2, Aug. 2008, Houston Texas US.
John-Laurent Tronche, Jelena Grigorjeva, Annie Siebert (editor), How Are Refiners Preparing For 2015 Marine Fuel Spec Changes?, pp. 1-2, Jun. 6, 2014, S&P. Global Platts. Houston Texas US.
DNV GL Maritime, Hong Kong Requires Ocean-Going Vessels to Comply with 0.50% M/M Sulphur Limit While at Berth, Statutory Update No. 1, 2015 / March, p. 1, DNV GL Maritime, Hamburg Germany.

(56) References Cited

OTHER PUBLICATIONS

Mike Stockle, Tina Knight, Impact of Low-Sulphur Bunkers on Refineries, Catalysis 2009, p. 1-7, www.digitalrefining.com/article/1000090, article based on presentation from the Nov. 2008 ERC Annual Meeting, Vienna Austria.

Ekaterina V. Parkhomchuk, Anton I. Lysikov, Alexey G. Okunev, Pavel D. Parunin, Victoria S. Semeikina, Artem B. Ayupov, Valentina A. Trunova, Valentin N. Parmon, Meso / Macroporous CoMo Alumina Pellets for Hydrotreating of Heavy Oil, Industrial & Engineering Chemistry Research, vol. 15 Nov. 13, 2013, bages 17117-17125 American Chemical Society, Washington DC US.

Cristian J. Calderon Jorge Ancheyta, Modeling of Slurry-Phase Reactors for Hydrocracking of Heavy Oils, Energy & Fuels, vol. 30 Jan. 28, 2016, pp. 2525-2543, American Chemical Society, Washington DC US.

DNV GL Maritime, Notice for Low Sulphur "Hybrid" Fuel Operation, Technical Update No. 3, 2015 / March, p. 1-2, DNV GL Maritime, Hamburg Germany.

Abdul Waheed Bhutto, Rashid Abro, Shurong Goa, Tauqeer Abbas, Xiaochun Chen, Guangren Yu, Oxidative Desulfurization of Fuel Oils Using Ionic Liquids: A Review, Journal of the Taiwan Institute of Chemical Engineers, vol. 62, Feb. 28, 2016, pp. 84-97, Elsevier B.V. Amsterdam The Netherlands.

I.V. Babich, J.A. Moulijn, Science and Technology of Novel Processes for Deep Desulfurization of Oil Refinery Streams: A Review, Fuel, vol. 82 , Nov. 14, 2002, pp. 607-631 Elsevier B.V. Amsterdam The Netherlands Published first on the web via fuelfirst.com-http://www.fuelfirst.com.

A. Hauser, A. Marafi, A. Stanislaus, A. Al-Adwani, Relation Between Feed Quality and Coke Formation in a Three Stage Atmospheric Residue Desulfurization (ARDS) Process, Energy & Fuels, vol. 19 Feb. 8, 2005, pp. 544-553, American Chemical Society, Washington Dc US.

A Marafi, H. Al-Bazzaz, M. Al-Marri, F. Maruyama, M. Absi-Halbi, A. Stanislaus, Residual-Oil Hydrotreating Kinetics for graded Catalyst Systems: Effect of Original and Treated Feedstocks, Energy Fuels, vol. 17 (5), Jul. 2, 2003 pp. 1191-1197 American Chemical Society, Washington DC US.

Hmaza Al-Bazza, Jia-Lin Kang, Dduha Chehadeh, Dawoud Bahzad, David Shan-Hill Wong, Shi- Shang Jang, Robust Predictions of Catalyst Deactivation of Atmospheric Residual Desulfurization, Energy Fuels, vol. 29, Oct. 21, 2015 pp. 7089-7100 American Chemical Society, Washington DC US.

A.G. Okunev, E.V. Parkhomchuk, A.I. Lysikov, P.D. Parunin, V.S. Semeykina, V.N. Parmon, Catalytic Hydroprocessing of Heavy Oil Feedstocks, Russian Chemical Reviews, vol. 84, Sep. 2015, pp. 981-999, Russian Academy of Sciences and Turpion Ltd. Moscow, Russia.

Ernest Czermanski, Slawomir Drozdziecki, Maciej Matczak, Eugen Spangenberg, Bogusz Wisnicki, Suplphur Regulation—Technology Solutions and Economic Consequences, Institute of Maritime transport and Seaborne Trade, University of Gdansk, 2014, pp. 1-76, University of Gdansk, Gdansk Poland.

Charles Olsen, Brian Watkins, Greg Rosinski, The Challenges of Processing FCC LCO, Catalagram 110 Special Edition, Fall 2011, pp. 6-8, W.R. Grace & Co. Advanced Refining Technologies, Columbus Maryland, US.

Yanzi Jia, Qinghe Yang, Shuling Sun, Hong Nie, Dadong Li, The Influence of Metal Deposits on Residue Hydrodemetallization Catalyst in the Absence and Presence of Coke, Energy Fuels, vol. 30 Feb. 22, 2016 pp. 2544-2554 American Chemical Society, Washington DC US.

James G. Speight, Upgrading Heavy Oils and Residua: The Nature of the Problem, Catalysis on the Energy Scene, 1984, pp. 515-527, Elsevier Science Publishers B.V. Amsterdam, The Netherlands.

Blessing Umana, Nan Zhang, Robin Smith, Development of Vacuum Residue Hydrodesuphurization—Hydrocracking Models and Their Integration with Refinery Hydrogen Networks, Industrial & Engineering Chemistry Research, vol. 55, Jan. 27, 2016, pp. 2391-2406, American Chemical Society, Washington DC US.

Mike Stockle, Tina Knight, Impact of Low Sulphur Bunkers on Refineries, Catalysis, 2009, pp. 1-7, downloaded from website: www.digitalrefining.com/article/1000090.

\* cited by examiner

MULTI-STAGE DEVICE AND PROCESS FOR PRODUCTION OF A LOW SULFUR HEAVY MARINE FUEL OIL

This application is: A) a continuation-in-part of co-pending U.S. application Ser. No. 17/199,148, filed 11 Mar. 2021; U.S. application Ser. No. 17/199,148 is a continuation of U.S. application Ser. No. 16/681,036, filed 12 Nov. 2019, now U.S. Pat. No. 10,954,456, granted 23 Mar. 2021; U.S. application Ser. No. 16/681,036 is a continuation/divisional application of U.S. application Ser. No. 16/103,895, filed 14 Aug. 2018, now U.S. Pat. No. 10,563,133 issued 18 Feb. 2020; U.S. application Ser. No. 16/103,895 is a continuation-in-part of PCT/US2018/017863 filed 12 Feb. 2018, PCT/US2018/017863 claims benefit of U.S. Provisional Application No. 62/589,479, filed 21 Nov. 2017 and PCT/US2018/017863 claims benefit of U.S. Provisional Application No. 62/458,002, filed 12 Feb. 2017; and U.S. application Ser. No. 16/103,895 is a continuation-in-part of PCT/US2018/017855 filed 12 Feb. 2018, PCT/US2018/017855 claims benefit of U.S. Provisional Application No. 62/589,479, filed 21 Nov. 2017 and PCT/US2018/017855 claims benefit of U.S. Provisional Application No. 62/458,002, filed 12 Feb. 2017; and, B) a continuation-in-part of co-pending U.S. application Ser. No. 16/103,884, filed 14 Aug. 2018; U.S. application Ser. No. 16/103,884 is a continuation-in-part of PCT/US2018/017863 filed 12 Feb. 2018, PCT/US2018/017863 claims benefit of U.S. Provisional Application No. 62/589,479, filed 21 Nov. 2017 and PCT/US2018/017863 claims benefit of U.S. Provisional Application No. 62/458,002, filed 12 Feb. 2017; and U.S. application Ser. No. 16/103,884 is a continuation-in-part of PCT/US2018/017855 filed 12 Feb. 2018, PCT/US2018/017855 claims benefit of U.S. Provisional Application No. 62/589,479, filed 21 Nov. 2017 and PCT/US2018/017855 claims benefit of U.S. Provisional Application No. 62/458,002, filed 12 Feb. 2017, and, C) a continuation-in-part of co-pending application Ser. No. 17/331,396, filed May 26, 2021, entitled "MULTI-STAGE PROCESS AND DEVICE UTILIZING STRUCTURED CATALYST BEDS AND REACTIVE DISTILLATION FOR THE PRODUCTION OF A LOW SULFUR HEAVY MARINE FUEL OIL", and Ser. No. 17/331,396 claims priority as continuation of application Ser. No. 16/719,485, filed Dec. 18, 2019, now U.S. Pat. No. 11,021,662, Ser. No. 16/719,485 is a continuation of application Ser. No. 16/103,896, filed Aug. 14, 2018, now U.S. Pat. No. 10,836,966, and Ser. No. 16/103,896 is continuation-in-part of International Application No. PCT/US2018/017863, filed Feb. 12, 2018, PCT/US2018/017863 claims priority to U.S. Provisional Application No. 62/589,479 filed Nov. 21, 2017; PCT/US2018/017863 also claims priority to 62/458,002 filed Feb. 12, 2017, Ser. No. 16/103,896 also claims priority as continuation-in-part of International Application No. PCT/US2018/017855, filed Feb. 12, 2018, PCT/US2018/017855 claims priority to U.S. Provisional Application No. 62/589,479 filed Nov. 21, 2017; PCT/US2018/017855 also claims priority to 62/458,002 filed Feb. 12, 2017; and, D) a continuation-in-part of co-pending application Ser. No. 16/103,887 filed Aug. 14, 2018, entitled "MULTI-STAGE PROCESS AND DEVICE UTILIZING STRUCTURED CATALYST BEDS FOR THE PRODUCTION OF A LOW SULFUR HEAVY MARINE FUEL OIL", and Ser. No. 16/103,887 claims priority as continuation-in-part of International Application No. PCT/US2018/017863, filed Feb. 12, 2018, PCT/US2018/017863 claims priority to U.S. Provisional Application No. 62/589, 479 filed Nov. 21, 2017; PCT/US2018/017863 also claims priority to 62/458,002 filed Feb. 12, 2017, Ser. No. 16/103, 887 also claims priority as continuation-in-part of International Application No. PCT/US2018/017855, filed Feb. 12, 2018, PCT/US2018/017855 claims priority to U.S. Provisional Application No. 62/589,479 filed Nov. 21, 2017; PCT/US2018/017855 also claims priority to 62/458,002 filed Feb. 12, 2017. As such, this application may be seen as a consolidation of, and thereby a continuation-in-part of each of the above noted applications, further this Application expressly incorporates by reference, all of the foregoing referenced applications and granted patents in their entirety.

BACKGROUND

There are two basic marine fuel types, the specifications for which are set forth in ISO 8217:2017; distillate marine fuel (Table 1), and residual marine fuel (Table 2). Distillate marine fuel, also known as Marine Gas Oil (MGO) or Marine Diesel Oil (MDO) comprises kerosene, diesel and gas oil petroleum fractions separated from crude oil in a refinery. Gas oil (also known as medium diesel) is a petroleum fraction intermediate in boiling range and viscosity between kerosene and lubricating oil containing a mixture of mostly paraffinic C10-C19 hydrocarbons. Gas oil is used to heat homes and is used for heavy equipment such as cranes, bulldozers, generators, bobcats, tractors and combine harvesters. Generally maximizing gasoil recovery from heavier oil fractions is the most economic use of the petroleum oil by refiners. Diesel oils are very similar to gas oils with diesel containing predominantly contain a mixture of C10 through C19 hydrocarbons, which include approximately 60% or more aliphatic hydrocarbons, about 1-2% olefinic hydrocarbons, and approximately 35% or less aromatic hydrocarbons. Diesel fuels are primarily utilized as a land transport fuel and as blending component with kerosene to form aviation jet fuel, however on ships diesel fuel may be utilized to run generators and other secondary machinery, but rarely the main propulsion units (i.e. ship engines) because of the cost for fuel. The art of removing Environmental Contaminants (as defined below) from light gas oils and/or kerosene or diesel (collectively and colloquially known as "distillate") is well developed and known and is not the focus of the present invention.

Residual marine fuels or Heavy Marine Fuel Oil (HMFO) are distinctly different from distillate marine fuels, as is noted in ISO 8217:2017. The HMFOs are compliant with the requirements of Table 2 of ISO 8217:2017 (making them residual marine fuels) and the later are compliant with the requirements of Table 1 of ISO 8217:2017 (making them distillate marine fuels). As a practical matter, and as one of skill in the art would know, a marine fuel compliant with ISO 8217:2017 Table 2, cannot be sold as a distillate marine fuel compliant with ISO 8217:2017 Table 1. Similarly, a marine fuel compliant with ISO 8217:2017 Table 1 as a distillate marine fuel would never be sold or marketed as an ISO 8217:2017 Table 2 residual marine fuel because doing so would make no economic sense; the distillate marine fuel is far more valuable than residual marine fuel, distillate marine fuels are less energy dense (i.e. generate less usable energy per unit of fuel) than residual marine fuels, and a ship's prime mover engines are generally not designed to operate on Table 1 distillate marine fuels without modifications or operational changes. ISO 8217: 2017 Table 2 compliant residual marine fuels (a term Applicant herein uses interchangeably with Heavy Marine Fuel Oil (HMFO)) are a complex mixture of hydrocarbons, often heavy or vacuum gas oils mixed with heavier (higher boiling point)

oils and/or hydrocarbon residues—the fractions having a boiling point greater than gas oils, and that are so heavy they may not boil or vaporize under atmospheric pressure or even under vacuum conditions. These heavy oil fractions (sometimes colloquially called residue or resid) often contain asphaltenes and resins between 3 and 20 percent by weight or greater. Asphaltenes are large and complex polycyclic hydrocarbons that are believed to contribute to the fuel energy density, SARA properties, and lubricity properties of HMFO which are commercially desirable. Asphaltenes and resins in heavy oil fractions however, have a propensity to form complex and waxy precipitates, especially when mixed with or in the presence with aliphatic (paraffinic) hydrocarbons such as those that make up the majority of "distillate" hydrocarbon fractions. Once asphaltenes have precipitated out, they are notoriously difficult to re-dissolve and are colloquially described as fuel tank sludge in the marine shipping industry and marine bunker fueling industry.

Large ocean-going ships have relied upon HMFO to power large two stroke diesel engines for over 50 years. HMFO is a complex blend of aromatics, polycyclic aromatics, heavy (high boiling point) distillates, resins, and other uncharacterized hydrocarbons (i.e. residues) generated in the crude oil refinery process; the exact nature of the components is highly dependent upon the refinery and refinery crude slate. Typical refinery streams included in the formulation of HMFO include: atmospheric tower bottoms (i.e. atmospheric residues), vacuum tower bottoms (i.e. vacuum residues) visbreaker residue, FCC Light Cycle Oil (LCO), FCC Heavy Cycle Oil (HCO) also known as FCC bottoms, FCC Slurry Oil also known as decant oil, heavy gas oils, delayed coker oils (DCO), polycylic aromatic hydrocarbons, De-asphalted oils (DAO), reclaimed or reprocessed land transport motor oils, heavy residual oil fractions created throughout the refinery and petrochemical complex, and limited portions (often less than 20% by volume) of cutter oils, kerosene or diesel to achieve a desired viscosity. HMFO has an aromatic content higher than the marine distillate fuels noted above. The HMFO composition is complex and varies with the source of crude oil as well as the refinery processes utilized in a particular refinery to extract the most value out of a barrel of crude oil and are sometimes derisively called "the bottom of the barrel". It well known in the art of formulating HSFO for commercial use to determine the known properties of each hydrocarbon component, and then optimize the ratio of available components in a blend to achieve a desired final blend with the desired commercial properties (such as those in ISO 8217 Table 2). However, blending of heavy hydrocarbons is a delicate and unpredictable process because of the presence of asphaltenes and resins that can precipitate out over time. The mixture of hydrocarbon components is generally characterized as being a wide range of hydrocarbons having high boiling points, often uncharacterized chemically, resulting in a hydrocarbon cocktail that is viscous, high in sulfur and metal content, and high in asphaltenes making HMFO the one of the few, if not the only product of the refining process that has a per barrel value less than the feedstock crude oil itself. Often HMFO is the repository of "left over" hydrocarbon fractions from which a refiner can no longer economically extract any further valuable hydrocarbon fractions.

Industry statistics indicate that about 90% of the HMFO sold contains 3.5 weight % sulfur. With an estimated total worldwide consumption of HMFO of approximately 300 million tons per year, the annual production of sulfur dioxide by the shipping industry is estimated to be over 21 million tons per year. Emissions from HMFO burning in ships contribute significantly to both global air pollution and local air pollution levels.

MARPOL, the International Convention for the Prevention of Pollution from Ships, as administered by the International Maritime Organization (IMO) was enacted to prevent pollution from ships. In 1997, a new annex was added to MARPOL; the Regulations for the Prevention of Air Pollution from Ships—Annex VI to minimize airborne emissions from ships and their contribution to air pollution. A revised Annex VI with tightened emissions limits on sulfur oxides, nitrogen oxides, ozone depleting substances and volatile organic compounds (SOx, NOx, ODS, VOC) was adopted in October 2008 and effective 1 Jul. 2010 (hereafter called Annex VI (revised)).

MARPOL Annex VI (revised) established a set of stringent emissions limits for vessel operations in designated Emission Control Areas (ECAs). The ECAs under MARPOL Annex VI (revised) are: i) Baltic Sea area—as defined in Annex I of MARPOL—SOx only; ii) North Sea area—as defined in Annex V of MARPOL—SOx only; iii) North American—as defined in Appendix VII of Annex VI of MARPOL—SOx, NOx and PM; and, iv) United States Caribbean Sea area—as defined in Appendix VII of Annex VI of MARPOL—SOx, NOx and PM.

Annex VI (revised) was codified in the United States by the Act to Prevent Pollution from Ships (APPS). Under the authority of APPS, the U.S. Environmental Protection Agency (the EPA), in consultation with the United States Coast Guard (USCG), promulgated regulations which incorporate by reference the full text of MARPOL Annex VI (revised). See 40 C.F.R. § 1043.100(a)(1). On Aug. 1, 2012 the maximum sulfur content of all marine fuel oils used onboard ships operating in US waters/ECA cannot exceed 1.00% wt. (10,000 ppm) and on Jan. 1, 2015 the maximum sulfur content of all marine fuel oils used in the North American ECA was lowered to 0.10% wt. (1,000 ppm). At the time of implementation, the United States government indicated that vessel operators must vigorously prepare for the 0.10% wt. (1,000 ppm) US ECA marine fuel oil sulfur standard. To encourage compliance, the EPA and USCG refused to consider the cost of compliant low sulfur fuel oil to be a valid basis for claiming that compliant fuel oil was not available for purchase. For the past five years there has been a very strong economic incentive to meet the marine industry demands for low sulfur HMFO, however technically viable solutions have not been realized. There has been an on-going and urgent demand for processes and methods for making a low sulfur HMFO that is compliant with MARPOL Annex VI emissions requirements, especially the strict MARPOL ECA requirements.

Under the revised MARPOL Annex VI, the global sulfur cap for HMFO was reduced to 3.50% wt. effective 1 Jan. 2012; then further reduced to 0.50% wt, effective 1 Jan. 2020. This regulation has been the subject of much discussion in both the marine shipping and marine fuel bunkering industry. There has been a very strong economic incentive to meet the international marine industry demands for low sulfur HMFO that is compliant with ISO 8217:2017 Table 2 as a residual marine fuel, however technically viable solutions have not been realized. There is an on-going and urgent demand for processes and methods for making a low sulfur HMFO that is compliant with both the MARPOL Annex VI emissions requirements and ISO 8217 Table 2.

Primary control solutions: A focus for compliance with the MARPOL requirements has been on primary control solutions for reducing the sulfur levels in marine fuel components prior to combustion based on the substitution of HMFO with alternative fuels. Because of the potential risks to ships propulsion systems (i.e. fuel systems, engines, etc.) when a ship switches fuel, the conversion process must be done safely and effectively to avoid any technical issues. However, each alternative fuel has both economic and technical difficulties adapting to the decades of shipping infrastructure and bunkering systems based upon HMFO utilized by the marine shipping industry.

LNG: The most prevalent primary control solution in the shipping industry is the adoption of LNG as a primary or additive fuel to HMFO. An increasing number of ships are using liquefied natural gas (LNG) as a primary fuel. Natural gas as a marine fuel for combustion turbines and in diesel engines leads to negligible sulfur oxide emissions. The benefits of natural gas have been recognized in the development by IMO of the International Code for Ships using Gases and other Low Flashpoint Fuels (the IGF Code), which was adopted in 2015. LNG however presents the marine industry with operating challenges including: on-board storage of a cryogenic liquid in a marine environment will require extensive renovation and replacement of the bunker fuel storage and fuel transfer systems of the ship; the supply of LNG is far from ubiquitous in major world ports; updated crew qualifications and training on operating LNG or duel fuel engines will be required prior to going to sea.

Sulfur Free Bio-fuels: Another proposed primary solution for obtaining compliance with the MARPOL requirements is the substitution of HMFO with sulfur free bio-fuels. Bio-diesel has had limited success in displacing petroleum derived diesel however supply remains constrained. Methanol has been used on some short sea services in the North Sea ECA on ferries and other littoral ships. The widespread adoption of bio-fuel, such as bio-diesel or methanol, present many challenges to ship owners and the bunker fuel industry. These challenges include: fuel system compatibility and adaptation of existing fuel systems will be required; contamination during long term storage of methanol and bio-diesel from water and biological contamination; the heat content of methanol and bio-diesel on a per ton basis is substantially lower than HMFO; and methanol has a high vapor pressure and presents serious safety concerns of flash fires.

Replacement of heavy fuel oil with marine gas oil or marine diesel: Another proposed primary solution is to simply replace HMFO with marine gas oil (MGO) or marine diesel (MDO). As noted above, the first major difficulty is the constraint in global supply of the hydrocarbon fraction that make up over 90% vol of MGO and MDO. It is reported that the effective spare capacity to produce MGO is less than 100 million metric tons per year resulting in an annual shortfall in marine fuel of over 200 million metric tons per year. Refiners not only lack the capacity to increase the production of lower value MGO, but they have no economic motivation because higher value and higher margins can be obtained from ultra-low sulfur diesel fuel for land-based transportation systems (i.e. trucks, trains, mass transit systems, heavy construction equipment, etc.). Lastly, and most importantly from a refiner's perspective, a distillate only solution ignores the economic impact of disposing of the refinery streams that previously went to the high sulfur HMFO blending pool.

Blending: Another primary solution is the blending of one or more of the higher sulfur components of HMFO with lower sulfur containing fuels such as low sulfur marine diesel (0.1% wt. sulfur) to achieve a Product HMFO with a sulfur content of 0.5% wt. This involves the application of the well-known results driven optimized blending processes in which the properties (including sulfur content) of the starting materials are known and blending simply becomes and exercise in achieving a compliant (ie. less than 0.5 wt % sulfur) blend for the least cost. For example, in a hypothetical straight blending approach (based on simple linear blending) every 1 ton of HSFO (3.5% sulfur) requires 7.5 tons of MGO or MDO material with 0.1% wt. S to achieve a sulfur level of 0.5% wt. HMFO. One of skill in the art of fuel blending will immediately understand that blending is a balancing of properties between the components and key properties required of a HMFO compliant ISO 8217:2017 Table 2, specifically viscosity, density, CCAI, flash point, pour point, potential sediment, and solids content can be substantially altered and adversely affected in unpredictable ways by the optimized blending process. Further a blending process may result in a fuel with variable viscosity and density resulting in inherent instability during storage, such that that final fuel delivered to the customer may no longer meet the requirements for a HMFO.

Further complications may arise when blended HMFO is introduced into the bunkering infrastructure and shipboard systems otherwise designed for unblended HMFO. There is a real risk of incompatibility when the two fuels are mixed. Blending a mostly paraffinic-type distillate fuel (MGO or MDO) with a HMFO having a high aromatic content often correlates with poor solubility of asphaltenes. A blended fuel is likely to result in the precipitation of asphaltenes and/or highly paraffinic materials from the distillate material forming an intractable fuel tank sludge. Fuel tank sludge causes clogging of fuel filters and separators, transfer pumps and lines, build-up of sludge in storage tanks, sticking of fuel injection pumps (deposits on plunger and barrel), and plugged fuel nozzles. Such a risk to the primary propulsion system is not acceptable for a cargo ship in the open ocean.

Lastly blending of HMFO with marine distillate products (MGO or MDO) is not economically feasible. A blender will be taking a high value product (0.1% S marine gas oil (MGO) or marine diesel (MDO)) and blending it 7.5 to 1 with a low value high sulfur HMFO to create a final IMO/MARPOL compliant HMFO (i.e. 0.5% wt. S Low Sulfur Heavy Marine Fuel Oil—LSHMFO). It is expected that LSHMFO will sell at a lower price on a per ton basis than the value of the two blending stocks alone.

Processing of heavy oils. For the past several decades, the focus of refining industry research efforts related to the processing of heavy oils (heavy crude oils, bitumen, distressed oils, or residual oils) has been on upgrading the properties of these low value refinery process oils to create lighter oils with greater value. The challenge has been that heavy oils can be unstable (depending upon the source or process that created them) and contain high levels of sulfur, nitrogen, phosphorous, metals (especially vanadium and nickel) and asphaltenes. Much of the nickel and vanadium is in difficult to remove chelates with porphyrins. Vanadium and nickel porphyrins and other metal organic compounds are responsible for catalyst contamination and corrosion problems in the refinery. The sulfur, nitrogen, and phosphorous, are removed because they are well-known poisons for the precious metal (platinum and palladium) catalysts utilized in the processes downstream of the atmospheric or vacuum distillation towers.

The difficulties treating heavy oils, such as atmospheric or vacuum residual streams or thermally cracked oil, has been known for many years and has been the subject of considerable research and investigation. Numerous heavy oil conversion processes have been developed in which the goals are same, 1) create a more valuable, preferably distillate range hydrocarbon product; and 2) concentrate the Contaminants such as sulfur, nitrogen, phosphorous, metals and asphaltenes into a form (coke, heavy coker residue, FCC slurry oil) for removal from the refinery stream. Well known and accepted practice in the refining industry is to increase the reaction severity (elevated temperature and pressure) to produce hydrocarbon products that are lighter and more purified, increase catalyst lifetimes and remove sulfur, nitrogen, phosphorous, metals and asphaltenes from the refinery stream.

It is also well known in these processes that the nature of the heavy oil feedstock has a significant influence upon the products produced, catalyst life, and ultimately the economic viability of the process. In a representative technical paper Residual-Oil Hydrotreating Kinetics for Graded Catalyst Systems: Effects of Original and Treated Feedstocks, is stated that "The results revealed significant changes in activity, depending on the feedstock used for the tests. The study demonstrates the importance of proper selection of the feedstocks used in the performance evaluation and screening of candidate catalyst for graded catalyst systems for residual-oil hydrotreatment." From this one skilled in the art would understand that the conditions required for the successful hydroprocessing of atmospheric residue are not applicable for the successful hydroprocessing of vacuum residue which are not applicable for the successful hydroprocessing of a visbreaker residue, and so forth. Successful reaction conditions depend upon the nature of the heavy oil feedstock. For this reason, modern complex refineries often have multiple hydroprocessing units, each unit being targeted on specific heavy oil hydrocarbon stream with a focus on creating the desirable and valuable light hydrocarbons and providing a product acceptable to the next downstream process.

A further difficulty in the processing of heavy oil and other heavy residual hydrocarbons is the inherent instability of these refinery streams. One of skill in the art understands there are many practical reasons each refinery stream is handled in isolation. One such reason is the unpredictable nature of the asphaltenes contained in each stream. Asphaltenes are large and complex hydrocarbons with a propensity to precipitate out of refinery hydrocarbon streams. One of skill in the art knows that even small changes in the components or physical conditions (temperature, pressure) can precipitate asphaltenes that were otherwise dissolved in solution. Once precipitated from solution, asphaltenes can quickly block vital lines, control valves, coat critical sensing devices (i.e. temperature and pressure sensors) and generally result in the severe and very costly disruption and shut down of a unit or the whole refinery. For this reason, it has been a long-standing practice within refineries to not blend intermediate product streams (such as atmospheric residue, vacuum residue, FCC slurry oil, etc. . . . ) and process each stream in separate reactors.

In summary, since the announcement of the MARPOL standards reducing the global levels of sulfur in HMFO, refiners of crude oil have had only limited success in the technical efforts to create a process for the production of a low sulfur substitute for HMFO. Despite the strong governmental and economic incentives and needs of the international marine shipping industry, refiners have little economic reason to address the removal of Environmental Contaminants from HMFOs. Instead, the global refining industry has been focused upon generating greater value from each barrel of oil by creating light hydrocarbons (i.e. diesel and gasoline) and concentrating the Environmental Contaminants into increasingly lower value streams (i.e. residues) and products (petroleum coke, HMFO). Shipping companies have focused on short term solutions, such as the installation of scrubbing units, or adopting the limited use of more expensive low sulfur marine diesel and marine gas oils as a substitute for HMFO. On the open seas, most if not all major shipping companies continue to utilize the most economically viable fuel, that is HMFO. There remains a long standing and unmet need for processes and devices that remove the Environmental Contaminants (i.e. organic and inorganic chemical species within the HMFO resulting in measurable amounts of sulfur, nitrogen, phosphorous, metals especially vanadium and nickel, iron, aluminum and silicon) from HMFO without altering the qualities and properties that make HMFO the most economic and practical means of powering ocean going vessels. Further there remains a long standing and unmet need for IMO compliant low sulfur (i.e. 0.5% wt. sulfur) or ultralow (0.10 wt. sulfur) HMFO that is also compliant with the bulk properties required by ISO 8217 Table 2, and be stable, and compatible and thus merchantable and suitable for its intended use in for the marine shipping industry.

SUMMARY

It is a general objective to reduce the Environmental Contaminants from a Heavy Marine Fuel Oil (HMFO) in a multistage process that minimizes the changes in the desirable properties of the HMFO and minimizes the production of by-product hydrocarbons (i.e. hydrocarbons having a boiling point less than 150 F).

A first aspect and illustrative embodiment encompasses a multi-stage process for the production of a Product Heavy Marine Fuel Oil, the process comprising: mixing a quantity of a Heavy Marine Fuel Oil feed with a quantity of an Activating Gas to give a Feedstock Mixture, wherein said Heavy Marine Fuel Oil feed complies with ISO 8217 (2017) Table 2 as a residual marine fuel, except said Heavy Marine Fuel Oil feed has one or more Environmental Contaminants selected from the group consisting of: sulfur; vanadium, nickel, iron, aluminum and silicon and combinations thereof, and wherein said one or more Environmental Contaminants have a combined concentration greater than 0.5% wt.; contacting the Feedstock Mixture with one or more catalysts under hydrotreating reactive conditions in a Reaction System to form a Process Mixture from said Feedstock Mixture, wherein the Reaction System comprises two or more reactor trains in parallel, and wherein each of said reactor train is configured with at least two reactor vessels in series, and wherein each reactor vessel is independently selected from the group of operational configurations consisting of: dense packed fixed bed trickle reactor; dense packed fixed bed up-flow reactor; ebulliated bed three phase up-flow reactor; fixed bed divided wall reactor; fixed bed three phase bubble reactor; fixed bed liquid full reactor, fixed bed high flux reactor; fixed bed structured catalyst bed reactor; fixed bed reactive distillation reactor and combinations thereof, and wherein each Reaction System is configured such that the Feedstock Mixture is first passed through at least one first reactor vessel containing one or more catalyst materials selected from the group consisting of hydrodemetallization catalyst, hydro-transition catalyst, inert catalyst materials and combinations thereof; and then subsequently passed through at least one second reactor vessel containing one or more catalyst materials selected from the group consisting of hydro-transition catalyst, hydrodesulfurization catalyst, inert catalyst materials, and combinations thereof; contacting said Feedstock Mixture with one or more catalyst materials under hydroprocessing reactive conditions within the reactor vessels the Reaction System thereby forming a Process Mixture from said Feedstock Mixture, wherein said Process Mixture comprises a Product Heavy Marine Fuel Oil, by-product hydrocarbons having a boiling point less than 150 F and bulk gases; receiving by fluid communication said Process Mixture in at least one separation vessel and separating the Product Heavy Marine Fuel Oil from the by-product hydrocarbons and the bulk gases and, discharging said Product Heavy Marine Fuel Oil from the at least one separation vessel, wherein said Product Heavy Marine Fuel Oil complies with ISO 8217:2017 Table 2 as a residual marine fuel. An alternative illustrative embodiment includes the foregoing wherein the Reaction System is further comprised of a pre-treatment reactor vessel located upstream of both the first reactor train and the second reactor train, and the pre-treatment reactor vessel is under hydrodemetallization reaction conditions and contains one or more catalyst materials selected from the group consisting of hydrodemetallization catalyst, hydrotransition catalyst, inert catalyst materials and combinations thereof. An alternative illustrative embodiment includes the foregoing wherein the Reaction System is further comprised of a post-treatment reactor vessel located downstream of both the first reactor train and the second reactor train, and the post-treatment reactor vessel is under hydrodesulfurization reaction conditions and contains one or more catalyst materials selected from the group consisting of hydrodesulfurization catalyst, inert catalyst materials and combinations thereof. An alternative illustrative embodiment includes the foregoing wherein said Product Heavy Marine Fuel Oil has one or more Environmental Contaminants with a combined concentration between the range of 0.50 mass % to 0.05 mass % or alternatively wherein one of the one or more Environmental Contaminants in the Product Heavy Marine Fuel Oil is sulfur and the sulfur content of the Product Heavy Marine Fuel Oil is between the range of 0.50 mass % to 0.05 mass %. A further embodiment includes the foregoing as well as wherein the catalyst materials comprises: a porous inorganic oxide catalyst carrier and a transition metal catalyst material, wherein the porous inorganic oxide catalyst carrier is at least one carrier independently selected from the group consisting of alumina, alumina/boria carrier, a carrier containing metal-containing aluminosilicate, alumina/phosphorus carrier, alumina/alkaline earth metal compound carrier, alumina/titania carrier and alumina/zirconia carrier, and wherein the transition metal catalyst material is one or more transition metals independently selected from the group consisting of group 6, 8, 9 and 10 of the Periodic Table; and wherein the Activating Gas is selected from mixtures of nitrogen, hydrogen, carbon dioxide, gaseous water, and methane, such that Activating Gas has an ideal gas partial pressure of hydrogen (pH2) greater than 80% of the total pressure of the Activating Gas (P). It is contemplated that in the forgoing the amount of by-product hydrocarbons having a boiling point less than 150 F is less than 10% mass of the product mass balance and this may be further understood as including an embodiment wherein the hydrotreating reactive conditions comprise: the ratio of the quantity of the Activating Gas to the quantity of Heavy Marine Fuel Oil feed is in the range of 250 scf gas/bbl of Heavy Marine Fuel Oil feed to 10,000 scf gas/bbl of Heavy Marine Fuel Oil feed; a total pressure is between of 250 psig and 3000 psig; and, the indicated temperature is between of 500° F. to 900° F., and, wherein the liquid hourly space velocity is between 0.05 h$^{-1}$ and 1.0 h$^{-1}$.

A second illustrative aspect of the present invention includes a device for the production of a Product Heavy Marine Fuel Oil, the device comprising: a gas/liquid mixing device for mixing a quantity of Feedstock Heavy Marine Fuel Oil with a quantity of Activating Gas to give a Feedstock Mixture; a Reactor Feed Furnace in fluid communication with said gas/liquid mixing device, wherein the Reactor Feed Furnace the Feedstock Mixture is heated to the specified process temperature in the range from 500° F. to 900° F.; a Reaction System in fluid communication with the Reactor Feed Furnace, wherein the Reaction System comprises at least one first reactor train and at least one second reactor train, wherein each of the first reactor train and the second reactor train comprise of at least two reactor vessels, each reactor vessel contains one or more internal structure selected from the group consisting of trays, perforated support plates, catalyst beds, structured catalyst beds, Raschig rings, Dixon rings, and combinations of these to promote the transformation of the Feedstock Mixture to a Process Mixture; at least one separating vessel in fluid communication with the Reaction System, wherein said at least one separating vessel receives said Process Mixture and separates the Process Mixture into bulk gaseous components, by-product hydrocarbons having a boiling point less than 150 F, and a Product Heavy Marine Fuel Oil, and a discharge pipe, the discharge pipe being in fluid communication with the at least one separating vessel, wherein the discharge pipe discharges the Product Heavy Marine Fuel oil from the separating vessel. Such a device may involve a the Feedstock Heavy Marine Fuel Oil complies with ISO 8217:2017 Table 2 as a residual marine fuel except for a sulfur content (ISO 14596 or ISO 8754) greater than 0.5 wt % and a the Product Heavy Marine Fuel Oil complies with ISO 8217:2017 Table 2 as a residual marine fuel and has a sulfur content (ISO 14596 or ISO 8754) less than 0.5 wt %. Also encompassed by an illustrative embodiment would be a device wherein the Reaction Section contains a catalyst, wherein the catalyst comprises: a porous inorganic oxide catalyst carrier and a transition metal catalyst, wherein the porous inorganic oxide catalyst carrier is at least one carrier selected from the group consisting of alumina, alumina/boria carrier, a carrier containing metal-containing aluminosilicate, alumina/phosphorus carrier, alumina/alkaline earth metal compound carrier, alumina/titania carrier and alumina/zirconia carrier, and wherein the transition metal catalyst is one or more metals selected from the group consisting of group 6, 8, 9 and 10 of the Periodic Table. It is further contemplated that the inventive embodiment may include a Reaction System comprises at least six reactor vessels wherein said reactor vessels are configured in a matrix of at least 3 reactors arranged in series to form two reactor trains and wherein the 2 reactor trains arranged in parallel and configured such that Process Mixture can be distributed across the matrix. It also may be that the first reactor in each reactor train is loaded with a first catalyst mixture, the second reactor in each reactor is loaded within a second catalyst mixture and the third reactor is loaded with a third catalyst mixture, and wherein the first catalyst mixture, second catalyst mixture and third catalyst mixture are not the same.

DETAILED DESCRIPTION

Figure 1:
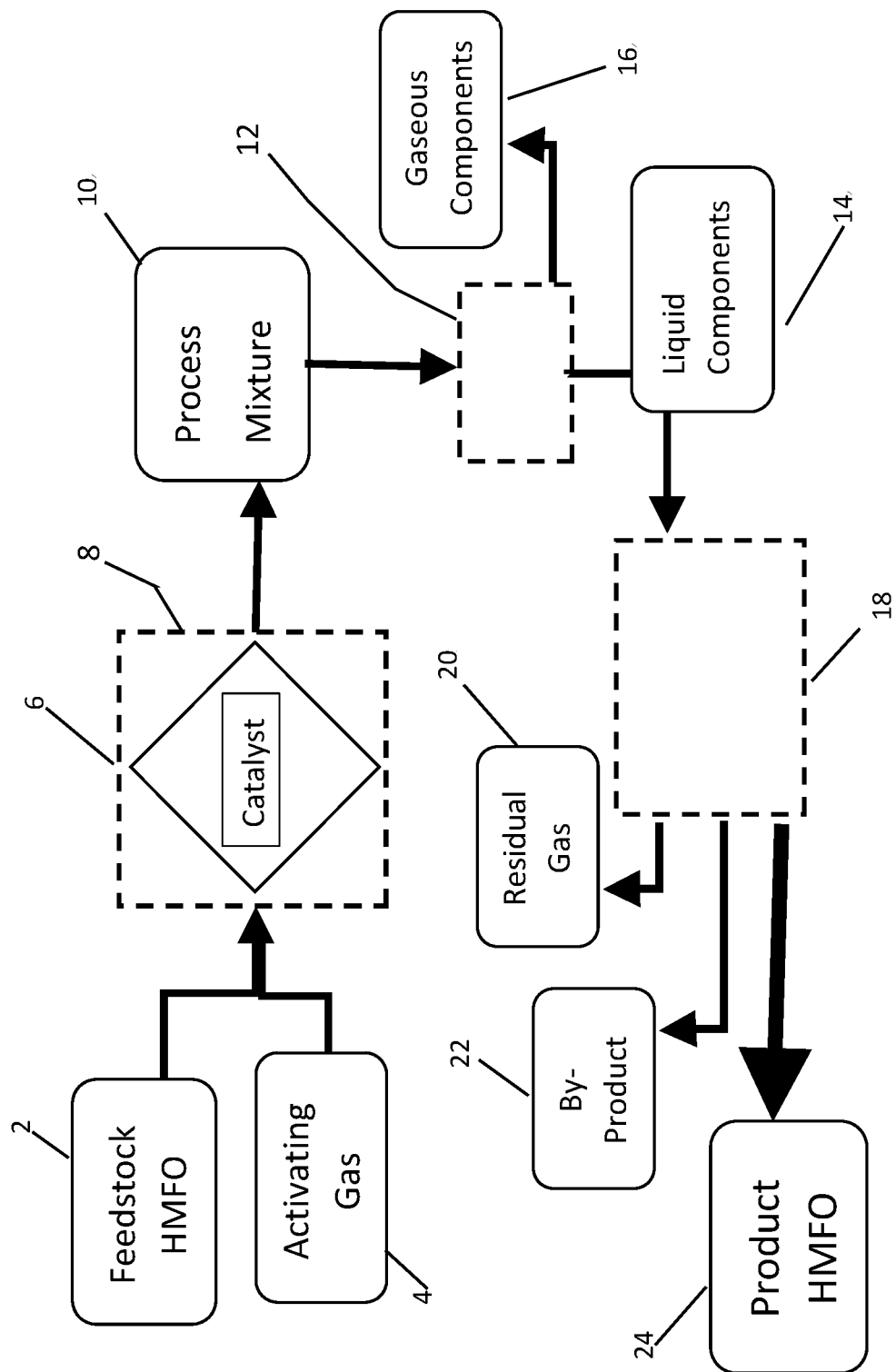
FIG. 1 is a process block flow diagram of an illustrative core process to produce Product HMFO.

The inventive concepts as described herein utilize terms that should be well known to one of skill in the art, however certain terms are utilized having a specific intended meaning and these terms are defined below:

Heavy Marine Fuel Oil (HMFO) is a petroleum product fuel compliant with the ISO 8217:2017 Table 2 standards for the properties of residual marine fuel but may or may not be compliant with the required concentration levels of the Environmental Contaminants.

Environmental Contaminants are organic and inorganic chemical species of HMFO that result in the formation of $SO_x$, $NO_x$ and particulate materials upon combustion, more specifically organic and inorganic compounds within the HMFO resulting in measurable amounts of sulfur, nitrogen, phosphorus, vanadium, nickel, iron, aluminum and silicon.

Feedstock HMFO is a petroleum product fuel compliant with the ISO 8217:2017 Table 2 standards for the properties of residual marine fuels except for the concentration of Environmental Contaminants, preferably the Feedstock HMFO has a sulfur content greater than the global MARPOL standard of 0.5% wt. sulfur, and preferably and has a sulfur content (ISO 14596 or ISO 8754) between the range of 5.0% wt. to 1.0% wt. It should be noted that it is not a requirement of the Feedstock HMFO to be of merchantable quality as that term is used in this Application; one surprising and unexpected aspect of this invention is that hydroprocessing the Feedstock HMFO appears to impart properties of fungibility (i.e. compatibility, miscibility and stability over time with other marine fuels) to the Product HMFO that may not be necessarily present in the Feedstock HMFO.

Product HMFO is a petroleum product fuel compliant with the ISO 8217:2017 Table 2 standards for the properties of residual marine fuels and achieves a sulfur content lower than the global MARPOL standard of 0.5% wt. sulfur (ISO 14596 or ISO 8754), and preferably a maximum sulfur content (ISO 14596 or ISO 8754) between the range of 0.05% wt. to 1.0% wt. The Product HMFO has been found to be of merchantable quality as that term is used in this Application; that is one surprising and unexpected aspect of this invention is that hydroprocessing appears to impart properties of fungibility (i.e. compatibility, miscibility and stability over time with other marine fuels) to the Product HMFO, a property that may not be necessarily present in the Feedstock HMFO.

Activating Gas: is a mixture of gases utilized in the process combined with the catalyst to remove the Environmental Contaminants from the Feedstock HMFO. Activating Gas is defined in greater technical detail below.

Fluid communication: is the capability to transfer fluids (either liquid, gas or combinations thereof, which might have suspended solids) from a first vessel or location to a second vessel or location, this may encompass connections made by pipes (also called a line), spools, valves, intermediate holding tanks or surge tanks (also called a drum).

Merchantable quality: is a level of quality for a residual marine fuel so that the fuel is fit for the ordinary purpose it is intended to serve (i.e. serve as a residual marine fuel for a marine ship) and can be commercially sold as such, and that is fungible (i.e. compatible, miscable and stable over time) with other residual marine fuels and distillate marine fuels. Bbl or bbl: is a standard volumetric measure for oil; 1 bbl=0.1589873 m$^3$; or 1 bbl=158.9873 liters; or 1 bbl=42.00 US liquid gallons.

Bpd: is an abbreviation for Bbl per day.

SCF: is an abbreviation for standard cubic foot of a gas; a standard cubic foot (at 14.73 psi and 60° F.) equals 0.0283058557 standard cubic meters (at 101.325 kPa and 15° C.).

The inventive concepts are illustrated in more detail in this description referring to the drawings, in which FIG. 1 shows the generalized block process flows for a core process of reducing the Environmental Contaminants in a Feedstock HMFO (as defined above and herein (i.e. compliant with ISO 8217:2017 Table 2 as a residual marine fuel except for Environmental Contaminants level) and producing a Product HMFO (as defined above and herein) that is compliant with ISO 8217:2017 Table 2 as a residual marine fuel. A predetermined volume of Feedstock HMFO (2) is mixed with a predetermined quantity of Activating Gas (4) to give a Feedstock Mixture. The Feedstock HMFO utilized generally complies with the bulk physical and certain key chemical properties for a residual marine fuel oil otherwise compliant with ISO8217:2017 Table 2 as a residual marine fuel exclusive of the Environmental Contaminants. More particularly, when the Environmental Contaminant is sulfur, the concentration of sulfur in the Feedstock HMFO may be greater than 0.5 wt %, for example between the range of 5.0% wt. to 1.0% wt. The Feedstock HMFO should have bulk physical properties required of an ISO8217:2017 compliant HMFO. The Feedstock HMFO should exhibit the bulk properties of: a maximum of kinematic viscosity at 50° C. (ISO 3104) between the range from 180 mm$^2$/s to 700 mm$^2$/s; a maximum of density at 15° C. (ISO 3675) between the range of 991.0 kg/m$^3$ to 1010.0 kg/m$^3$; a CCAI in the range of 780 to 870; and a flash point (ISO 2719) no lower than 60° C. Properties of the Feedstock HMFO connected to the formation of particulate material (PM) include: a total sediment—aged (ISO 10307-2) less than 0.10% wt. and a carbon residue—micro method (ISO 10370) less than 20.00% wt. and an aluminum plus silicon (ISO 10478)

content of less than 60 mg/kg. Environmental Contaminants other than sulfur that may be present in the Feedstock HMFO over the ISO requirements may include vanadium, nickel, iron, aluminum and silicon substantially reduced by the process of the present invention. One of skill in the art will appreciate that the vanadium content serves as a general indicator of these other metallic Environmental Contaminates. In one preferred embodiment the vanadium content is compliant with ISO 8217:2017 Table 2 as a residual marine fuel so the Feedstock HMFO has a maximum vanadium content (ISO 14597) between the range from 350 mg/kg to 450 ppm mg/kg. However, in another embodiment the vanadium content exceeds the requirements of ISO 8217: 2017 Table 2 and the Feedstock HMFO has a vanadium content (ISO 14597) in excess of 450 ppm mg/kg. and this is reduced to within acceptable limits by Applicant's process.

As for the properties of the Activating Gas, the Activating Gas should be selected from mixtures of nitrogen, hydrogen, carbon dioxide, gaseous water, and methane. The mixture of gases within the Activating Gas should have an ideal gas partial pressure of hydrogen ($p_{H2}$) greater than 80% of the total pressure of the Activating Gas (P) and more preferably wherein the Activating Gas has an ideal gas partial pressure of hydrogen ($p_{H2}$) greater than 90% of the total pressure of the Activating Gas (P) and more preferably wherein the Activating Gas has an ideal gas partial pressure of hydrogen ($p_{H2}$) greater than 95% of the total pressure of the Activating Gas (P). It will be appreciated by one of skill in the art that the molar content of the Activating Gas is another criterion the Activating Gas should have a hydrogen mole fraction in the range between 80% and 100% of the total moles of Activating Gas, more preferably wherein the Activating Gas has a hydrogen mole fraction between 80% and 99% of the total moles of Activating Gas.

The Feedstock Mixture (i.e. mixture of Feedstock HMFO and Activating Gas) is brought up to the process conditions of temperature and pressure and introduced into a Reactor System, preferably one or more reactor vessels. The Feedstock Mixture is then contacted with one or more catalysts (8) under conditions suitable for removal of the Environmental Contaminants via hydrotreating, more specifically hydrodemetallization and/or hydrodesulfurization, but preferably not conditions of hydrocracking, to form a Process Mixture from the Feedstock Mixture.

The core process conditions are selected so the ratio of the quantity of the Activating Gas to the quantity of Feedstock HMFO is 250 scf gas/bbl of Feedstock HMFO to 10,000 scf gas/bbl of Feedstock HMFO; and preferably between 2000 scf gas/bbl of Feedstock HMFO 1 to 5000 scf gas/bbl of Feedstock HMFO more preferably between 2500 scf gas/bbl of Feedstock HMFO to 4500 scf gas/bbl of Feedstock HMFO. The process conditions are selected so the total pressure in the first vessel is between of 250 psig and 3000 psig; preferably between 1000 psig and 2500 psig, and more preferably between 1500 psig and 2200 psig. The process reactive conditions are selected so the indicated temperature within the first vessel is between of 500° F. to 900° F., preferably between 650° F. and 850° F. and more preferably between 680° F. and 800° F. The process conditions are selected so the liquid hourly space velocity within the first vessel is between 0.05 oil/hour/$m^3$ catalyst and 1.0 oil/hour/$m^3$ catalyst; preferably between 0.08 oil/hour/$m^3$ catalyst and 0.5 oil/hour/$m^3$ catalyst; and more preferably between 0.1 oil/hour/$m^3$ catalyst and 0.3 oil/hour/$m^3$ catalyst to achieve deep desulfurization with product sulfur levels below 0.1 ppmw. These conditions can be further optimized to be reactive distillation conditions such that the lighter by-product hydrocarbons (i.e. hydrocarbons having a boiling point less than 150 F) and gases contained in the Process Mixture are separated via vaporization (i.e. distillation) from the Product HMFO which remains in a liquid phase.

One of skill in the art will appreciate that the core process reactive conditions are determined considering the hydraulic capacity of the unit. Exemplary hydraulic capacity for the treatment unit may be between 100 bbl of Feedstock HMFO/day and 100,000 bbl of Feedstock HMFO/day, preferably between 1000 bbl of Feedstock HMFO/day and 60,000 bbl of Feedstock HMFO/day, more preferably between 5,000 bbl of Feedstock HMFO/day and 45,000 bbl of Feedstock HMFO/day, and even more preferably between 10,000 bbl of Feedstock HMFO/day and 30,000 bbl of Feedstock HMFO/day.

One of skill in the art will appreciate that a fixed bed reactor using a supported transition metal heterogeneous catalyst will be the technically easiest to implement and is preferred. However liquid catalyst or bulk catalyst additive may prove to be advantageous with certain Feedstock HMFO. Other alternative reactor types may be utilized including, but not limited to: ebulliated or fluidized bed reactors; structured bed reactors; three-phase bubble reactors; reactive distillation bed reactors and the like all of which may be co-current or counter current. It is also contemplated that high flux or liquid full type reactors may be used such as those disclosed in U.S. Pat. Nos. 6,123,835; 6,428,686; 6,881,326; 7,291,257; 7,569,136 and other similar and related patents and patent applications all of which are incorporated by reference.

The transition metal heterogeneous catalyst utilized comprises a porous inorganic oxide catalyst carrier and a transition metal catalytic metal. The porous inorganic oxide catalyst carrier is at least one carrier selected from the group consisting of alumina, alumina/boria carrier, a carrier containing metal-containing aluminosilicate, alumina/phosphorus carrier, alumina/alkaline earth metal compound carrier, alumina/titania carrier and alumina/zirconia carrier. The transition metal catalytic metal component of the catalyst is one or more metals selected from the group consisting of group 6, 8, 9 and 10 of the Periodic Table. In a preferred and illustrative embodiment, the transition metal heterogeneous catalyst is a porous inorganic oxide catalyst carrier and a transition metal catalyst, in which the preferred porous inorganic oxide catalyst carrier is alumina and the preferred transition metal catalyst is Ni—Mo, Co—Mo, Ni—W or Ni—Co—Mo. The process by which the transition metal heterogeneous catalyst is manufactured is known in the literature and preferably the catalysts are commercially available as hydrodemetallization catalysts, hydro-transition catalysts, hydrodesulfurization catalyst and combinations of these which may or may not be pre-sulfided.

The Process Mixture (10) in this core process is removed from the Reactor System (8) and from being in contact with the one or more catalyst and is sent via fluid communication to a second vessel (12), preferably a gas-liquid separator or hot separators and cold separators, for separating the liquid components (14) of the Process Mixture from the bulk gaseous components (16) of the Process Mixture. The gaseous components (16) are treated beyond the battery limits of the immediate process. Such gaseous components may include a mixture of Activating Gas components and lighter hydrocarbons (mostly methane, ethane and propane) that may have been formed as part of the by-product hydrocarbons (i.e. hydrocarbons having a boiling point less than 105 F) from the process.

The Liquid Components (16) of the Process Mixture in this core process are sent via fluid communication to a third vessel (18), preferably a fuel oil product stripper system, for separating any residual gaseous components (20) and by-product hydrocarbon components (22) (i.e. hydrocarbons having a boiling point less than 150 F) from the Product HMFO (24). The residual gaseous components (20) may be a mixture of gases selected from the group consisting of: nitrogen, hydrogen, carbon dioxide, hydrogen sulfide, gaseous water, $C_1$-$C_5$ hydrocarbons. This residual gas is treated outside of the battery limits of the immediate process, combined with other gaseous components (16) removed from the Process Mixture (10) in the second vessel (12). The liquid by-product hydrocarbon components, which may be condensable hydrocarbons unavoidably formed in the process (22) may be a mixture of hydrocarbons such a wild naphtha and light diesel having a boiling point less than 150° F., that for example can be sent to the gasoline motor fuel blending pool or sold as gasoline and diesel blending components on the open market. Any liquid by-product hydrocarbons which result from hydrocracking should be less than 15% wt., preferably less than 5% wt. and more preferably less than 3% wt. of the overall process mass balance for the unit. We also contemplate a second draw (not shown) may be included to withdraw a "distillate" product, preferably a middle to heavy diesel. The liquid by-product hydrocarbons should be less than 15% wt., preferably less than 5% wt. and more preferably less than 3% wt. of the overall process mass balance.

The Product HMFO (24) resulting from the core process is discharged via fluid communication into storage tanks beyond the battery limits of the immediate process. The Product HMFO complies with ISO8217:2017 Table 2 as a residual marine fuel and has a maximum sulfur content (ISO 14596 or ISO 8754) of 0.5 Wt % and preferably a sulfur content between the range of 0.05 mass % to 0.5 mass % and more preferably a sulfur content (ISO 14596 or ISO 8754) between the range of 0.1 mass % and 0.5 mass %. The vanadium content of the Product HMFO is also compliant with ISO 8217:2017 Table 2 as a residual marine fuel with a maximum vanadium content (ISO 14597) between the range from 350 mg/kg to 450 ppm mg/kg, preferably a vanadium content (ISO 14597) between the range of 200 mg/kg and 300 mg/kg and more preferably a vanadium content (ISO 14597) between the range of 50 mg/kg and 100 mg/kg.

The Product HFMO should have properties that are compliant with ISO 8217:2017 Table 2 as a residual marine fuel including those for the Environmental Contaminants. The Product HMFO should exhibit bulk properties of: a maximum of kinematic viscosity at 50° C. (ISO 3104) between the range from 180 mm$^2$/s to 700 mm$^2$/s; a maximum of density at 15° C. (ISO 3675) between the range of 991.0 kg/m$^3$ to 1010.0 kg/m$^3$; a CCAI value in the range of 780 to 870; a flash point (ISO 2719) no lower than 60.0° C.; a total sediment—aged (ISO 10307-2) of less than 0.10 mass %; a carbon residue—micro method (ISO 10370) lower than 20.00 mass %, and an aluminum plus silicon (ISO 10478) content of less than 60 mg/kg.

Relative the Feedstock HMFO, the Product HMFO will have a sulfur content (ISO 14596 or ISO 8754) between 1% and 20% of the maximum sulfur content of the Feedstock HMFO. That is the sulfur content of the Product will be reduced by about 80% or greater when compared to the Feedstock HMFO. Similarly, the vanadium content (ISO 14597) of the Product HMFO is between 1% and 20% of the maximum vanadium content of the Feedstock HMFO. One of skill in the art will appreciate that the above data indicates a substantial reduction in sulfur and vanadium content indicate a process having achieved a substantial reduction in the Environmental Contaminants from the Feedstock HMFO while maintaining the desirable properties of an ISO8217:2017 compliant HMFO.

As a side note, the residual gaseous component is a mixture of gases selected from the group consisting of: nitrogen, hydrogen, carbon dioxide, hydrogen sulfide, gaseous water, $C_1$-$C_5$ hydrocarbons. An amine scrubber will effectively remove the hydrogen sulfide content which can then be processed using technologies and processes well known to one of skill in the art. In one preferable illustrative embodiment, the hydrogen sulfide is converted into elemental sulfur using the well-known Claus process. An alternative embodiment utilizes a proprietary process for conversion of the Hydrogen sulfide to hydrosulfuric acid. Either way, the sulfur is removed from entering the environment prior to combusting the HMFO in a ships engine. The cleaned gas can be vented, flared or more preferably recycled back for use as Activating Gas.

The by-product hydrocarbon components are a mixture of hydrocarbons (wild naphtha) (naphtha—diesel) having a boiling point below 150° F. which can be directed to the motor fuel blending pool or sold over the fence to an adjoining refinery or even utilized to fire the heaters and combustion turbines to provide heat and power to the process. These by product hydrocarbons which are the result of hydrocracking reactions should be less than 10% wt., preferably less than 5% wt. and more preferably less than 2% wt. of the overall process mass balance.

Product HMFO The Product HFMO resulting from the disclosed illustrative processes is of merchantable quality for sale and use as a heavy marine fuel oil (also known as a residual marine fuel or heavy bunker fuel), that is a fuel that is stable and compatible with other marine fuels, specifically heavy (residual) marine fuels. The Product HMFO exhibits the physical properties required for the Product HMFO to be an ISO compliant (i.e. ISO8217:2017) Table 2 residual marine fuel. The Product HMFO should exhibit the bulk properties of: a maximum of kinematic viscosity at 50° C. (ISO 3104) between the range from 180 mm$^2$/s to 700 mm$^2$/s; a density at 15° C. (ISO 3675) between the range of 991.0 kg/m$^3$ to 1010.0 kg/m$^3$; a CCAI is in the range of 780 to 870; a flash point (ISO 2719) no lower than 60° C.; a total sediment—aged (ISO 10307-2) less than 0.10% wt.; a carbon residue—micro method (ISO 10370) less than 20.00% wt.; and an aluminum plus silicon (ISO 10478) content no more than of 60 mg/kg.

The Product HMFO has a sulfur content (ISO 14596 or ISO 8754) less than 0.5 wt % and preferably less than 0.1% wt. and complies with the IMO Annex VI (revised) requirements for a low sulfur and preferably an ultra-low sulfur HMFO. That is the sulfur content of the Product HMFO has been reduced by about 80% and preferably 90% or greater when compared to the Feedstock HMFO. Similarly, the vanadium content (ISO 14597) of the Product Heavy Marine Fuel Oil is less than 20% and more preferably less than 10% of the maximum vanadium content of the Feedstock Heavy Marine Fuel Oil. One of skill in the art will appreciate that a substantial reduction in sulfur and vanadium content of the Feedstock HMFO indicates a process having achieved a substantial reduction in the Environmental Contaminants from the Feedstock HMFO; of equal importance is this has been achieved while maintaining the desirable properties of an ISO8217:2017 compliant HMFO.

The Product HMFO not only complies with ISO8217: 2017 Table 2 as a residual marine fuel (and is merchantable as a residual marine fuel oil or bunker fuel), the Product HMFO has a maximum sulfur content (ISO 14596 or ISO 8754) between the range of 0.05% wt. ppm and 0.5% wt. preferably a sulfur content (ISO 14596 or ISO 8754) between the range of 0.05% wt. ppm and 0.5% wt. and more preferably a sulfur content (ISO 14596 or ISO 8754) between the range of 0.1% wt. and 0.5% wt. The vanadium content of the Product HMFO is well within the maximum vanadium content (ISO 14597) required for an ISO8217: 2017 Table 2 residual marine fuel oil exhibiting a vanadium content lower than 450 ppm mg/kg, preferably a vanadium content (ISO 14597) lower than 300 mg/kg and more preferably a vanadium content (ISO 14597) less than 50 mg/kg.

One knowledgeable in the art of marine fuel blending, bunker fuel formulations and the fuel requirements for marine shipping fuels will readily appreciate that without further compositional changes or blending, the Product HMFO can be sold and used as a low sulfur MARPOL Annex VI compliant heavy (residual) marine fuel oil that is a direct substitute for the high sulfur heavy (residual) marine fuel oil or heavy bunker fuel currently in use. One illustrative embodiment is an ISO8217:2017 Table 2 compliant low sulfur heavy marine fuel oil comprising (and preferably consisting essentially of) a hydroprocessed ISO8217:2017 Table 2 compliant high sulfur heavy marine fuel oil, wherein the sulfur levels of the ISO8217:2017 Table 2 compliant high sulfur heavy marine fuel oil prior to being subjected to hydroprocessing is greater than 0.5% wt., and wherein the sulfur levels of the ISO8217:2017 Table 2 compliant low sulfur heavy marine fuel oil (i.e. the Product HMFO) is less than 0.5% wt. Another illustrative embodiment is an ISO8217:2017 compliant ultra-low sulfur heavy marine fuel oil comprising (and preferably consisting essentially of) a hydroprocessed ISO8217:2017 Table 2 compliant high sulfur heavy marine fuel oil, wherein the sulfur levels of the ISO8217:2017 Table 2 compliant high sulfur heavy marine fuel oil is greater than 0.5% wt. and wherein the sulfur levels of the ISO8217:2017 Table 2 compliant low sulfur heavy marine fuel oil (i.e. the Product HMFO) is less than 0.1% wt.

Because of the present invention, multiple economic and logistical benefits to the bunkering and marine shipping industries can be realized. The benefits include minimal changes to the existing heavy marine fuel bunkering infrastructure (storage and transferring systems); minimal changes to shipboard systems are needed to comply with emissions requirements of MARPOL Annex VI (revised); no additional training or certifications for crew members will be needed, amongst the realizable benefits. Refiners will also realize multiple economic and logistical benefits, including: no need to alter or rebalance the refinery operations, crude sources, and product streams to meet a new market demand for low sulfur or ultralow sulfur HMFO; no additional units are needed in the refinery with additional hydrogen or sulfur capacity because the illustrative process can be conducted as a stand-alone unit; refinery operations can remain focused on those products that create the greatest value from the crude oil received (i.e. production of petrochemicals, gasoline and distillate (diesel); refiners can continue using the existing slates of crude oils without having to switch to sweeter or lighter crudes to meet the environmental requirements for HMFO products.

Heavy Marine Fuel Composition One aspect of the present inventive concept is a fuel composition comprising, but preferably consisting essentially of, the Product HMFO resulting from the processes disclosed, and may optionally include Diluent Materials. The Product HMFO itself complies with ISO8217:2017 Table 2 as a residual marine fuel and meets the global IMO Annex VI requirements for maximum sulfur content (ISO 14596 or ISO 8754). If ultra-low levels of sulfur are desired, the process of the present invention achieves this without the need for blending but one of skill in the art of marine fuel blending will appreciate that a low sulfur or ultra-low sulfur Product HMFO can be utilized as a primary blending stock to form a global IMO Annex VI compliant low sulfur Heavy Marine Fuel Composition. Such a low sulfur Heavy Marine Fuel Composition will comprise (and preferably consist essentially of): a) the Product HMFO and b) Diluent Materials. In one embodiment, the majority of the volume of the Heavy Marine Fuel Composition is the Product HMFO with the balance of materials being Diluent Materials. Preferably, the Heavy Maine Fuel Composition is at least 75% by volume, preferably at least 80% by volume, more preferably at least 90% by volume, and furthermore preferably at least 95% by volume Product HMFO with the balance being Diluent Materials.

Diluent Materials may be hydrocarbon or non-hydrocarbon based materials mixed into or combined with or added to, or solid particle materials suspended in, the Product HMFO. The Diluent Materials may intentionally or unintentionally alter the composition of the Product HMFO but not so the resulting mixture violates the ISO8217:2017 Table 2 standards for residual marine fuels or fails to have a sulfur content lower than the global MARPOL standard of 0.5% wt. sulfur (ISO 14596 or ISO 8754). Examples of Diluent Materials considered hydrocarbon based materials include: Feedstock HMFO (i.e. high sulfur HMFO); distillate based fuels such as road diesel, gas oil, MGO or MDO; cutter oil (which is used in formulating residual marine fuel oils); renewable oils and fuels such as biodiesel, methanol, ethanol, and the like; synthetic hydrocarbons and oils based on gas to liquids technology such as Fischer-Tropsch derived oils, synthetic oils such as those based on polyethylene, polypropylene, dimer, trimer and poly butylene; refinery residues or other hydrocarbon oils such as atmospheric residue, vacuum residue, fluid catalytic cracker (FCC) slurry oil, FCC cycle oil, pyrolysis gasoil, cracked light gas oil (CLGO), cracked heavy gas oil (CHGO), light cycle oil (LCO), heavy cycle oil (HCO), thermally cracked residue, coker heavy distillate, bitumen, de-asphalted heavy oil, visbreaker residue, slop oils, asphaltinic oils; used or recycled motor oils; lube oil aromatic extracts and crude oils such as heavy crude oil, distressed crude oils and similar materials that might otherwise be sent to a hydrocracker or diverted into the blending pool for a prior art high sulfur heavy (residual) marine fuel oil. Examples of Diluent Materials considered non-hydrocarbon based materials include: residual water (i.e. water absorbed from the humidity in the air or water that is miscible or solubilized, sometimes as microemulsions, into the hydrocarbons of the Product HMFO), fuel additives which can include, but are not limited to detergents, viscosity modifiers, pour point depressants, lubricity modifiers, de-hazers (e.g. alkoxylated phenol formaldehyde polymers), antifoaming agents (e.g. polyether modified polysiloxanes); ignition improvers; anti rust agents (e.g. succinic acid ester derivatives); corrosion inhibitors; anti-wear additives, anti-oxidants (e.g. phenolic compounds and derivatives), coating agents and surface modifiers, metal deactivators, static dissipating agents, ionic and nonionic surfactants, stabilizers, cosmetic colorants and odorants and mixtures of these. A third group of Diluent Materials may include suspended solids or fine particulate materials that are present because of the handling, storage and transport of the Product HMFO or the Heavy Marine Fuel Composition, including but not limited to: carbon or hydrocarbon solids (e.g. coke, graphitic solids, or micro-agglomerated asphaltenes), iron rust and other oxidative corrosion solids, fine bulk metal particles, paint or surface coating particles, plastic or polymeric or elastomer or rubber particles (e.g. resulting from the degradation of gaskets, valve parts, etc. . . . ), catalyst fines, ceramic or mineral particles, sand, clay, and other earthen particles, bacteria and other biologically generated solids, and mixtures of these that may be present as suspended particles, but otherwise don't detract from the merchantable quality of the Heavy Marine Fuel Composition as an ISO8217:2017 compliant heavy (residual) marine fuel.

The heavy Marine Fuel Oil Composition must be of merchantable quality as a low sulfur heavy (residual) marine fuel. That is the blend must be suitable for the intended use as heavy marine bunker fuel and generally be fungible, (i.e. blendable and compatible) with other residual marine fuels used as a bunker fuel for ocean going ships. Preferably the Heavy Marine Fuel Composition must retain the bulk physical properties required of an ISO8217:2017 Table 2 compliant residual marine fuel and a sulfur content lower than the global MARPOL standard of 0.5% wt. sulfur (ISO 14596 or ISO 8754) so that the material qualifies as MARPOL Annex VI Low Sulfur Heavy Marine Fuel Oil (LS-HMFO). The sulfur content of the Product HMFO can be much lower than 0.5% wt. (i.e. below 0.1% wt sulfur (ISO 14596 or ISO 8754)) to qualify as a MARPOL Annex VI compliant Ultra-Low Sulfur Heavy Marine Fuel Oil (ULS-HMFO) and a Heavy Marine Fuel Composition likewise can be formulated to qualify as a MARPOL Annex VI compliant ULS-HMFO suitable for use as marine bunker fuel in the ECA zones. To qualify as an ISO8217:2017 Table 2 residual marine fuel, the Heavy Marine Fuel Composition of the present invention must meet those internationally accepted standards. The properties of the Heavy Marine Fuel Composition should include: a maximum of kinematic viscosity at 50° C. (ISO 3104) between the range from 180 mm$^2$/s to 700 mm$^2$/s; a density at 15° C. (ISO 3675) between the range of 991.0 kg/m$^3$ to 1010.0 kg/m$^3$; a CCAI is in the range of 780 to 870; a flash point (ISO 2719) no lower than 60° C.; a total sediment—aged (ISO 10307-2) less than 0.10% wt.; and a carbon residue—micro method (ISO 10370) less than 20% wt., and an aluminum plus silicon (ISO 10478) content no more than of 60 mg/kg.

Figure 2:
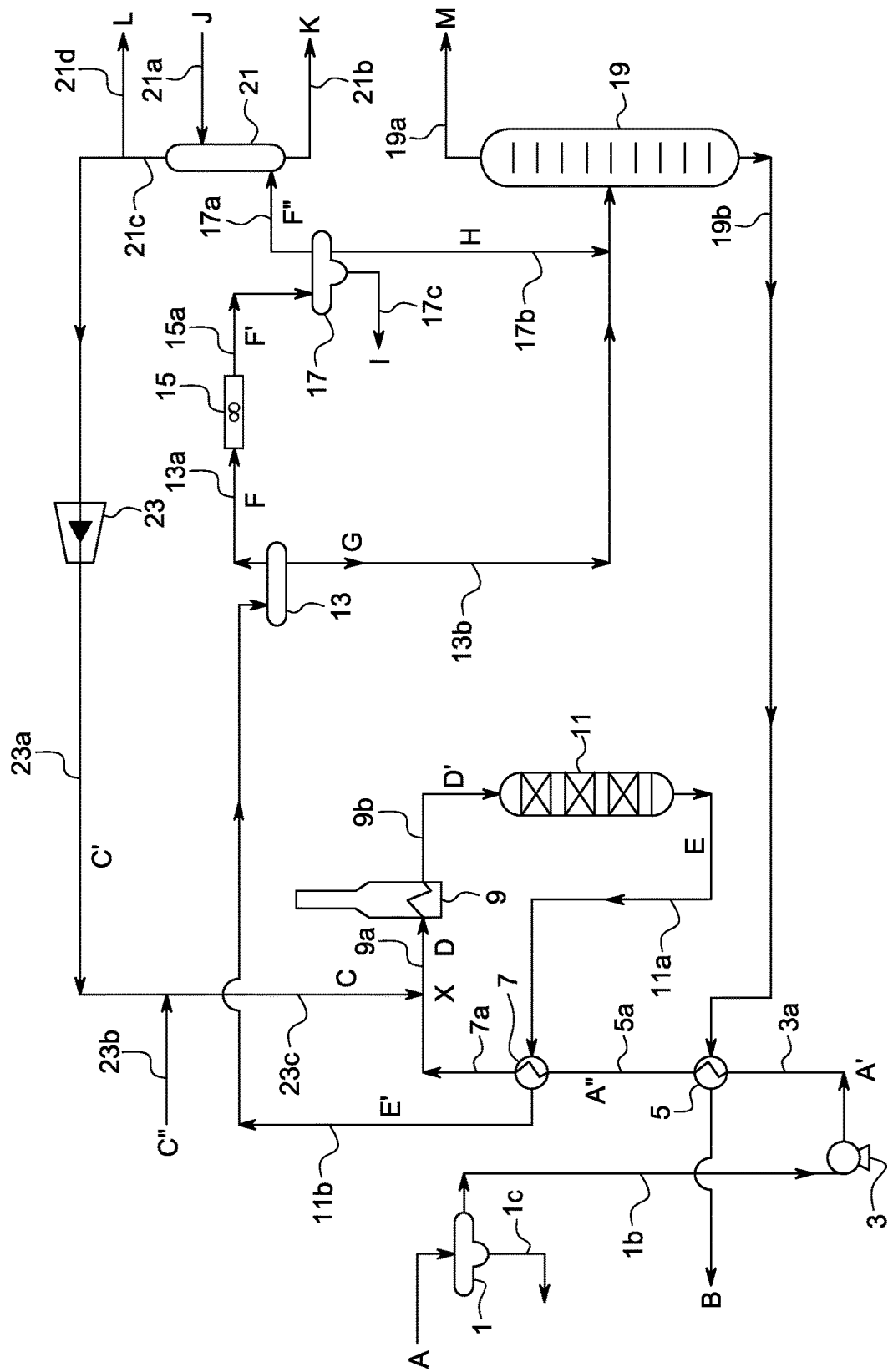
FIG. 2 is a process flow diagram of a multistage process for transforming the Feedstock HMFO and a subsequent core process to produce Product HMFO.
Figure 3:
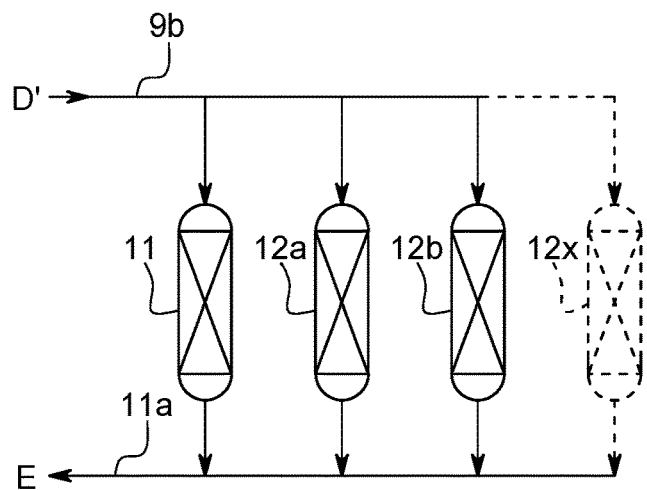
FIG. 3 is a process flow diagram of a first alternative configuration for the Reactor System (11) in FIG. 2.

Production Plant Description Production Plant Description: Turning now to a more detailed illustrative embodiment of a production plant, FIG. 2 shows a schematic for a production plant implementing the process described above for reducing the Environmental Contaminants in a Feedstock HMFO to produce a Product HMFO according to the second illustrative embodiment. One of skill in the art will appreciate that FIG. 2 is a generalized schematic drawing, and the exact layout and configuration of a plant will depend upon factors such as location, production capacity, environmental conditions (i.e. wind load, etc.) and other factors and elements that a skilled detailed engineering firm can provide. Such variations are contemplated and within the scope of the present disclosure.

In FIG. 2, Feedstock HMFO (A) is fed from outside the battery limits (OSBL) to the Oil Feed Surge Drum (1) that receives feed from outside the battery limits (OSBL) and provides surge volume adequate to ensure smooth operation of the unit. Water entrained in the feed and bulk solids (sand, rust particles, etc.) are removed from the HMFO with the water and bulk solids being discharged a stream (1c) for treatment OSBL.

The Feedstock HMFO (A) is withdrawn from the Oil Feed Surge Drum (1) via line (1b) by the Oil Feed Pump (3) and is pressurized to a pressure required for the process. The pressurized HMFO (A') then passes through line (3a) to the Oil Feed/Product Heat Exchanger (5) where the pressurized HMFO Feed (A') is partially heated by the Product HMFO (B). The pressurized Feedstock HMFO (A') passing through line (5a) is further heated against the effluent from the Reactor System (E) in the Reactor Feed/Effluent Heat Exchanger (7).

The heated and pressurized Feedstock HMFO (A") in line (7a) is then mixed with Activating Gas (C) provided via line (23c) at Mixing Point (X) to form a Feedstock Mixture (D). The mixing point (X) can be any well know gas/liquid mixing system or entrainment mechanism well known to one skilled in the art.

The Feedstock Mixture (D) passes through line (9a) to the Reactor Feed Furnace (9) where the Feedstock Mixture (D) is heated to the specified process temperature. The Reactor Feed Furnace (9) may be a fired heater furnace or any other kind to type of heater as known to one of skill in the art if it will raise the temperature of the Feedstock Mixture (D) to the desired temperature for the process conditions.

Although not shown, it is contemplated that the above-described mixing and heating steps can be interchanged such that the Feedstock HMFO is first heated and then mixed with the Activating Gas. In such an embodiment, that mixing may take place immediately prior to, concurrently with or immediately after injection of the hydrocarbon feed into the Reactor System.

Returning to the Figure, the fully Heated Feedstock Mixture (D') exits the Reactor Feed Furnace (9) via line 9b and is fed into the Reactor System (11). The fully heated Feedstock Mixture (D') enters the Reactor System (11) where Environmental Contaminants, such a sulfur, nitrogen, and metals are preferentially removed from the Feedstock HMFO component of the fully heated Feedstock Mixture. The Reactor System contains a catalyst which preferentially removes the sulfur compounds in the Feedstock HMFO component by reacting them with hydrogen in the Activating Gas to form hydrogen sulfide. In addition to the hydrodesulfurization, the Reactor System will also achieve demetallization, denitrogenation, and a certain amount of ring opening hydrogenation of the complex aromatics and asphaltenes, however minimal amount of hydrocracking of hydrocarbons should take place. The process conditions of hydrogen partial pressure, reaction pressure, temperature and residence time as measured liquid hourly velocity are optimized to achieve desired final product quality. A more detailed discussion of the Reactor System, the catalyst, the process conditions, and other aspects of the process are contained below in the "Reactor System Description."

The Reactor System Effluent (E) exits the Reactor System (11) via line (11a) and exchanges heat against the pressurized and partially heats the Feedstock HMFO (A') in the Reactor Feed/Effluent Exchanger (7). The partially cooled Reactor System Effluent (E') then flows via line (11c) to the Hot Separator (13).

The Hot Separator (13) separates the gaseous components of the Reactor System Effluent (F) which are directed to line (13a) from the liquid components of the Reactor System effluent (G) which are directed to line (13b). The gaseous components of the Reactor System effluent in line (13a) are cooled against air in the Hot Separator Vapor Air Cooler (15) and then flow via line (15a) to the Cold Separator (17).

The Cold Separator (17) further separates any remaining gaseous components from the liquid components in the cooled gaseous components of the Reactor System Effluent (F'). The gaseous components from the Cold Separator (F") are directed to line (17a) and fed onto the Amine Absorber (21). The Cold Separator (17) also separates any remaining Cold Separator hydrocarbon liquids (H) in line (17b) from any Cold Separator condensed liquid water (I). The Cold Separator condensed liquid water (I) is sent OSBL via line (17c) for treatment.

The hydrocarbon liquid components of the Reactor System effluent from the Hot Separator (G) in line (13b) and the Cold Separator hydrocarbon liquids (H) in line (17b) are combined and are fed to the Oil Product Stripper System (19). The Oil Product Stripper System (19) removes any residual hydrogen and hydrogen sulfide as well as separating the by-product hydrocarbons (i.e. hydrocarbons having a boiling point less than 150 F) from the Product HMFO (B) which is discharged in line (19b) to storage OSBL. It is also contemplated that a second draw (not shown) may be included to withdraw a distillate product, preferably a middle to heavy distillate, this may be done to control the viscosity and density (and thus the CCAI) of the Product HMFO. The vent stream (M) from the Oil Product Stripper in line (19a) may be sent to the fuel gas system or to the flare system that are OSBL. A further discussion of the Oil Product Stripper System is contained in the "Oil Product Stripper System Description."

The gaseous components from the Cold Separator (F") in line (17a) contain a mixture of hydrogen, hydrogen sulfide and light hydrocarbons (mostly methane and ethane). This vapor stream (17a) feeds an Amine Absorber System (21) where it is contacted against Lean Amine (J) provided OSBL via line (21a) to the Amine Absorber System (21) to remove hydrogen sulfide from the gases making up the Activating Gas recycle stream (C'). Rich amine (K) which has absorbed hydrogen sulfide exits the bottom of the Amine Absorber System (21) and is sent OSBL via line (21b) for amine regeneration and sulfur recovery.

The Amine Absorber System overhead vapor in line (21c) is preferably recycled to the process as a Recycle Activating Gas (C') via the Recycle Compressor (23) and line (23 a) where it is mixed with the Makeup Activating Gas (C") provided OSBL by line (23b). This mixture of Recycle Activating Gas (C') and Makeup Activating Gas (C") to form the Activating Gas (C) utilized in the process via line (23c) as noted above. A Scrubbed Purge Gas stream (H) is taken from the Amine Absorber System overhead vapor line (21c) and sent via line (21d) to OSBL to prevent the buildup of light hydrocarbons or other non-condensable hydrocarbons. A more detailed discussion of the Amine Absorber System is contained in the "Amine Absorber System Description."

Reactor System Description: The core process Reactor System (11) illustrated in FIG. 2 comprises a single reactor vessel loaded with the process catalyst and sufficient controls, valves and sensors as one of skill in the art would readily appreciate. Variations using multiple vessels/reactors are contemplated by the present invention but are not illustrated in greater detail for simplicity's sake. One of skill in the art will appreciate that the reactor vessel itself must be engineered to withstand the pressures, temperatures and other conditions (i.e. presence of hydrogen and hydrogen sulfide) of the process. Using special alloys of stainless steel and other materials typical of such a unit are within the skill of one in the art and well known. As illustrated, one or more beds in the reactor vessel may be a structured catalyst bed or a fixed dense packed catalyst bed or combinations of these. A Reactor System containing at least one reactor vessel with at least one structured catalyst bed is preferred as these are easier to operate and maintain, however other reactor types are also within the scope of the invention and a Reactor System having multiple reaction vessels one or more of which may be under reactive distillation conditions is contemplated.

A description of the process catalyst, the selection of the process catalyst and the loading and grading of the catalyst within the reactor vessel is contained in the "Catalyst in Reactor System".

Alternative configurations for the core process Reactor System (11) are contemplated. In one illustrative configuration, more than one reactor vessel may be utilized in parallel as shown in FIG. 4 to replace the core process Reactor System (11) illustrated in FIG. 2.

Figure 4:
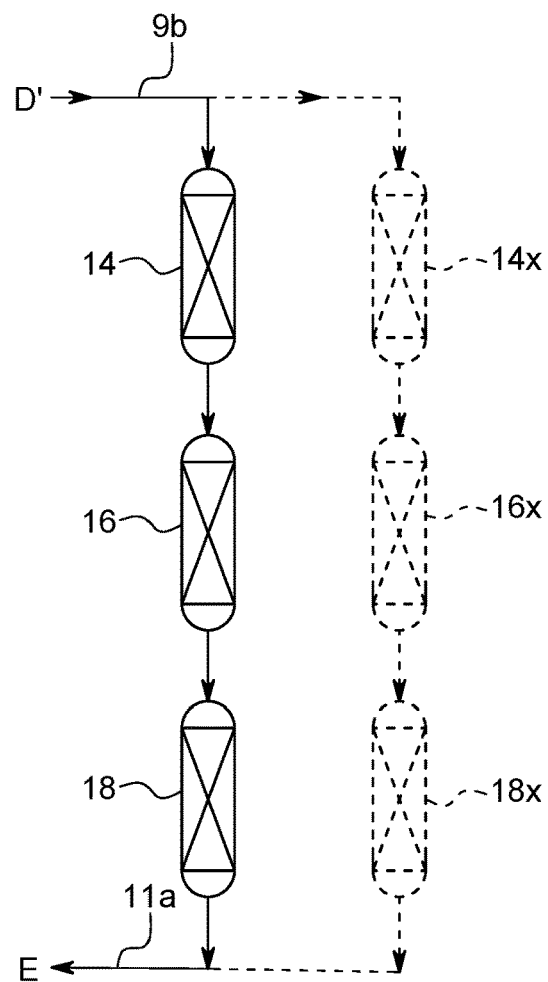
FIG. 4 is a process flow diagram of a second alternative

In the embodiment in FIG. 4, each reactor vessel is loaded with process catalyst in a similar manner and each reactor vessel in the Reactor System is provided the heated Feed Mixture (D') via a common line 9b. The effluent from each reactor vessel in the Reactor System is recombined and forms a combined Reactor Effluent (E) for further processing as described above via line 11a. The illustrated arrangement will allow the three reactors to carry out the process effectively multiplying the hydraulic capacity of the overall Reactor System. Control valves and isolation valves may also prevent feed from entering one reactor vessel but not another reactor vessel. In this way one reactor can be by-passed and placed off-line for maintenance and reloading of catalyst while the remaining reactors continues to receive heated Feedstock Mixture (D'). It will be appreciated by one of skill in the art this arrangement of reactor vessels in parallel is not limited in number to three, but multiple additional reactor vessels can be added as shown by dashed line reactor. The only limitation to the number of parallel reactor vessels is plot spacing and the ability to provide heated Feedstock Mixture (D') to each active reactor.

Figure 5:
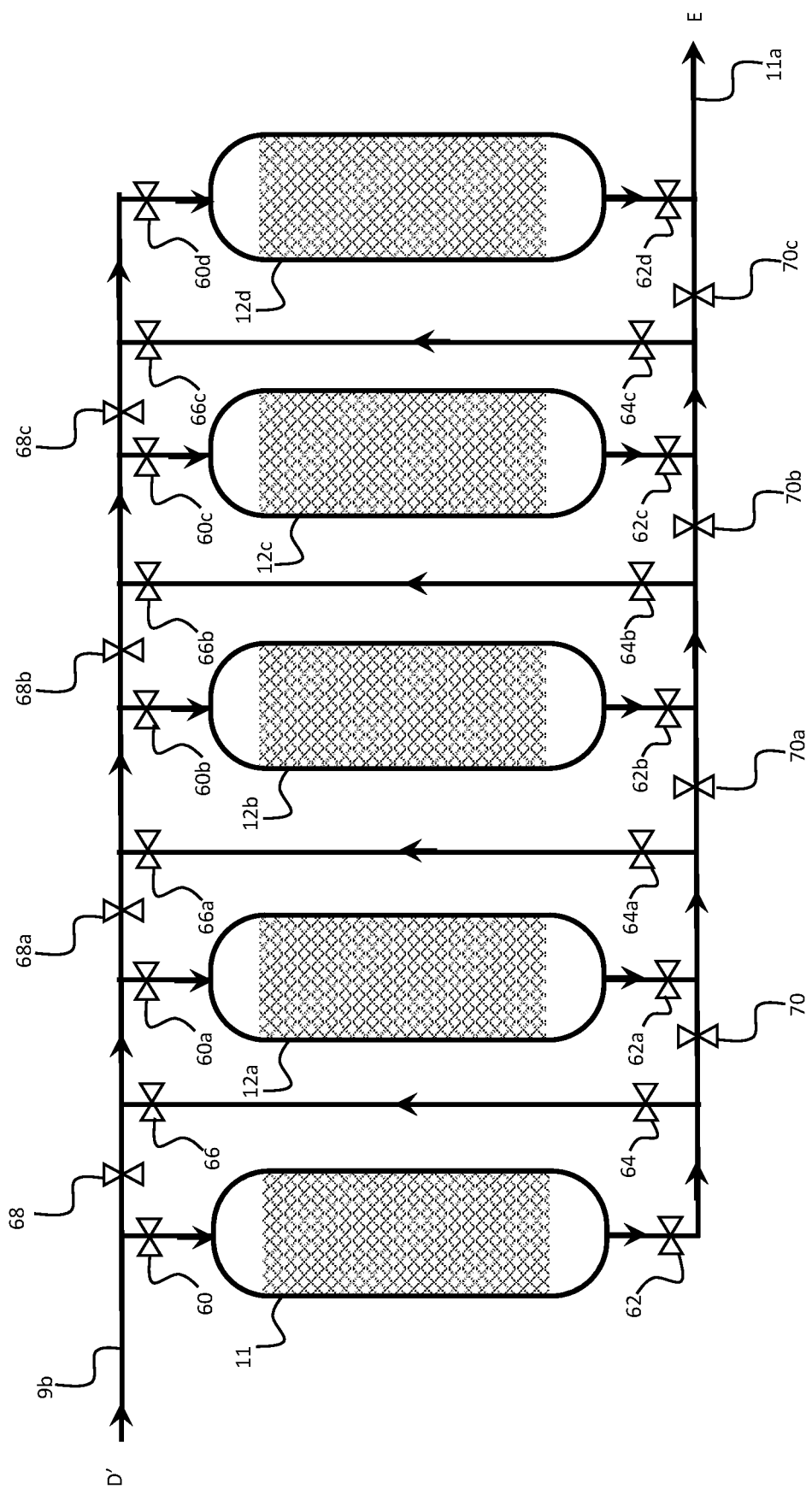
FIG. 5 is a process flow diagram of as multi-reactor matrix configuration for the Reactor System (11) in FIG. 2.

A cascading series in FIG. 5 can also be substituted for the single reactor vessel Reactor System 11 in FIG. 2. The cascading reactor vessels are loaded with process catalyst with the same or different activities toward metals, sulfur or other Environmental Contaminants to be removed. For example, one reactor may be loaded with a highly active demetallization catalyst, a second subsequent or downstream reactor may be loaded with a balanced demetallization/desulfurizing catalyst, and reactor downstream from the second reactor may be loaded with a highly active desulfurization catalyst. This allows for greater control and balance in process conditions (temperature, pressure, space flow velocity, etc. . . . ) so it is tailored for each catalyst. In this way one can optimize the parameters in each reactor depending upon the material being fed to that specific reactor/catalyst combination and minimize the hydrocracking reactions.

An alternative implementation of the parallel reactor concept is illustrated in greater detail in FIG. 5. Heated Feed Mixture (D') is provided to the reactor System via line 9b and is distributed amongst multiple reactor vessels (11, 12a, 12b, 12c and 12d). Flow of heated Feedstock to each reactor vessel is controlled by reactor inlet valves (60, 60a, 60b, 60c, and 60d) associated with each reactor vessel respectively. Reactor Effluent (E) from each reactor vessel is controlled by a reactor outlet valve (62, 62a, 62b, 62c and 62d) respectively. Line 9b has multiple inflow diversion control valves (68, 68a, 68b and 68c), the function and role of which will be described below. Line 11a connects the outlet of each reactor, and like Line 9b has multiple outflow diversion control valves (70, 70a, 70b and 70c) the function and role of which will be described below. Also shown is a by-pass line defined by lower by-pass control valve (64 64a, 64b, 64c) and upper by-pass control valve (66, 66a, 66b and 66c), between line 9b and line 11a the function and purpose of which will be described below. One of skill in the art will appreciate that control over the multiple valves and flow can be achieved using a computerized control system/distributed control system (DCS) or programmable logic controllers (PLC) programmed to work with automatic motorized valve controls, position sensors, flow meters, thermocouples, etc. . . . . These systems are commercially available from vendors such as Honeywell International, Schneider Electric; and ABB. Such control systems will include lock-outs and other process safety control systems to prevent opening of valves in manner either not productive or unsafe.

One of skill in the art upon careful review of the illustrated configuration will appreciate that multiple flow schemes and configurations can be achieved with the illustrated arrangement of reactor vessels, control valves and interconnected lines forming the reactor System. For example, in one configuration one can: open all of inflow diversion control valves (68, 68a, 68b and 68c); open the reactor inlet valves (60, 60a, 60b, 60c, and 60d); open the reactor outlet valves 62, 62a, 62b, 62c and 62d; open the outflow diversion control valves (70, 70a, 70b and 70c); and close lower by-pass control valve (64 64a, 64b, 64c) and upper by-pass control valve (66, 66a, 66b and 66c), to substantially achieve a reactor configuration of five parallel reactors each receiving heated Feed Mixture (D') from line 9b and discharging Reactor Effluent (E) into line 11a. In such a configuration, the reactors are loaded with catalyst in substantially the same manner. One of skill in the art will also appreciate that closing of an individual reactor inlet valve and corresponding reactor outlet valve (for example closing reactor inlet valve 60 and closing reactor outlet valve 62) effectively isolates the reactor vessel 11. This will allow for the isolated reactor vessel 11 to be brought off line and serviced and or reloaded with catalyst while the remaining reactors continue to transform Feedstock HMFO into Product HMFO.

A second illustrative configuration of the control valves allows for the reactors to work in series as shown in FIG. 4 by using the by-pass lines. In such an illustrative embodiment, inflow diversion control valve 68 is closed and reactor inlet valve 60 is open. Reactor 11 is loaded with demetallization catalyst and the effluent from the reactor exits via open outlet control valve 62. Closing outflow diversion control valve 70, the opening of lower by-pass control valve 64 and upper by-pass control valve 66, the opening of reactor inlet valve 60a and closing of inflow diversion control valve 68a re-routes the effluent from reactor 11 to become the feed for reactor 12a. reactor 12a may be loaded with additional demetallization catalyst, or a transition catalyst loading or a desulfurization catalyst loading. One of skill in the art will quickly realize and appreciate this configuration can be extended to the other reactors 12b, 12c and 12d allowing for a wide range of flow configurations and flow patterns through the Reactor Section. As noted, an advantage of this illustrative embodiment of the Reactor Section is that it allows for any one reactor to be taken off-line, serviced and brought back on line without disrupting the transformation of Feedstock HMFO to Product HMFO. It will also allow a plant to adjust the configuration so that as the composition of the Feedstock HMFO changes, the reactor configuration (number of stages) and catalyst types can be adjusted. For example a high metal containing Feedstock HMFO, such as a Ural residual based HMFO, may require two or three reactors (i.e. reactors 11, 12a and 12b) loaded with demetallization catalyst and working in series while reactor 12c is loaded with transition catalyst and reactor 12d is loaded with desulfurization catalyst. Many permutations and variations can be achieved by opening and closing control valves as needed and adjusting the catalyst loadings in each of the reactor vessels by one of skill in the art and only for brevity need not be described. One of skill in the art will appreciate that control over the multiple valves and flow can be achieved using a computerized control system/distributed control system (DCS) or programmable logic controllers (PLC) programmed to work with automatic motorized valve controls, position sensors, flow meters, thermocouples, etc. . . . . These systems are commercially available from vendors such as Honeywell International, Schneider Electric; and ABB. Such control systems will include lock-outs and other process safety control systems to prevent opening of valves in manner either not productive or unsafe.

Figure 6:
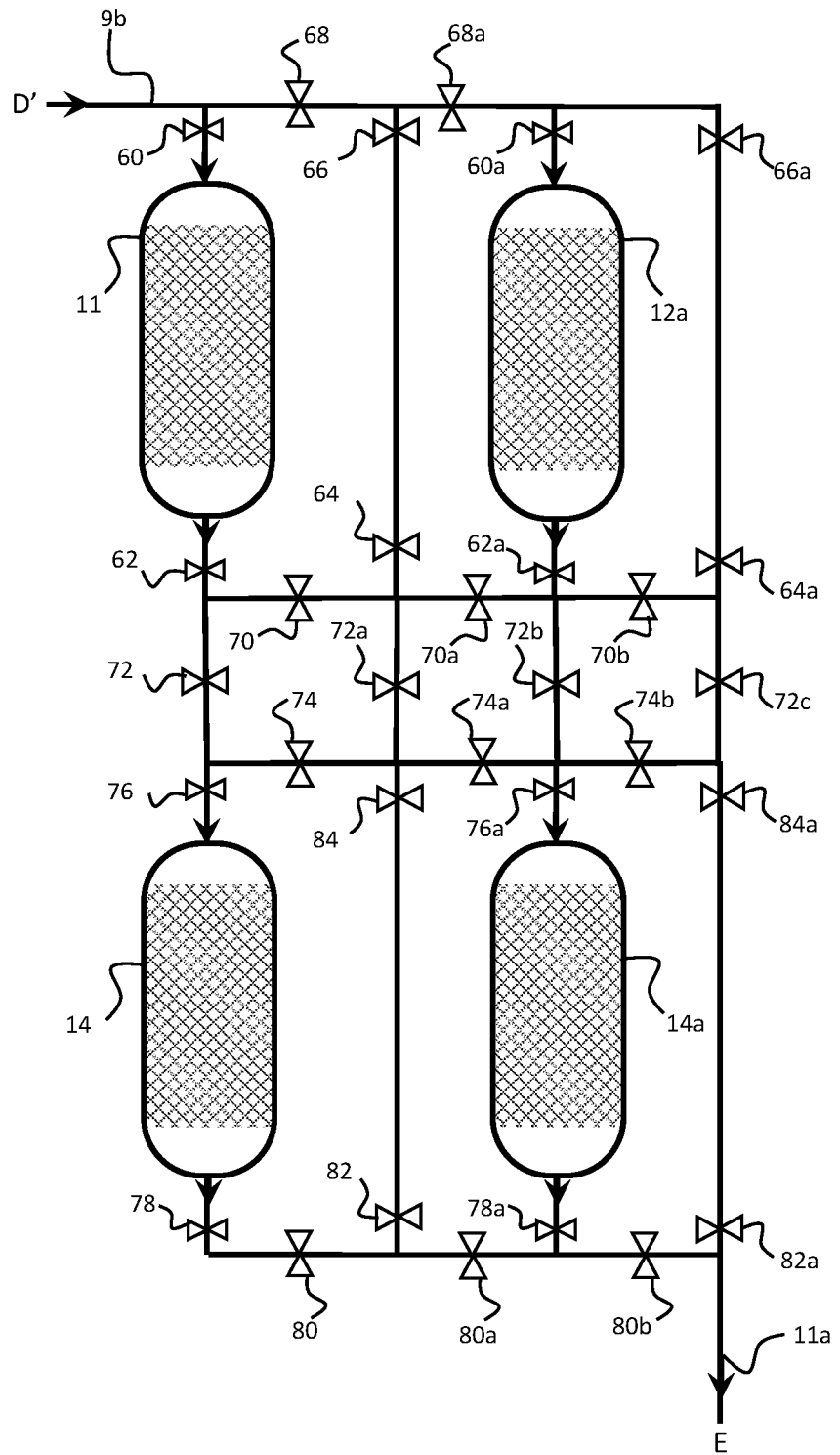
FIG. 6 is a process flow diagram of as multi-reactor matrix configuration for the Reactor System (11) in FIG. 2.

Another illustrative embodiment of the replacement of the single reactor vessel Reactor System 11 in FIG. 2 is a matrix of reactors composed of interconnected reactors in parallel and in series. A simple 2×2 matrix arrangement of reactors with associated control valves and piping is shown in FIG. 6, however a wide variety of matrix configurations such as 2×3; 3×3, etc. . . . are contemplated and within the scope of the present invention. As depicted in FIG. 6, a 2 reactor by 2 reactor (2×2) matrix of comprises four reactor vessels (11, 12a, 14 and 14b) each with reactor inlet control valves (60, 60a, 76, and 76a) and reactor outlet control valves (62, 62a, 78 and 78a) associated with each vessel. Horizontal flow control valves (68, 68a, 70, 70a, 70b, 74, 74a, 74b, 80, 80a, and 80b) regulate the flow across the matrix from heated Feedstock (D') in line 9b to discharging Reactor Effluent (E) into line 11a. Vertical flow control valves (64, 64a, 66, 66a, 72, 72a, 72b, 72c, 82, 82a, 84, and 84b) control the flow through the matrix from line 9b to line 11a. One of skill in the art will appreciate that control over the multiple valves and flow can be achieved using a computerized control system/distributed control system (DCS) or programmable logic controllers (PLC) programmed to work with automatic motorized valve controls, position sensors, flow meters, thermocouples, etc. . . . . These systems are commercially available from vendors such as Honeywell International, Schneider Electric; and ABB. Such control systems will include lock-outs and other process safety control systems to prevent opening of valves in manner either not productive or unsafe.

One of skill in the art will quickly realize and appreciate that by opening and closing the valves and varying the catalyst loads present in each reactor, many configurations may be achieved. One such configuration would be to open valves numbered: 60, 62, 72, 76, 78, 80, 82, 84, 72a, 64, 66, 68a, 60a, 62a, 72b, 76a, 78a, and 80b, with all other valves closed so the flow for heated Feed Mixture (D') will pass through reactors 11, 14, 12a and 14a in series. Another such configuration would be to open valves numbered: 60, 62, 70, 64, 66, 68a, 60a, 62a, 72b, 76a, 78a, and 80b, with all other valves closed so the flow of heated Feed Mixture (D') will pass through reactors 11, 12a and 14a (but not 14). As with the prior example, the nature of the Feedstock HSFO and the catalyst loaded in each reactor may be optimized and adjusted to achieve the desired Product HSFO properties, however for brevity of disclose all such variations will be apparent to one of skill in the art.

One benefit of having a multi-reactor Reactor System is that it allows for a reactor experiencing decreased activity or plugging because of coke formation can be isolated and taken off line for turn-around (i.e. deactivated, catalyst and internals replaced, etc. . . . ) without the entire plant having to shut down. Another benefit as noted above is that it allows one to vary the catalyst loading in the Reactor System so the overall process can be optimized for a specific Feedstock HSFO. A further benefit is that one can design the piping, pumps, heaters/heat exchangers, etc. . . . to have excess capacity so that when an increase in capacity is desired, additional reactors can be quickly brought on-line. Conversely, it allows an operator to take capacity off line, or turn down a plant output without having a concern about turn down and minimum flow through a reactor. While the above matrix Reactor System is described referring to a fixed bed or packed bed trickle flow reactor, one of skill in the art will appreciate that other reactor types may be utilized. For example, one or more reactors may be configured to be ebulliated bed up flow reactors or three phase upflow bubble reactors, or counter-current reactors, or reactive distillation reactors the configuration of which will be known to one of skill in the art. It is anticipated that many other operational and logistical benefits will be realized by one of skill in the art from the Reactor Systems configurations disclosed.

Modular Reactor The Reactor System may be field constructed or modularized. A significant advantage of a modularized Reactor System will be the ability to change-out entire reactor vessels; as opposed to changing out or revamping the internals of a conventional fixed in place reactor. When the active reactor must be shut down for servicing (i.e. change catalyst, replace internals, etc. . . . ); the entire reactor (reactor vessel and internal components) may be changed out at rather than conventionally changing out catalyst beds and internals on-site. Changing out of the reactor vessels will dramatically decrease time plant down time by eliminating the on-site process of catalyst unloading, loading and conditioning, minimize field construction/change out activities, reduce safety risks and improve Plant operating efficiency.

Figure 7:
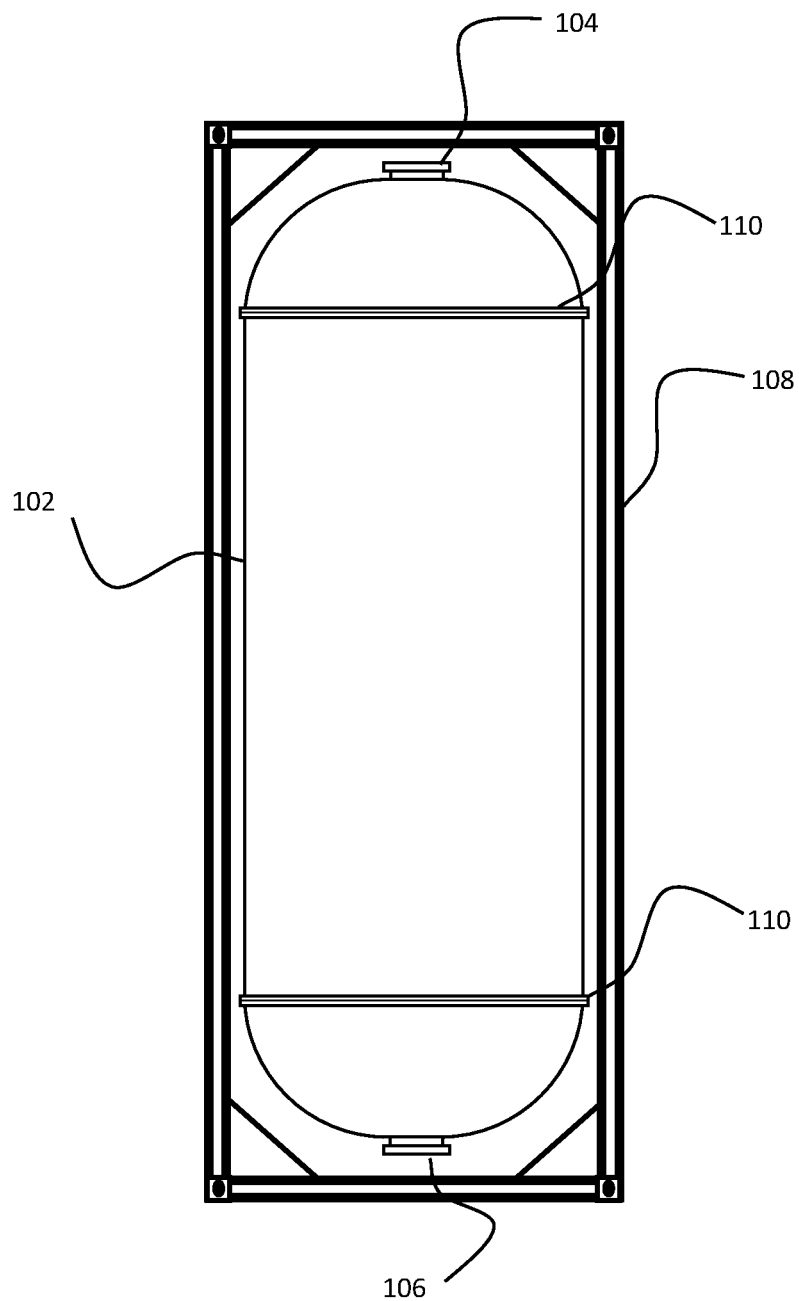
FIG. 7 illustrates the exterior of a modular reaction vessel useful in the multistage process for transforming Feedstock HMFO to Product HMFO.

As shown in FIG. 7, a modular Reactor System as contemplated by the present invention may comprise a continuous tubular reactor vessel 102 defined by an outer wall surrounding an internal space. One or more inlet flanges 104 and one or more outlet flanges 106 flange are in fluid communication with each other via the interior to the reactor vessel. The outer wall of the reactor vessel is sized so it will be contained within a standard ISO 20 ft container (i.e. 2.43 m×2.59 m×6.06 m) or a standard ISO 40 ft container (i.e. 2.43 m×2.59 m×12.2 m) framework structure 108. The outer wall of the reactor vessel will be supported and braced within the ISO container framework in a conventional manner known to one of skill in that art, but not shown in the drawing so the framework and reactor vessel can be lifted and transported via truck or heavy cargo vehicles. The one or more flanged inlets and outlets are sized and positioned to accommodate the corresponding feedstock provision piping and product outlet piping of the Plant. One or both of the reactor vessel head pieces can be flanged and removable using a suitably sized head flange 110. A removable reactor vessel head piece may be desirable because it may facilitate the loading and unloading of the internal structures, including but not limited to trays, perforated support plates, catalyst beds, structured catalyst beds, Raschig rings, Dixon rings, targeted absorbant materials such as sulfur absorbants or metal absorbants, and combinations of these, at a location away from the active plant (i.e. in a warehouse or other controlled environment). Modular Reactor Systems such as the one described above within an ISO 40 ft. container frame have been modeled in the process to have a name plate capacity between 1600 bpd and 2400 bpd of HSFO. When utilized in combinations together in a matrix of reactors (as disclosed herein) expansion of capacity become simply a matter of having pre-designed the supporting utilities (i.e. piping, pumps, controls, etc. to accommodate the addition of new reactors to the Plant. For example, a set of three rectors set in series, the first reactor containing HDM catalyst loading, the second reactor containing HDT catalyst loading and the third reactor containing HDS catalyst loading, is expected to have an overall throughput of approximately 2000 bpd. Doubling the capacity of the plant can be achieved by adding a second series of three reactors. In this way additional capacity can be quickly brought on-line or take off-line as needed.

To change out reactor vessels, the plant should be designed with a compliant safety zone around each modular reactor, so the plant can continue operations while the modular Reactor System to be replaced is brought out of service and replaced with a second Modular Reactor System. Within the processes of the present invention, the modular Reactor System to be changed out will be hydrocarbon freed, placed under nitrogen and passivated. Passivation may be by conventional means or it may be with a material that will harden at ambient conditions to allow for safely disconnecting and removal of the reactor vessel. A modular Reactor System filled with preconditioned catalyst will replace the removed reactor and conditioned and brought back on-line. Reactor vessel internals, decommissioned catalyst and the like in the replaced modular Reactor System can then be unloaded and recycled off-site or at a location more suitable for such activities. Replacement internals, thermal couple replacement, insulation material patching or replacement and other services can be performed, and catalyst materials can be loaded in the revamped modular Reactor System, under controlled conditions of temperature and humidity (and if necessary under nitrogen or other inert atmosphere) into the modular Reactor System prior to transport back to the Plant site. The refurbished modular Reactor System may be filled with a material that will harden at ambient conditions and melt when heated to secure and protect the catalyst and vessel internals during transportation, which is described below in greater detail. The encapsulation/solidification of the reactor internals will allow the modular Reactor System to be more easily transported via truck or rail and lifted into position and reconnected at the plant. It will be appreciated by those skilled in the art that the flanges must be sealed off with blind flange covers whenever the modular Reactor System is transported to and from the Plant or stored in reserve on-site. One of skill in the art will appreciate that disconnecting, removal, replacement and reconnecting a modular Reactor System may be facilitated by hydraulic lifts or platforms or frameworks designed to securely receive the modular Reactor System and then lift, reorient and appropriately align and reposition of the modular Reactor System to fit the piping within the Plant. It is within the scope of this invention to have a hydrotreating plant in which the primary hydrotreating reactors are removable and replaceable with a modular Reactor System such as that described herein.

Hydrotreatment catalysts utilized in the modular Reactor System generally comprise an amorphous or crystalline oxide support such as an alumina, a silica, a silica alumina, or a zeolite, on which at least one element from groups VIII and VI of the periodic table or a combination of a plurality of elements from these same groups is deposited, for example solids designated CoMo/Al$_2$O$_3$, NiMo/Al$_2$O$_3$ or NiW/Al$_2$O$_3$. They may be sulfided in advance to endow them with catalytic performances for hydrocarbon hydroconversion reactions, and in particular hydrotreatment such as hydrodesulfurization, and, demetallization) and certain hydrogenation reactions. This sulfurization step carried out prior to the catalytic step can be carried out in two manners. In situ sulfurization is characterized in that the catalyst in its oxide form is initially charged into the hydrocarbon conversion reactor for sulfurizing. Ex situ pre-sulfurization, as described in U.S. Pat. Nos. 4,719,195; 5,397,756; 7,582,587 incorporated by reference) pre-sulfurization of the catalyst is carried out in a location different from the location in which the catalyst operates. One of skill in the art will appreciate that the catalyst can be pre-sulfided and passivated ex situ prior to loading into the transportable reactor, or after it has been loaded to prevent self-heating which may lead to spontaneous combustion. The processes of pre-sulfiding and passivation have been described in the technical and patent literature, and are well known to one of skill in the art.

For this disclosure, the term "sulfided metal particles" refers to metal oxide particles converted to the sulfide form. Further, the term "metal (s)" includes metal oxide (s) in partially reduced form. The term "pre-sulfided catalyst (s)" refers to catalysts wherein part of the metals are in the oxide form, and part of the metals may have been converted to the sulfide form. Pre-sulfided catalysts typically contain additional sulfur compounds which facilitate the sulfiding of the remaining metal oxides during the startup process. The term "pre-sulfided catalyst (s)" refers to catalysts wherein the majority of the metal oxides have been converted to metal sulfides.

As part of the ex situ passivation and optional coating of a catalyst, the sulfided catalyst undergoes at least two treatments: controlled contact with at least one surface active oxidizing agent (also called the passivation step), followed (optionally) by contact with at least one coating agent with an initial melting point of over 100° C., which coats the surfaces of the catalyst (also called the coating step). The word "coating" or "coated" does not rule out some reaction leading to passivation of the catalyst surfaces.

The passivation step involves the controlled contacting of the pre-sulfided catalyst with a surface active oxidizing agent, such as oxygen and/or an oxygen-containing hydrocarbon having at least 12 carbon atoms, for a sufficient time so a sulfurized catalyst is made less spontaneously combustible.

When the first passivation step is a treatment in the presence of a gas (or gas stream) containing oxygen (for example deriving from dry or moist air) which can advantageously be carried out at ambient temperature. The reaction of oxygen adsorption onto the catalyst causes an exothermic effect preferably controlled so the temperature of the product remains below 50° C. One possibility is to control the partial pressures of oxygen admitted to the catalyst. Then, a preferred manner of carrying out the invention is to initially treat the catalyst with a gas at a partial pressure of less than 8 kPa of oxygen, and secondly with a gas at a partial pressure of over 8 kPa of oxygen. It is also possible to carry out the oxidizing passivation process directly with one or more gas streams having a partial pressure of oxygen of over 8 kPa. This first stage preferably ends when the exothermic effect has all but disappeared (i.e. when the temperature of the solid no longer increases or only increases slightly) or, if the operator has means for limiting the temperature increase, the second stage of coating can then be started earlier.

When using an oxygen containing hydrocarbon in the first passivation step, the contact temperature is greater than about 0° C. and typically will range from about 15° C. to about 350° C., preferably from about 20° C. to about 150° C. The contact temperature will vary depending on the melting point or sublimation temperature of the oxygen-containing hydrocarbon. For example, when the oxygen-containing hydrocarbon is a solid or a semi-solid such as lard, the oxygen-containing hydrocarbon process temperature should preferably be at least at a temperature of the melting point of the solid or semi-solid for a time sufficient for the catalyst to flow freely (appear "dry" and not stick or clump). In a specific example of lard as the oxygen-containing hydrocarbon, the lard is preferably contacted at a initial temperature of about 80° C. The process temperature for contacting the oxygen-containing hydrocarbon and catalyst can be readily determined by the melting point of the solid or semi-solid at a given pressure environment or visually by checking if the oxygen-containing hydrocarbon flows. Contact times will depend on temperature and the viscosity of the oxygen-containing hydrocarbon, higher temperatures requiring shorter times and higher viscosity requiring longer times. Times will range from about 2 minutes to about 2 hours, although longer contact times can also be used.

Preferably the oxygen-containing hydrocarbon is sufficiently flowable to give a sufficient contact with the catalyst. An oxygen-containing hydrocarbon which is liquid at the elevated temperature of contact is more preferred for ease of handling. It is preferred that the oxygen-containing hydrocarbon is a higher hydrocarbon, i.e., one having a carbon number greater than twelve, preferably greater than sixteen, more preferably greater than twenty. The upper carbon number of useful oxygen-containing hydrocarbon is determined by the melting point, solidification point, or smoke point of this oxygen-containing hydrocarbon. While solid fatty oxygen-containing hydrocarbon having carbon numbers greater than 100 can be used, they are inconvenient since they must be heated to such a high temperature to be converted into a liquid, although they can be used with a solvent to put them in liquid form. Oxygen-containing hydrocarbons with carbon numbers within the range from about 12 to about 100, preferably from about 16 to about 80 are found most useful.

The term "oxygen-containing hydrocarbon" refers to hydrocarbon molecules containing at least one oxygen atom, which includes, for example, acids, acid esters, alcohols, aldehydes, ketones and ethers. The oxygen-containing hydrocarbon may be mixtures such as acid esters and alcohols, different acid esters and the like. The oxygen-containing hydrocarbon can be primary, secondary or tertiary. The hydrocarbon moiety can be straight or branched chain carbon atom linkages, cyclic, acyclic or aromatic. The hydrocarbon moiety can further be saturated or unsaturated. Oxygen-containing hydrocarbons include, for example, higher alcohols having at least 12, preferably 16, more preferably 20 carbon atoms such as dodecanol, hexadecanol, farnesol, hexestrol, oleyl alcohol, cetyl alcohol, hexacosanol, triacontanol, cocceryl alcohol and octacosanol; higher ethers having at least 12, preferably 16, more preferably 20 carbon atoms such as dicetyl ether; higher ketones having at least 12 carbon atoms, preferably 16 carbon atoms, more preferably 20 carbon atoms such as palmitone, 10-hydroxypalmitone and 3-octadecanone; higher aldehydes having at least 12 carbon atoms, preferably 16, more preferably 20 carbon atoms such as palmitaldehyde and olealdehyde; higher acids having at least 12, preferably 16, more preferably 20 carbon atoms such as saturated acids such as lauric, myristic, palmitic, stearic, and docosanoic acids for example, or unsaturated higher acids such as palmitoleic, oleic, linoleic, linolenic, eleostearic, ricinoleic, eicosenoic, docosenoic, eicosatetraenoic, eicosapentaenoic, decosapentaenoic and docosahexaenoic; higher acid esters having at least 12, preferably 16, more preferably 20 carbon atoms including mono-, di-, tri- and poly-fatty acid esters including alkyl and aryl esters of the above acids (e.g. benzyl oleate and butyl oleate) and esters of the above acids with monoglyceride, di-glycerides and triglycerides and mixtures thereof. These glyceride fatty acid esters having from 16 to 100, more preferably 18 to 90, most preferably 20 to 80 carbon atoms are preferred. Some examples of commercial glyceride fatty acid esters include soybean oil, linseed oil, safflower oil, corn oil, sunflower oil, cottonseed oil, olive oil, tung oil, castor oil, rapeseed oil, tall oil, peanut oil, coconut oil, palm oil, canbra oil, perilla oil, lard, tallow, marine fat or oil such as fish fat or oil (e.g. herring and sardine), vegetable residues and mixtures thereof. Some examples of commercial higher alcohols includes alkanol mixtures such as NEODOL™ alcohols from Shell Chemical Company, including mixtures of $C_9$, $C_{10}$ and $C_{11}$ alkanols (NEODOL™ 91 Alcohol), mixtures of $C_{12}$ and $C_{13}$ alkanols (NEODOL™ 23 Alcohol), mixtures of $C_{12}$, $C_{13}$, $C_{14}$ and $C_{15}$ alkanols (NEODOL™ 25 Alcohol), and mixtures of $C_{14}$ and $C_{15}$ alkanols (NEODOL™ 45 Alcohol); the ALFOL™ Alcohols from Vista Chemical Company, including mixtures of $C_{10}$ and $C_{12}$ alkanols (ALFOL™ 1012 Alcohol), mixtures of $C_{12}$ and $C_{14}$ alkanols (ALFOL™ 1214 Alcohol), mixtures of $C_{16}$ and $C_{18}$ alkanols (ALFOL™ 1618 Alcohol) and mixtures of $C_{16}$, $C_{18}$, and $C_{20}$ alkanols (ALFOL™ 1620 Alcohol); the EPAL™ Alcohols from Ethyl Chemical Company, including mixtures of $C_{10}$ and $C_{12}$ alkanols (EPAL™ 1012 Alcohol), mixtures of $C_{12}$ and $C_{14}$ alkanols (EPAL™ 1214 Alcohol) and mixtures of $C_{14}$, $C_{16}$, and $C_{18}$ alkanols (EPAL™ 1418 Alcohol); and the TERGITOL-™ Alcohols from Union Carbide Corporation, including mixtures of $C_{12}$, $C_{13}$, $C_{14}$ and $C_{15}$ alkanols (TERGITOL-L™ 125 Alcohols). Suitable commercially available alkanols prepared by the reduction of naturally occurring fatty acid esters includes for example, the CO and TA products of Procter and Gamble Company and the TA alcohols of Ashland Oil Company. Higher oligomers and polymers of polyols such as alkylene glycols are also suitable as higher alcohols.

The optional coating treatment will involve the treatment of the passivated catalyst material with a long chain waxy hydrocarbon or polymer material to further protect the sulfided catalyst from deactivation. The coating agent should have a melting point no less than the maximum ambient air temperature (i.e. greater than about 60° C.) and more preferably will have a melting point of over 80° C. to facilitate transportation without premature melting. Waxy hydrocarbons should be sufficiently hard (or crystalline) so the coated catalyst particles can be formed into a solid mass. However not so hard that the solid mass becomes brittle or subject to cracking during transport. Waxes made from higher alkanes having a $C_{15}$-$C_{20}$ chain lengths should be sufficient, with some limited branching. Waxes made from lipids or fatty acids or primary or secondary long chain alcohols will also be useful. Long chain alcohols may also serve as the passivating agent disclosed above. Ideally, the wax material will have a melting point above 100° C., but lower than the lowest desired operating temperatures for the process (i.e. lower than 260° C.) to facilitate removal from the catalyst materials. Generally upon exposure of the wax materials to elevated temperatures and a partial pressure of hydrogen, they are thermally hydrocracked and rapidly removed from the active sulfided catalyst materials. In an alternative embodiment, the coating material may be polymeric, preferably a heat sensitive polymer such thermoplastics examples of which include polyethylene, polypropylene or poly butylene. One of skill in the art will appreciate that the chain length and structure (iso-tactic v. syn-tactic v atactic) nature of the polymer chain will directly affect the properties and can be adjusted systematically to obtain the desired properties.

In one embodiment of the invention, the passivation step is completed and the catalyst will be sufficiently passivated for handling and loading of the catalyst under controlled conditions of temperature, oxygen content (i.e. under an oxygen depleted atmosphere such as nitrogen or argon) and humidity. In such instances, the passivated (but not coated) catalyst will be loaded into the transportable reactor to form catalyst beds and/or will be loaded into the support structures of the pre-structured catalyst bed. This will allow the second step of coating to take place in the fully catalyst loaded transportable reactor itself or (with structured supports) the coating process will be performed on the catalyst loaded structured supports outside of the transportable reactor so they can be loaded into the transportable reactor.

Activation of the ex-situ pre-sulfided catalyst takes place in the transportable reactor once the transportable reactor is connected to the process infrastructure. The activation step may involve heating the reactor first to a temperature to melt or liquefy the coating materials. The heating step will be performed under inert atmosphere (such as nitrogen or argon) which might have a measurable partial pressure of hydrogen. The heating step continues until the desired operating conditions of temperature and pressure are reached. This may require the introduction of a hydrocarbon (such as low sulfur diesel, marine gas oil, low sulfur residual materials in the presence of hydrogen and optionally a hydrocarbon. This process of pre-conditioning the catalyst and the transportable reactor prior to introducing Feedstock HMFO material.

Structured Catalyst Bed Turning now to the structured catalyst bed, similar beds have been disclosed in the prior art in relation to many catalyst promoted reactions. See for example U.S. Pat. Nos. 4,731,229; 5,073,236; 5,266,546; 5,431,890; 5,730,843; USUS2002068026; US20020038066; US20020068026; US20030012711; US20060065578; US20070209966; US20090188837; US2010063334; US2010228063; US20110214979; US20120048778; US20150166908; US20150275105; 20160074824; 20170101592 and US20170226433, the contents of which are incorporated herein by reference. However these disclosures involve the product being distilled from heavier bottoms or feedstock materials. For example heavy and light naphtha streams are desulfurized with the desired light naphtha being the desired product for the gasoline pool and the heavy naphtha either recycled or sent to a FCC cracker for further upgrading. The process of the current invention utilized the distillation separation process to remove undesired by-product hydrocarbons and gases produced by the catalytic reaction (i.e. ammonia and hydrogen sulfide) and the desired product is the bottoms stream that is catalytically treated, but not distilled. The structured catalyst beds as described above balance the catalyst density load, the catalyst activity load and the desired liquid space velocity through the reactor so an effective separation or distillation of purified lighter products can be produced. In contrast the present process functionally combines the functioning of a reactor with a stripper column or knock down drum. A further problem solved by the structured catalyst bed is to reduce the pressure drop through the catalyst beds and provision of sufficient contact of the Feedstock Mixture with the catalyst and mixing with the Activating Gas.

Figure 8:
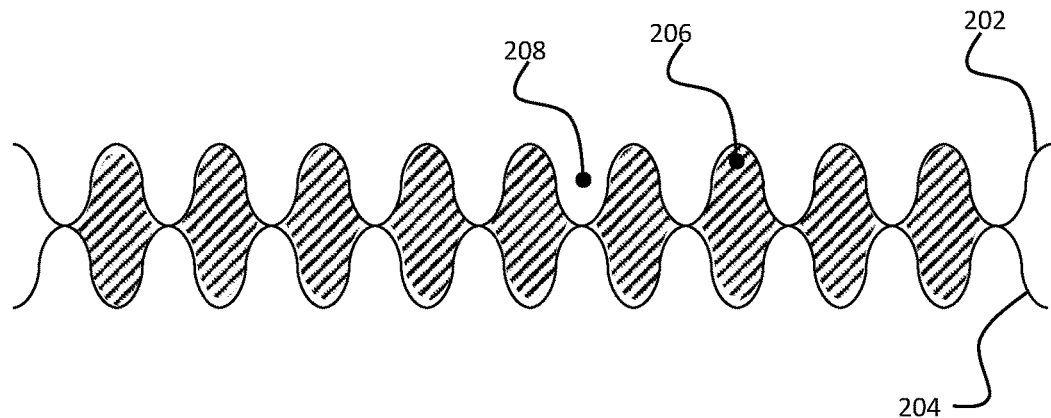
FIG. 8 is a side view of a first illustrative embodiment of a catalyst retention structure.
Figure 9:
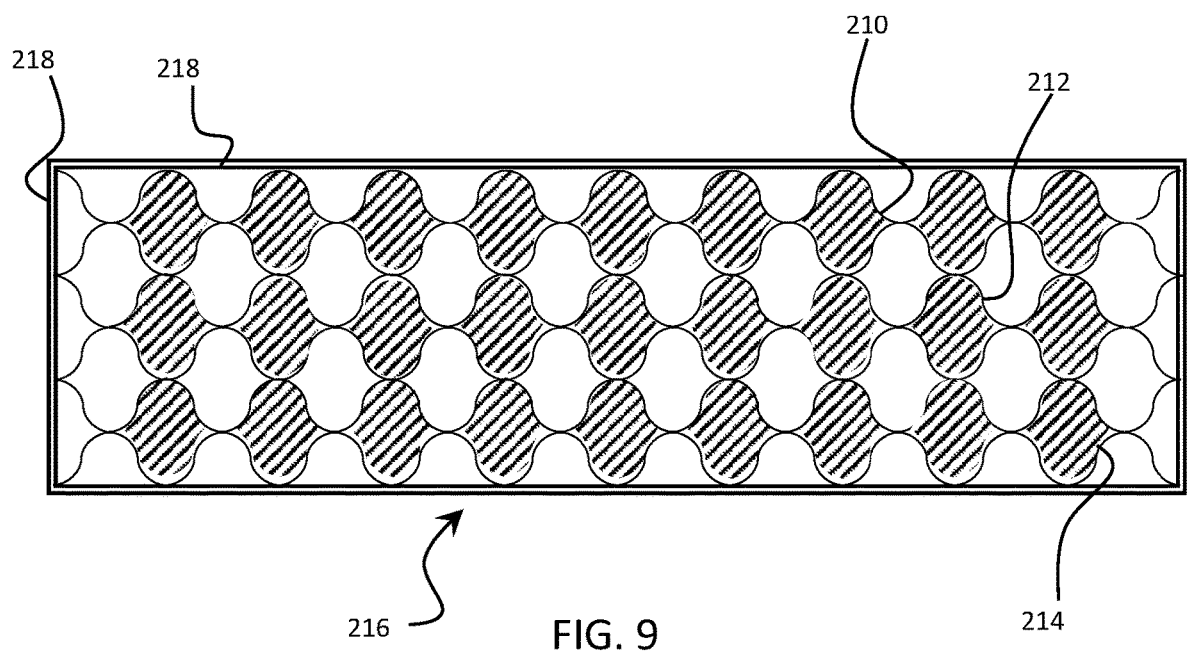
FIG. 9 is a side view of a first illustrative embodiment of a structured catalyst bed with a plurality of catalyst retention structures.

A first illustrative embodiment of the structured catalyst beds is shown in FIG. 8 and FIG. 9 in a side view. As illustrated in FIG. 8 is a catalyst retention composed of a pair of fluid permeable corrugated metal sheets (202 and 204), wherein the pair of the fluid permeable corrugated metal sheets are aligned so the corrugations are sinusoidal, have the same wave length and amplitude, but are out of phase and defining a catalyst rich space (206) and a catalyst lean space (208). The catalyst rich space will be loaded with one or more catalyst materials and optionally inert packing materials. The catalyst lean space (208) may be left empty or it may be loaded with inert packing such as ceramic beads, inactive (non-metal containing) catalyst support, glass beads, rings, wire or plastic balls and the like. These inert packing materials may serve the role of assisting in the mixing of the Activating Gas with the Feedstock HMFO, facilitate the removal or separation of gaseous by products (i.e. hydrogen sulfide or ammonia) from the process mixture or facilitate the separation of any hydrocarbon by-products.

FIG. 9 shows in side perspective a plurality of catalyst retention structures (210, 212 and 214) formed into a structured catalyst bed (216). Structural supports (218) may be optionally incorporated into the structured catalyst bed to lend rigidity as needed. As shown the catalyst rich spaces are radially aligned so the catalyst rich spaces of one catalyst retention structure is aligned with the catalyst rich structure of the adjacent layers. In the illustrated configuration, the radial angle between adjacent layers is 0° (or 180°). One of skill in the art will appreciate that the angle of radial alignment between adjacent layers may be varied from 0° to 180°, preferably between 20° and 160° and more preferably 90° so the catalyst rich areas in one layer are perpendicular to the adjacent layers. It will be further appreciated that the alignment of a particular set of three or more layers need not be the same. A first layer may be aligned along and define the 0° axis relative to the other two layers; a second adjacent layer may be radially aligned along a 45° angle relative to the first layer; and the third layer aligned along a 90° angle relative to the first layer. This pattern of alignment may be continued until the desired number of layers is achieved. It also should be appreciated that it may be desirable to angle of the catalyst rich spaces (ie. the plane of the catalyst retention structure), relative to the flow of Feedstock HMFO and Activating Gas within the reaction vessel. This relative angle is referred to herein as the inclination angle. As shown in FIG. 9, the inclination angel is perpendicular (90°) to the flow of Feedstock HMFO and Activating Gas through the reactor vessel. However, it will be appreciated that the inclination level may be varied between 0°, in which case the catalyst rich spaces are vertically aligned with the side walls of the reactor vessel and 90° in which case the catalyst rich spaces are perpendicular to the side walls of the reactor vessel. By varying both the radial alignment and the inclination angle of the catalyst rich spaces, one will be able to achieve a wide variety and be able to optimize the flow of Feedstock HMFO though the reactor vessel with minimal plugging/coking.

Figure 10:
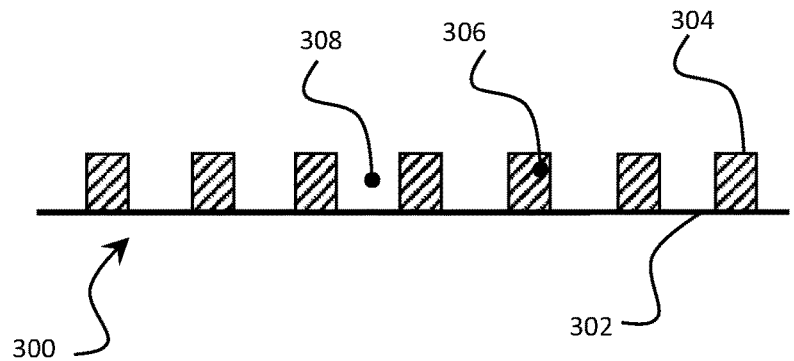
FIG. 10 is a side view of a second illustrative embodiment of a catalyst retention structure.
Figure 11:
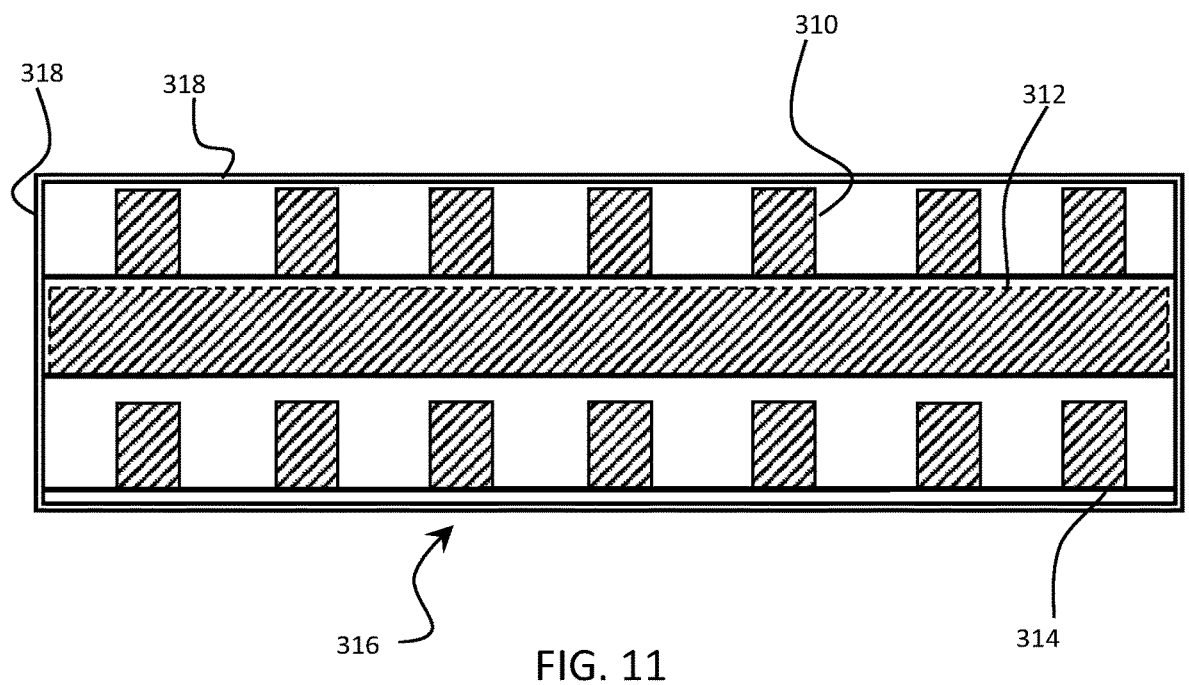
FIG. 11 is a side view of a second illustrative embodiment of a structured catalyst bed with a plurality of catalyst retention structures.

A second illustrative embodiment of the structured catalyst beds is shown in FIG. 10 and FIG. 11 in a side view. As illustrated in FIG. 10, catalyst retention structure (300) comprises a flat fluid permeable metal sheet (302) and a corrugated fluid permeable metal sheet (304) aligned to be co-planar and defining a catalyst rich space (306) and a catalyst lean space (308). As with the prior illustrative embodiment, the catalyst rich space will contain one or more catalyst materials and optionally inert packing materials and the catalyst leans pace will be empty or optionally contain inert packing materials. FIG. 11 shows in side perspective a plurality of catalyst retention structures (310, 312 and 314) formed into a structured catalyst bed (316). Structural supports (318) may be optionally incorporated into the structured catalyst bed to lend rigidity as needed. As shown the catalyst rich spaces are radially aligned so the catalyst rich spaces of one catalyst retention structure is perpendicular with the catalyst rich structure of the adjacent layers. In the illustrated configuration, the radial angle between adjacent layers is 90°. The same considerations of radial alignment and inclination of the catalyst retention structures described above will apply to this embodiment. The principle benefit of the illustrated structured catalyst bed is that the manufacturing process because affixing the flat fluid permeable sheet and the corrugated fluid permeable sheet will be greatly simplified. Further as illustrated, if the corrugated sheet is constructed using 90° angle corrugations, each catalyst retention structure can withstand much greater weight loadings than if the corrugations are sinusoidal.

The loading of the catalyst structures will depend upon the particle size of the catalyst materials and the activity level of the catalyst. The structures should be loaded so the open space will be at least 10 volume % of the overall structural volume, and preferably will be up to about 65% of the overall structural volume. Active catalyst materials should be loaded in the catalyst support structure at a level dependent upon the catalyst activity level and the desired level of treatment. For example a catalyst material highly active for desulfurization may be loaded at a lower density than a less active desulfurization catalyst material and yet still achieve the same overall balance of catalyst activity per volume. One of skill in the art will appreciate that by systematically varying the catalyst loaded per volume and the catalyst activity level one may optimize the activity level and fluid permeability levels of the structured catalyst bed. In one such example, the catalyst density is so over 50% of the open space in the catalyst rich space, which may occupy only have of the over space within the structured catalyst bed. In another example catalyst rich space is fully loaded (i.e. dense packed into each catalyst rich space), however the catalyst rich space may occupy only 30 volume % of the overall structured catalyst bed. It will be appreciated that the catalyst density in the catalyst rich space may vary between 30 vol % and 100 vol % of the catalyst rich space. It will be further appreciated that that catalyst rich space may occupy as little as 10 vol % of the overall structured catalyst bed or it may occupy as much as 80 vol % of the overall structured catalyst bed.

The liquid hourly space velocity within the structured catalyst beds should be between 0.05 oil/hour/$m^3$ catalyst and 10.0 oil/hour/$m^3$ catalyst; preferably between 0.08 oil/hour/$m^3$ catalyst and 5.0 oil/hour/$m^3$ catalyst and more preferably between 0.1 oil/hour/$m^3$ catalyst and 3.0 oil/hour/$m^3$ catalyst to achieve deep desulfurization using a highly active desulfurization catalyst and this will achieve a product with sulfur levels below 0.1 ppmw. However, it will be appreciated by one of skill in the art that when there is lower catalyst density, it may be desirable to adjust the space velocity to value outside of the values disclosed.

One of skill in the art will appreciate that the above described structured catalyst beds can serve as a direct substitute for dense packed beds that include inert materials, such as glass beads and the like. An important criteria is the catalyst density within the beds themselves. The structured catalyst beds can be loaded with a catalyst density comparable to that of a dense loaded bed with a mixture of catalyst and inert materials or a bed with layers of catalyst and inert materials. Determining the optimized catalyst density will be a simple matter of systematically adjusting the catalyst density (for a set of reaction conditions in a pilot plant. A fixed density catalyst structure will be made and the reaction parameters of space velocity and reactor temperature and bed depth will be systematically varied and optimized.

Figure 12:
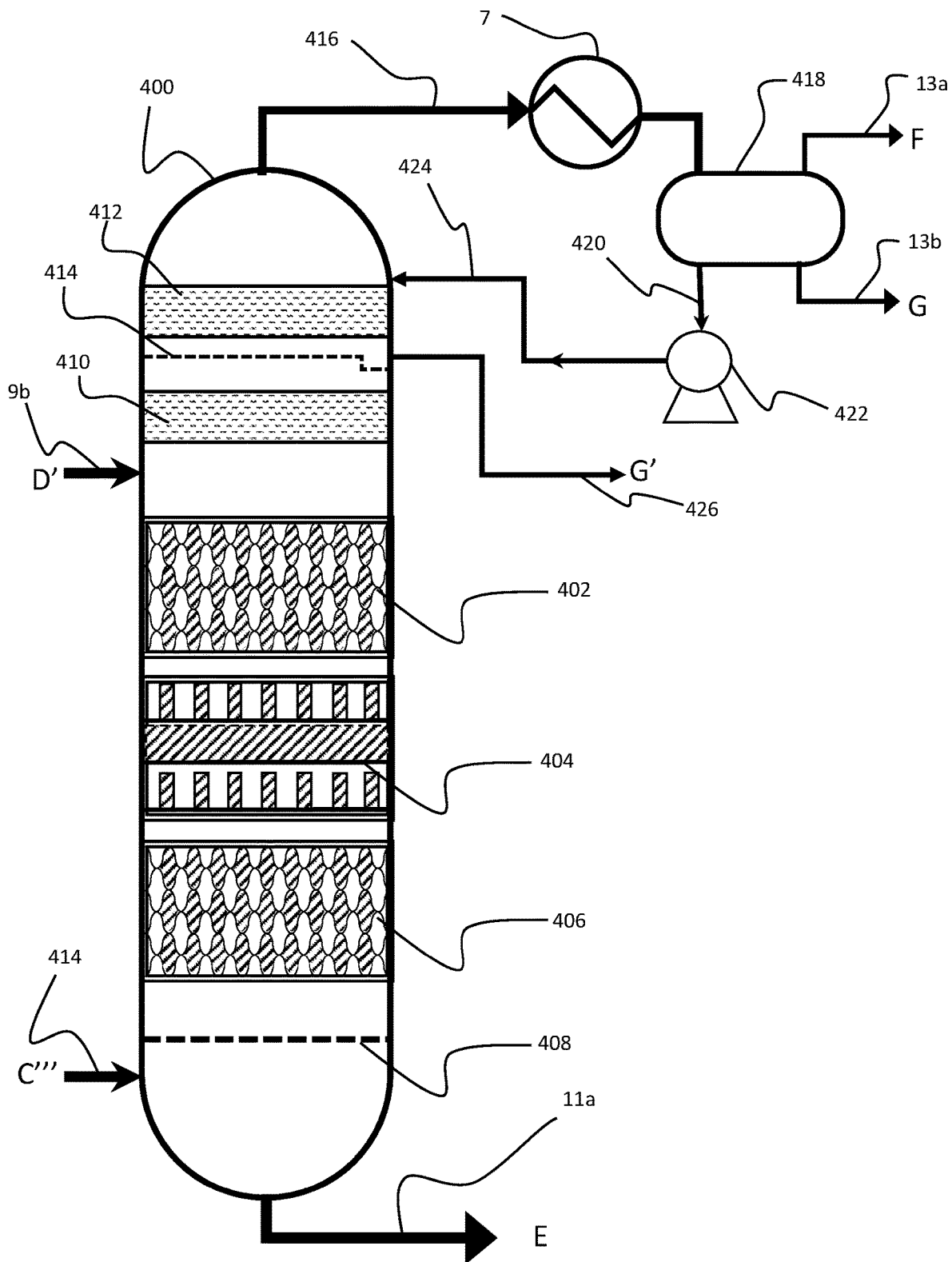
FIG. 12 is a schematic illustration of a reaction vessel configured to operate under reactive distillation conditions.

Reactive Distillation Reactor As in FIG. 12, a reactive Reactor System as contemplated by the present invention will comprise a reactor vessel (400) within which one or more structured beds are provided (402, 404 and 406). One of skill in the art will note that heated Feedstock Mixture (D') enters the reactor vessel in the upper portion of the reactor via line (9*b*) above the structured catalyst beds (402, 404 and 406). When elements are the same as those disclosed, the same reference number is utilized for continuity within the disclosure. Entry of the heated Feedstock Mixture (D') above the structured catalyst beds (402, 404 and 406) may be facilitated by a distribution tray or similar device not shown. It will also be noted that each of the structured catalyst beds is different in appears, the reason for this will now described. The upper most structured catalyst bed (402) will be preferably loaded with a demetallization catalyst and in a structure optimized for the demetallization of the Feedstock Mixture. The middle structured catalyst bed (404) will preferably be loaded with a transition catalyst material or a mixture of demetallization and low activity desulfurization catalyst. The lower most structured catalyst bed will be preferably loaded with a desulfurization catalyst of moderate to high activity. A gas sparger or separation tray (408) is below structured catalyst tray 406. In this way, the Feedstock Mixture flows from the upper portion of the reactor to the lower portion of the reactor and will be transformed into Reaction Mixture (E) which exits the bottom of the reactor via line 11*a*.

As shown, make up Activating Gas C''' will be provided via line 414 to both quench and create within the reactor a counter-current flow of Activating gas within the reactor. One of skill in the art will appreciate this flow may also be connected to the reactor so make up Activating gas is also injected between structured catalyst beds 406 and 404 and 404 and 402. In the upper portion of the reactor, inert distillation packing beds (410 and 412) may be located. It may be desirably and optionally it is preferable for the lower most of these upper beds (410) to be a structured catalyst bed as well with catalyst for the desulfurization of the distillate materials. In such an instance a down comber tray or similar liquid diversion tray (414) is inserted so a flow of middle to heavy distillate (G') can be removed from the upper portion of the reactor via line (426). Light hydrocarbons (i.e. lighter than middle distillate exits the top of the reactor via line (416) and passes through heat exchanger (7) to help with heat recovery. This stream is then directed to the reflux drum (418) in which liquids are collected for use as reflux materials. The reflux loop to the upper reactor is completed via reflux pump (422) and reflux line (424). That portion of the lights not utilized in the reflux are combined with similar flows (F and G) via lines 13*a* and 13*b* respectively.

One of skill in the art of reactor design will note that unlike the prior art reactive distillation processes and reactor designs, the present invention presents multiple novel and non-obvious (i.e. inventive step) features. One such aspect, as noted above, the Feedstock Mixture enters the upper portion of the reactor above the structured catalytic beds. In doing so it is transformed into Reaction Mixture that exits the bottom of the reactor. One of skill in the art will appreciate that by this flow, the majority of HMFO material (which is characterized as being residual in nature) will not be volatile or distilled, but any byproduct gases, distillate hydrocarbons or light hydrocarbons are volatilized into the upper portion of the reactor. The reactor will be hydraulically designed so the majority of the volume of the liquid components having residual properties in the Feedstock Mixture will exit the lower portion of the reactor, preferably over 75% vol. of the volume of the liquid components having residual properties in the Feedstock Mixture will exit the lower portion of the reactor and even more preferably over 90% vol. of the volume of the liquid components having residual properties in the Feedstock Mixture will exit the lower portion of the reactor. This is in contract with the prior art where the majority of the desired products exit the upper portion of the reactor via distillation and the residual bottoms portions are recycled or sent to another refinery unit for further processing.

In a variation of the above illustrative embodiment, one or more fixed bed reactor(s) containing, solid particle filtering media such as inactive catalyst support, inert packing materials, selective absorption materials such as sulfur absorption media, demetallization catalyst or combinations and mixtures of these may be located upstream of the Reactive distillation reactor. In one alternative embodiment a reactor with a mixture of hydrodemetallization catalyst, decarbonization catalysts and inert materials will act as a guard bed, protecting the Reactive distillation reactor from high levels of metals, concarbon (CCR) and other contaminants that can reduce the run length of the Reactive distillation reactor. In another embodiment, the upstream reactors are loaded within inert packing materials and deactivated catalyst to remove solids followed by a reactor loaded within hydrodemetallization catalyst. One of skill in the art will appreciate these upstream reactors may allow the upstream reactors to be taken out of service and catalysts changed out without shutting down or affecting operation of the Reactive distillation reactor.

In another variation of the above illustrative embodiment in FIG. 12, a fired reboiler can be added to the lower portion of the reactive distillation reactor. Such a configuration would take a portion of the Reaction Mixture from the bottom of the reactor prior to its exit via line 11*a*, pass it through a pump and optionally a heater, and reintroduce the material into the reactor above tray 408 and preferably above the lowermost structured catalyst bed (406). The purpose of the reboiler will be to add or remove heat within the reactive distillation reactor, and will increase column traffic, because of this reboiler loop a temperature profile in the reactive distillation reactor will be controlled and more distillate product(s) may be taken. We assume severity in the column could be increased to increase the hydrocracking activity within the reactive distillation reactor increasing the distillate production. Because of the washing effect caused by refluxing Reaction Mixture back into the reactive distillation reactor, coking and fouling of catalysts should be minimized, allowing for extending run lengths.

Figure 13:
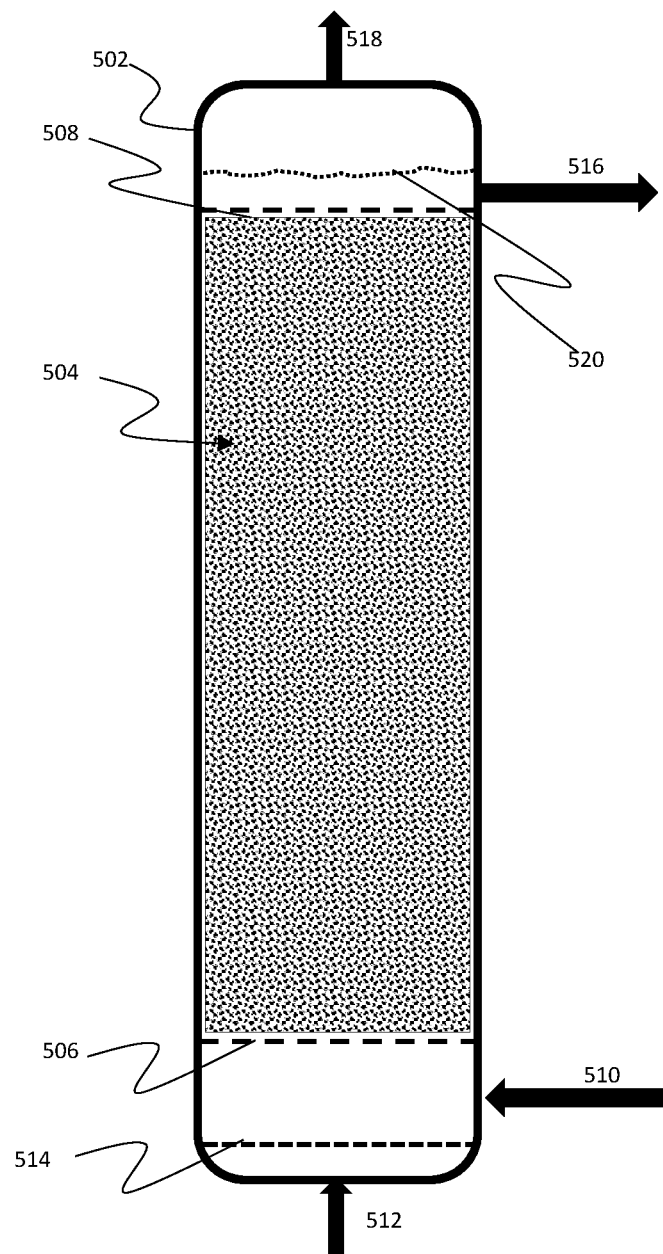
FIG. 13 is a schematic illustration of a reaction vessel configured to operate under three phase bubble reactor conditions.

Bubble Reactor: FIG. 13 shows a packed bubble reactor configuration as an alternative embodiment for the primary reactor. Bubble reactors are characterized by having a high heat and mass transfer rates, compactness and low operating and maintenance costs. As illustrated in FIG. 13, the reactor (502) will contain a packed catalyst bed (504) of heterogenous transition metal catalyst materials. The packed bed may be a partially expanded bed or more preferably a structured bed in which the active catalyst material are dispersed by inert packing (glass beads) or metal structures such as those described in U.S. and co-pending patent applications. Catalyst supporting structures (506 and 508) may be helpful in ensuring that the catalyst materials remain in the desired locations within the reactor. The illustrative packed bubble reactor will have a con-current configuration with Feedstock HSFO (510) being introduced into the reactor at a point below the catalyst bed. Activating Gas (512) will be so bubble are formed in the Feedstock HSFO, preferably using spargers or gas diffusion devices (514) know to one of skill in the art. Treated HSFO (516) exits the reactor at a point above the catalyst bed. Unreacted Activating Gas and by-product gases, such as hydrogen sulfide and light hydrocarbons (C8 and lower) (518), exit the top of the reactor. The inflow of Feedstock HSFO and the outflow of treated HSFO will be managed so the fluid level (520) is maintained so that and initial hot separation of treated HSFO and gases takes place in the top of the reactor.

One of skill in the art will appreciate that the pack bubble reactor described above can also be configured to have a counter-current configuration. In such an illustrative embodiment, the Activating Gas (512) will be injected at the bottom of the reactor and the unreacted Activating Gas and by-product gases, such as hydrogen sulfide and light hydrocarbons (C8 and lower) (518), will exit the top of the reactor. However, the flow of Feedstock HSFO and treated HSFO are reversed from that shown in FIG. 13 so Feedstock HSFO is introduced into the top of the reactor (the reverse of 516) and treated HSFO is removed from the bottom of the reactor (the reverse of 510). In such a counter current configuration, there is a natural grading of reaction activity from top (lowest activity based on hydrogen partial pressure in the Activating Gas) to the bottom (greatest activity based on hydrogen partial pressure in the Activating Gas). It is expected that such a configuration will be further optimized by the gradation of the activity levels of the catalyst materials and will achieve significantly longer run times without the formation of coke or other solids deactivating the catalyst or restricting the flow of HSFO through the reactor. One of skill in the art will appreciate that by using reactor models and CFD calculations, the flows of Feedstock HSFO and Activating Gas for any catalyst arrangement (packed bed, structured bed or expanded bed) can be optimized to achieve maximum throughput and treatment of the HSFO.

Divided Wall Reactor: In a further alternative embodiment, a divided wall reactor configuration may be desired, especially when heat preservation is desired, such as when feed heater capabilities are limited.

Figure 14:
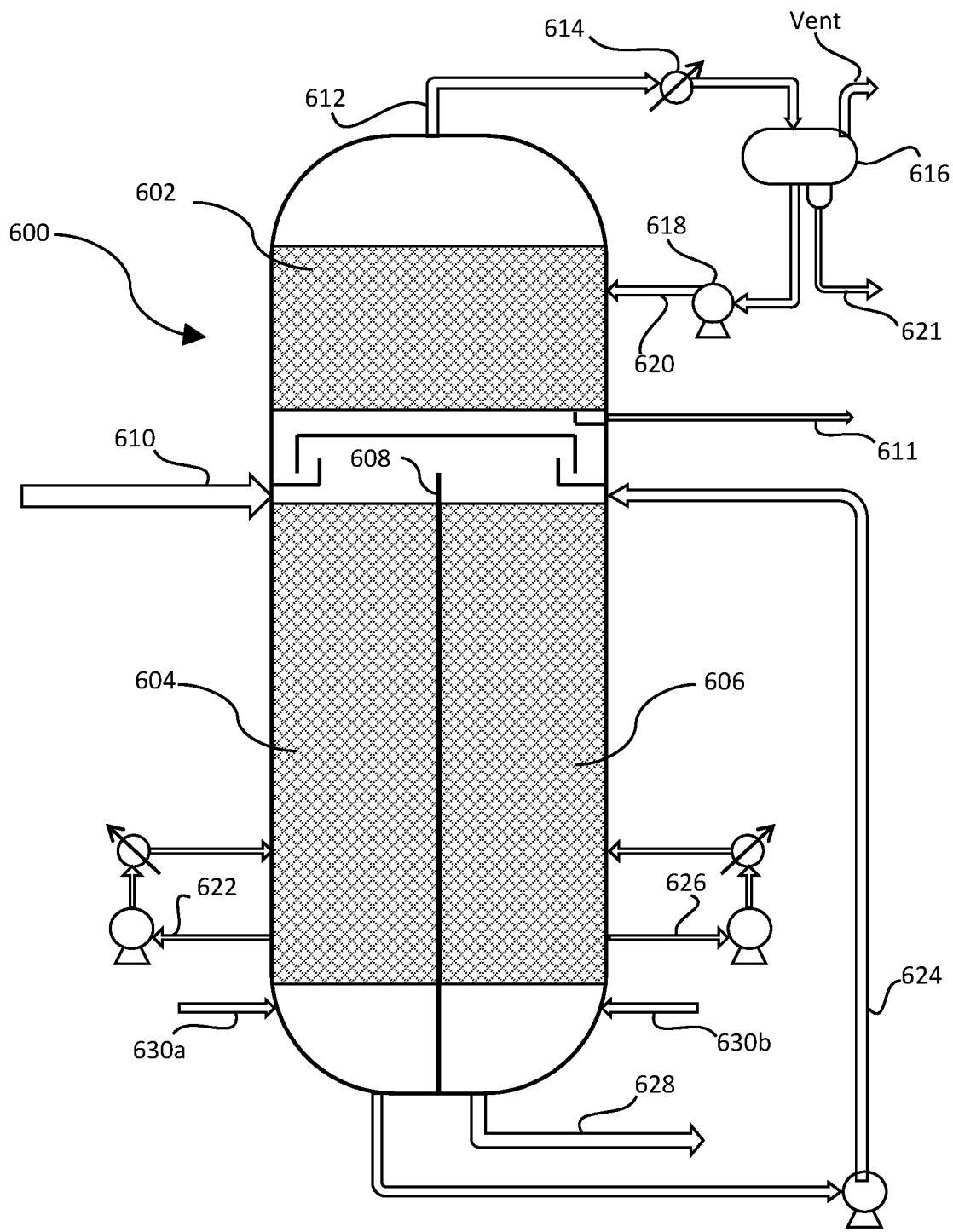
FIG. 14 is a schematic illustration of a reaction vessel configured to operate as a divide wall fixed bed reactor conditions.

Referring now to FIG. 14, there is illustrated a reactor system 600 comprising an upper reactor section 602, first lower reactor section 604 and second lower reactor section 606. The reactor system contains a longitudinally oriented partition 608 which extends through at least a part of the length of the reactor system 602 to define the partitioned first lower reactor section 604 and the second lower reactor section 606.

Feedstock HMFO is provided into upper portion of the first reactor section 604 through conduit means 610. Top vapor from the first reactor section comprising gases and light and middle distillate hydrocarbons is withdrawn from the upper portion of the first lower reactor section 602. Middle distillate hydrocarbons are condensed in the upper portion of the reactor system 602 and removed via line 611 as medium to heavy distillate (i.e. diesel and gas oil) for use and processing outside the battery limits shown. A portion of the middle distillate hydrocarbons can be diverted and used as a reflux (not shown) if desired, the volume of that reflux may be minimal. The gases and light hydrocarbons collect at the top of the reactor system and exit the reactor system via line 612 for later treatment. As illustrated the later treatment may comprise a heat exchanger 614 followed by a separator drum 616. The condensed hydrocarbon liquids can be used in part as a reflux to the reactor section via pump 618 and line 620. Or in addition, the hydrocarbon liquids can be withdrawn via line 621 and processed using conventional techniques outside of the battery limits shown. The bottoms portion of the first lower reactor section 604, comprising partially treated Feedstock HMFO is routed back into the lower section of the first reactor section 604 to serve as a reflux via reflux loop 622.

The cross-hatched areas represent mass transfer elements such as dense packed transition metal catalyst beds (with or without inert materials such as glass beads); loose catalyst supported on trays, or packing. The packing, if used, may be structured catalyst beds or random packing catalyst beds with inert materials mixed with the transitions metal catalyst materials.

The partition may be made of any suitable material if there is substantially no mass transfer across the partition, however there may be heat transfer across the partition. The column cross-sectional area need not be divided equally by the partition. The partition can have any suitable shape such as a vertical dividing plate or an internal cylindrical shell configuration. In the embodiment illustrated in FIG. 14 the partition is a vertical dividing plate bisecting the reactor, however, more than one plate may form radially arranged reactor sections.

The partially treated HMFO fluid from the lower portion of the first lower reaction section 604 is pumped through conduit means 624 into the second lower reaction section 606 at a point above the partitioned section. Top vapor from the second reactor section comprising gases and light and middle distillate hydrocarbons are withdrawn from the upper portion of the second lower reactor section 604. Middle distillate hydrocarbons are condensed in the upper portion of the reactor system 602 and removed via line 611 as medium and heavy distillate hydrocarbons (i.e. diesel and gas oil) for use and processing outside the battery limits shown. A bottoms portion of the second lower reactor section, comprising treated HMFO may be routed through recycle loop 626 back into the lower section of the second lower reactor section 606 to serve as a reflux. A second portion of the bottoms portion from the second lower reactor section 606 is removed through line 628 for further treatment outside of the battery limits as treated HMFO. It may desirable for there to be injection of make up or quenching Activating Gas in to the lower portions of the reactor. This may be achieved using Activating Gas feedlines 630*a* and 630*b*. One of skill in the art will appreciate that the properties of the Feedstock HMFO sent to the first reactor section and the partially treated HMFO may be substantively the same (except for the levels of Environmental Contaminants such as sulfur).

At the design stage, different packing or combinations of trays, structured catalyst beds, and packing can be specified on each side of the partition to alter the fraction of the HMFO which flows on each side of the partition. Other products such as middle and heavy distillate hydrocarbons may be taken from the upper portion of the reactor system 602 preferably from above the partitioned section.

In one embodiment the dividing partition is extended to the bottom of the part of the divided column containing trays or packing, and the section of trays or packing above the partition is eliminated. Such an arrangement allows easy control of the reflux liquid on each side of the divided column with a control valve (not shown) external to the column. In the embodiments illustrated in FIG. 14 flow through the lines is controlled in part by appropriate valving as is well known to those skilled in the art and these valves are not illustrated in the drawings.

One of skill in the art will appreciate the thermal benefits to be derived from the above illustrative embodiment. This benefit may be best realized in a modular reactor configuration or niche refining environment where footprint of the unit is more important than maximum throughput. For example, one can utilize the above arrangement to more efficiently process relatively small volume (i.e. 500-5000 Bbl) of Feedstock high sulfur HMFO that a refinery would otherwise have to clear/dispose of. The divided wall reactor allows for a single reactor vessel to function s two separate vessels and take advantage of the combined collection of the by-product gases and light hydrocarbons.

While the above described reactor types may be preferred, other reactors may also be utilized in implementing the disclosed process. Examples of such reactors are now provided in brief and without illustration as they are described and known in the art of reactor design.

Liquid Full Reactor: Liquid full reactors such as those disclosed in U.S. Pat. Nos. 6,123,835, 6,428,686, 6,881,326, 7,291,257, 7,569,136; 8,721,871; 9,365,782; US20120103868; U.S. Pat. Nos. 8,314,276; 8,008,534 and also semi-liquid full reactors such as those disclosed in US20170037325 and US20180072957 (the contents incorporated herein by reference) may be used for the removal of Environmental Contaminants from Feedstock high sulfur HMFO having bulk properties compliant with ISO8217:2017 Table 2 as a residual marine fuel except for the sulfur levels which may be greater than 0.5 wt % sulfur. A diluent material is disclosed as a necessary addition to the feedstock hydrocarbons in the above noted patents, however as contemplated in the present disclosure, using diluent or recycling of product back into the feedstock is not required. This is believed to result from using a Feedstock high sulfur HMFO with bulk properties that are ISO 817 compliant. A process is contemplated in which: a) contacting the Feedstock high sulfur HMFO, wherein the bulk properties of the Feedstock high sulfur HMFO is I508217:2017 compliant except for a sulfur content which may be in the range of 0.5% wt and 5.0 wt, preferably between the range of 1.0% wt and 3.5% wt sulfur with Activating Gas so the Activating Gas saturates the Feedstock high sulfur HMFO; b) introducing the Activating Gas saturated Feedstock high sulfur HMFO into a liquid full reactor containing a transition metal catalyst so reactive contact occurs and a treated HMFO is formed; and c) discharging the treated HMFO from the reactor. Upon discharge, the treated HMFO can be passed through an inert gas stripper to remove the entrained gases, including light hydrocarbons and hydrogen sulfide formed in the reactor. The treated HMFO can be subjected to a second or later treatment process substantially similar to that described. (that is saturation of the treated HMFO with Activating Gas; contacting the Activating Gas saturated treated HMFO with a transitional metal catalyst to further reactive contact occurs and discharging from the reactor. We assume under these conditions, multiple reactors may be desirable is stages to achieve the desired degree of desulfurization (i.e. less than 0.5% wt and more preferably less than 0.1% wt sulfur). In such an instance, a first reactor stage is loaded with a transition metal catalyst characterized as a hydrodemetallization catalyst; a second reactor stage is loaded with a transition metal catalyst characterized as a transition catalyst (which is a graded mixture of hydrodemetallization catalyst and hydrodesulfurization catalyst so there is an increase in desulfurization activity further downstream); and a third reactor stage is loaded with a transition metal catalyst characterized as a hydrodesulfurization catalyst. Each stage may involve more than one actual reactor vessels. For example, the first stage (demetallization) can comprise two reactors with catalyst loaded so there is an increasing level of demetallization activity further downstream; followed by the transition catalyst stage and then followed by the desulfurization stage. Or for a sulfur rich feedstock, there can be multiple reactors making up the third desulfurization stage. The concept of having three reactor stages (demetallization, transition, desulfurization) made up of one or more reactors is not limited to liquid full reactors, but can be implemented in the other reactors disclosed.

Ebulliated Bed or Slurry Bed Reactors Ebulliated bed or slurry bed reactors such as those disclosed in U.S. Pat. Nos. 7,390,393; 6,712,955; 6,132,597; 6,153,087; 6,187,174; 6,207,041; 6,277,270; 3,623974; 4,285,804; 3,657,111; 3,619,410; 3,617,503; 3,079,329; 4,125,455; 4,902,407; 4,746,419; 4,576,710; 4,591,426; 3,809,644; 3,705,849; (the contents incorporated herein by reference) may be used for the removal of Environmental Contaminants from Feedstock high sulfur HMFO having bulk properties compliant with ISO8217:2017 Table 2 as a residual marine fuel except for the sulfur levels which may be in the range of 1-3% wt sulfur. A Co-catalyst in the form of particulate transition metal compounds is disclosed as a necessary addition to the feedstock hydrocarbons in certain of the above noted slurry bed patents, this diluent may take the form of a lighter than Feedstock HSFO material (i.e. middle distillate or gas oil) or recycling of portion of the by product back into the feedstock. A process is contemplated in which: a) contacting the Feedstock high sulfur HMFO, wherein the bulk properties of the Feedstock high sulfur HMFO is ISO8217:2017 compliant except for a sulfur content which may be in the range of 0.5% wt and 5.0 wt, preferably between the range of 1.0% wt and 3.5% wt sulfur with Activating Gas in the reactor so the Activating Gas saturates the Feedstock high sulfur HMFO; b) introducing the Activating Gas saturated Feedstock high sulfur HMFO into a ebulliated bed reactor containing a transition metal catalyst so reactive contact occurs and a treated HMFO is formed; and c) discharging the treated HMFO from the reactor. Upon discharge, the treated HMFO can be passed through an inert gas stripper to remove the entrained gases, including light hydrocarbons and hydrogen sulfide formed in the reactor. The treated HMFO can be subjected to a second or later treatment process substantially similar to that described. (that is saturation of the treated HMFO with Activating Gas; contacting the Activating gas saturated treated HMFO with a transitional metal catalyst to further reactive contact occurs and discharging from the reactor. We assume under these conditions, multiple reactors may be desirable is stages to achieve the desired degree of desulfurization (i.e. less than 0.5% wt and more preferably less than 0.1% wt sulfur). In such an instance, a first reactor stage is loaded with a transition metal catalyst characterized as a hydrodemetallization catalyst; a second reactor stage is loaded with a transition metal catalyst characterized as a transition catalyst (which is a graded mixture of hydrodemetallization catalyst and hydrodesulfurization catalyst so there is an increase in desulfurization activity further downstream); and a third reactor stage is loaded with a transition metal catalyst characterized as a hydrodesulfurization catalyst. Each stage may involve more than one actual reactor vessels. For example, the first stage (demetallization) can comprise two reactors with catalyst loaded so there is an increasing level of demetallization activity further downstream; followed by the transition catalyst stage and then followed by the desulfurization stage. Or for a sulfur rich feedstock, there can be multiple reactors making up the third desulfurization stage Catalyst in Reactor System: Generally a reactor vessel in each Reactor System is loaded with one or more process catalysts. The exact design of the process catalyst system is a function of feedstock properties, product requirements and operating constraints and optimization of the process catalyst can be carried out by routine trial and error by one of ordinary skill in the art.

The process catalyst(s) comprise at least one metal selected from the group consisting of the metals each belonging to the groups 6, 8, 9 and 10 of the Periodic Table, and more preferably a mixed transition metal catalyst such as Ni—Mo, Co—Mo, Ni—W or Ni—Co—Mo are utilized. The metal is preferably supported on a porous inorganic oxide catalyst carrier. The porous inorganic oxide catalyst carrier is at least one carrier selected from the group consisting of alumina, alumina/boria carrier, a carrier containing metal-containing aluminosilicate, alumina/phosphorus carrier, alumina/alkaline earth metal compound carrier, alumina/titania carrier and alumina/zirconia carrier. The preferred porous inorganic oxide catalyst carrier is alumina. The pore size and metal loadings on the carrier may be systematically varied and tested with the desired feedstock and process conditions to optimize the properties of the Product HMFO. One of skill in the art knows that demetallization using a transition metal catalyst (such a CoMo or NiMo) is favored by catalysts with a relatively large surface pore diameter and desulfurization is favored by supports having a relatively small pore diameter. Generally the surface area for the catalyst material ranges from 200-300 m$^2$/g. The systematic adjustment of pore size and surface area, and transition metal loadings activities to preferentially form a demetallization catalyst or a desulfurization catalyst are well known and routine to one of skill in the art. Catalyst in the fixed bed reactor(s) may be dense-loaded or sock-loaded and including inert materials (such as glass or ceric balls) may be needed to ensure the desired porosity.

The catalyst selection utilized within and for loading the Reactor System may be preferential to desulfurization by designing a catalyst loading scheme that results in the Feedstock Mixture first contacting a catalyst bed that with a catalyst preferential to demetallization followed downstream by a bed of catalyst with mixed activity for demetallization and desulfurization followed downstream by a catalyst bed with high desulfurization activity. In effect the first bed with high demetallization activity acts as a guard bed for the desulfurization bed.

The objective of the Reactor System is to treat the Feedstock HMFO at the severity required to meet the Product HMFO specification for sulfur and minimize the thermal and catalytic hydrocracking reactions. Demetallization, denitrogenation and hydrocarbon hydrogenation reactions may also occur to some extent when the process conditions are optimized so the performance of the Reactor System achieves the required level of desulfurization. Hydrocracking is preferably minimized to reduce the volume of hydrocarbons formed as by-product hydrocarbons to the process. In one illustrative embodiment, the process objective is to selectively remove the Environmental Contaminants from Feedstock HMFO via demetallization and desulfurization, and minimize the formation of unnecessary by-product hydrocarbons ($C_1$-$C_8$ hydrocarbons including wild naphtha having a boiling point less than 150 F).

The process conditions in each reactor vessel will depend upon the availability and properties of all feedstock materials, the catalyst utilized and the desired properties of the Product HMFO. Variations in conditions are to be expected by one of ordinary skill in the art and these may be determined by pilot plant testing and systematic optimization of the process. With this in mind it has been found that the operating pressure, the indicated operating temperature, the ratio of the Activating Gas to Feedstock HMFO, the partial pressure of hydrogen in the Activating Gas and the space velocity all are important parameters to consider. The operating pressure of the Reactor System should be in the range of 250 psig and 3000 psig, preferably between 1000 psig and 2500 psig and more preferably between 1500 psig and 2200 psig. The indicated operating temperature of the Reactor System should be 500° F. to 900° F., preferably between 650° F. and 850° F. and more preferably between 680° F. and 800° F. The ratio of the quantity of the Activating Gas to the quantity of Feedstock HMFO should be in the range of 250 scf gas/bbl of Feedstock HMFO to 10,000 scf gas/bbl of Feedstock HMFO, preferably between 2000 scf gas/bbl of Feedstock HMFO to 5000 scf gas/bbl of Feedstock HMFO and more preferably between 2500 scf gas/bbl of Feedstock HMFO to 4500 scf gas/bbl of Feedstock HMFO. The Activating Gas should be selected from mixtures of nitrogen, hydrogen, carbon dioxide, gaseous water, and methane, so Activating Gas has an ideal gas partial pressure of hydrogen ($p_{H2}$) greater than 80% of the total pressure of the Activating Gas (P) and preferably wherein the Activating Gas has an ideal gas partial pressure of hydrogen ($p_{H2}$) greater than 90% of the total pressure of the Activating Gas (P). The Activating Gas may have a hydrogen mole fraction in the range between 80% of the total moles of Activating Gas and more preferably wherein the Activating Gas has a hydrogen mole fraction between 80% and 90% of the total moles of Activating Gas. The liquid hourly space velocity within the Reactor System should be between 0.05 oil/hour/m$^3$ catalyst and 1.0 oil/hour/m$^3$ catalyst; preferably between 0.08 oil/hour/m$^3$ catalyst and 0.5 oil/hour/m$^3$ catalyst and more preferably between 0.1 oil/hour/m$^3$ catalyst and 0.3 oil/hour/m$^3$ catalyst to achieve deep desulfurization with product sulfur levels below 0.1 ppmw.

The hydraulic capacity rate of the Reactor System should be between 100 bbl of Feedstock HMFO/day and 100,000 bbl of Feedstock HMFO/day, preferably between 1000 bbl of Feedstock HMFO/day and 60,000 bbl of Feedstock HMFO/day, more preferably between 5,000 bbl of Feedstock HMFO/day and 45,000 bbl of Feedstock HMFO/day, and even more preferably between 10,000 bbl of Feedstock HMFO/day and 30,000 bbl of Feedstock HMFO/day. The desired hydraulic capacity may be achieved in a single reactor vessel Reactor System or in a multiple reactor vessel Reactor System as described.

Oil Product Stripper System Description: The Oil Product Stripper System (19) comprises a stripper column (also known as a distillation column or exchange column) and ancillary equipment including internal elements and utilities required to remove hydrogen, hydrogen sulfide, by-product hydrocarbons (i.e. hydrocarbons boiling less than 150 F) and optionally hydrocarbons lighter than diesel from the Product HMFO. Such systems are well known to one of skill in the art, see U.S. Pat. Nos. 6,640,161; 5,709,780; 5,755,933; 4,186,159; 3,314,879 3,844,898; 4,681,661; or U.S. Pat. No. 3,619,377 the contents of which are incorporated herein by reference, a generalized functional description is provided herein. Liquid from the Hot Separator (13) and Cold Separator (7) feed the Oil Product Stripper Column (19). Stripping of hydrogen and hydrogen sulfide and by-product hydrocarbons and even hydrocarbons lighter than heavy diesel may be achieved via a reboiler, live steam or other stripping medium. The Oil Product Stripper System (19) may be designed with an overhead system comprising an overhead condenser, reflux drum and reflux pump or it may be designed without an overhead system. The conditions of the Oil Product Stripper may be optimized to control the bulk properties of the Product HMFO, more specifically viscosity and density. It is contemplated that a second draw (not shown) may be included to withdraw a diesel product, preferably a middle to heavy distillate, and by doing so control the viscosity, density and CCAI of the Product HMFO. Modifications and alternative embodiments of the Oil Product Stripper System are contemplated and are well within the capability of a skilled person and can be made to "upgrade" the Product HMFO to be less viscous and less dense (and potentially more valuable grades of residual marine fuel) or even to down grade the Product HMFO by making the the Product HMFO more viscous and more dense (i.e. RMG or RMK grades) while recovering the more valuable diesel (gas oil) fractions.

Amine Absorber System Description: The Amine Absorber System (21) comprises a gas liquid contacting column and ancillary equipment and utilities required to remove sour gas (i.e. hydrogen sulfide) from the Cold Separator vapor feed so the resulting scrubbed gas can be recycled and used as Activating Gas. Because such systems are well known to one of skill in the art, see U.S. Pat. Nos. 4,425,317; 4,085,199; 4,080,424; 4,001,386; which are incorporated herein by reference, a generalized functional description is provided herein. Vapors from the Cold Separator (17) feed the contacting column/system (19). Lean Amine (or other suitable sour gas stripping fluids or systems) provided from OSBL is utilized to scrub the Cold Separator vapor so hydrogen sulfide is effectively removed. The Amine Absorber System (19) may be designed with a gas drying system to remove the any water vapor entrained into the Recycle Activating Gas (C'). The absorbed hydrogen sulfide is processed using conventional means OSBL in a tail gas treating unit, such as a Claus combustion sulfur recovery unit or sulfur recovery system that generates sulfuric acid.

These examples will provide one skilled in the art with a more specific illustrative embodiment for conducting the process disclosed and claimed herein:

Example 1

Overview: The purpose of a pilot test run is to demonstrate that Feedstock HMFO that is compliant with ISO 8217:2017 Table 2 as a residual marine fuel can be processed through a reactor loaded with commercially available catalysts at specified conditions to remove Environmental Contaminants, specifically sulfur and other contaminants from the Feedstock HMFO to produce a Product HMFO that is compliant with ISO 8217:2017 as a Table 2 residual marine fuel, but also MARPOL compliant, that is production of a Low Sulfur Heavy Marine Fuel Oil (LS-HMFO) or Ultra-Low Sulfur Heavy Marine Fuel Oil (USL-HMFO) by subjecting a Feedstock HMFO to hydrodemetallization and hydrodesulfurization conditions.

Pilot Unit Set Up: The pilot unit will be set up with two 434 $cm^3$ reactors arranged in series to process the Feedstock HMFO. The lead reactor will be loaded with a blend of a commercially available hydrodemetallization (HDM) catalyst and a commercially available hydro-transition (HDT) catalyst. One of skill in the art will appreciate that the HDT catalyst layer may be formed and optimized using a mixture of HDM and HDS catalysts combined with an inert material to achieve the desired intermediate/transition activity levels. The second reactor will be loaded with a blend of the commercially available hydro-transition (HDT) and a commercially available hydrodesulfurization (HDS). One can load the second reactor simply with a commercially hydrodesulfurization (HDS) catalyst. One of skill in the art will appreciate that the specific feed properties of the Feedstock HMFO may affect the proportion of HDM, HDT and HDS catalysts in the reactor system. A systematic process of testing different combinations with the same feed will yield the optimized catalyst combination for any feedstock and reaction conditions. For this example, the first reactor will be loaded with ⅔ hydrodemetallization catalyst and ⅓ hydro-transition catalyst. The second reactor will be loaded with all hydrodesulfurization catalyst. The catalysts in each reactor will be mixed with glass beads (approximately 50% by volume) to improve liquid distribution and better control reactor temperature. For this pilot test run, one should use these commercially available catalysts: HDM: Albemarle KFR 20 series or equivalent; HDT: Albemarle KFR 30 series or equivalent; HDS: Albemarle KFR 50 or KFR 70 or equivalent. Once set up of the pilot unit is complete, the catalyst can be activated by sulfiding the catalyst using dimethyldisulfide (DMDS) in a manner well known to one of skill in the art.

Pilot Unit Operation: Upon completion of the activating step, the pilot unit will be ready to receive the Feedstock HMFO and Activating Gas. For the present example, the Activating Gas can be technical grade or better hydrogen gas. The mixed Feedstock HMFO and Activating Gas will be provided to the pilot plant at rates and operating conditions as specified: Oil Feed Rate: 108.5 ml/h (space velocity=0.25/h); Hydrogen/Oil Ratio: 570 Nm3/m3 (3200 scf/bbl); Reactor Temperature: 372° C. (702° F.); Reactor Outlet Pressure: 13.8 MPa(g) (2000 psig).

One of skill in the art will know that the rates and conditions may be systematically adjusted and optimized depending upon feed properties to achieve the desired product requirements. The unit will be brought to a steady state for each condition and full samples taken so analytical tests can be completed. Material balance for each condition should be closed before moving to the next condition.

Expected impacts on the Feedstock HMFO properties are: Sulfur Content (wt %): Reduced by at least 80%; Metals Content (wt %): Reduced by at least 80%; MCR/Asphaltene Content (wt %): Reduced by at least 30%; Nitrogen Content (wt %): Reduced by at least 20%; C1-Naphtha Yield (wt %): Not over 3.0% and preferably not over 1.0%.

Process conditions in the Pilot Unit can be systematically adjusted as per Table 1 to assess the impact of process conditions and optimize the performance of the process for the specific catalyst and Feedstock HMFO utilized.

TABLE 1

Optimization of Process Conditions

| Case | HC Feed Rate (ml/h), [LHSV(/h)] | $Nm^3 H_2/m^3$ oil/scf $H_2$/bbl oil | Temp (° C./° F.) | Pressure (MPa(g)/psig) |
|---|---|---|---|---|
| Baseline | 108.5 [0.25] | 570/3200 | 372/702 | 13.8/2000 |
| T1 | 108.5 [0.25] | 570/3200 | 362/684 | 13.8/2000 |
| T2 | 108.5 [0.25] | 570/3200 | 382/720 | 13.8/2000 |
| L1 | 130.2 [0.30] | 570/3200 | 372/702 | 13.8/2000 |
| L2 | 86.8 [0.20] | 570/3200 | 372/702 | 13.8/2000 |
| H1 | 108.5 [0.25] | 500/2810 | 372/702 | 13.8/2000 |
| H2 | 108.5 [0.25] | 640/3590 | 372/702 | 13.8/2000 |
| S1 | 65.1 [0.15] | 620/3480 | 385/725 | 15.2/2200 |

In this way, the conditions of the pilot unit can be optimized to achieve less than 0.5% wt. sulfur Product HMFO and preferably a 0.1% wt. sulfur Product HMFO. Conditions for producing ULS-HMFO (i.e. 0.1% wt. sulfur Product HMFO) will be: Feedstock HMFO Feed Rate: 65.1 ml/h (space velocity=0.15/h); Hydrogen/Oil Ratio: 620 $Nm^3/m^3$ (3480 scf/bbl); Reactor Temperature: 385° C. (725° F.); Reactor Outlet Pressure: 15 MPa(g) (2200 psig)

Table 2 summarizes the anticipated impacts on key properties of HMFO.

TABLE 2

Expected Impact of Process on Key Properties of HMFO

| Property | Minimum | Typical | Maximum |
|---|---|---|---|
| Sulfur Conversion/Removal | 80% | 90% | 98% |
| Metals Conversion/Removal | 80% | 90% | 100% |
| MCR Reduction | 30% | 50% | 70% |
| Asphaltene Reduction | 30% | 50% | 70% |
| Nitrogen Conversion | 10% | 30% | 70% |
| C1 through Naphtha Yield | 0.5% | 1.0% | 4.0% |
| Hydrogen Consumption (scf/bbl) | 500 | 750 | 1500 |

Table 3 lists analytical tests to be carried out for the characterization of the Feedstock HMFO and Product HMFO. The analytical tests include those required by ISO for the Feedstock HMFO and the Product HMFO to qualify and trade in commerce as ISO compliant residual marine fuels. The additional parameters are provided so that one skilled in the art can understand and appreciate the effectiveness of the inventive process.

TABLE 3

Analytical Tests and Testing Procedures

| | |
|---|---|
| Sulfur Content | ISO 8754 or ISO 14596 or ASTM D4294 |
| Density @ 15° C. | ISO 3675 or ISO 12185 |
| Kinematic Viscosity @ 50° C. | ISO 3104 |
| Pour Point, ° C. | ISO 3016 |
| Flash Point, ° C. | ISO 2719 |
| CCAI | ISO 8217, ANNEX B |
| Ash Content | ISO 6245 |
| Total Sediment - Aged | ISO 10307-2 |
| Micro Carbon Residue, mass % | ISO 10370 |
| H2S, mg/kg | IP 570 |
| Acid Number | ASTM D664 |
| Water | ISO 3733 |
| Specific Contaminants | IP 501 or IP 470 (unless indicated otherwise) |
| Vanadium | |
| Sodium | |
| Aluminum | or ISO 14597 |
| Silicon | or ISO 10478 |
| Calcium | or ISO 10478 |
| Zinc | or IP 500 |
| Phosphorous | IP 500 |
| Nickle | |
| Iron | |
| Distillation | ASTM D7169 |
| C:H Ratio | ASTM D3178 |
| SARA Analysis | ASTM D2007 |
| Asphaltenes, wt % | ASTM D6560 |
| Total Nitrogen | ASTM D5762 |
| Vent Gas Component Analysis | FID Gas Chromatography or comparable |

Table 4 contains the Feedstock HMFO analytical test results and the Product HMFO analytical test results expected from the inventive process that indicate the production of a LS HMFO. It will be noted by one of skill in the art that under the conditions, the levels of hydrocarbon cracking will be minimized to levels substantially lower than 10%, more preferably less than 5% and even more preferably less than 1% of the total mass balance.

TABLE 4

Analytical Results

| | Feedstock HMFO | Product HMFO |
|---|---|---|
| Sulfur Content, mass % | 3.0 | 0.3 |
| Density @ 15° C., kg/m³ | 990 | 950 [1] |
| Kinematic Viscosity @ 50 C., mm²/s | 380 | 100 [1] |
| Pour Point, ° C. | 20 | 10 |
| Flash Point, C. | 110 | 100 [1] |
| CCAI | 850 | 820 |
| Ash Content, mass % | 0.1 | 0.0 |
| Total Sediment - Aged, mass % | 0.1 | 0.0 |
| Micro Carbon Residue, mass % | 13.0 | 6.5 |
| H2S, mg/kg | 0 | 0 |
| Acid Number, mg KO/g | 1 | 0.5 |
| Water, vol % | 0.5 | 0 |
| Specific Contaminants, mg/kg | | |
| Vanadium | 180 | 20 |
| Sodium | 30 | 1 |
| Aluminum | 10 | 1 |
| Silicon | 30 | 3 |
| Calcium | 15 | 1 |
| Zinc | 7 | 1 |
| Phosphorous | 2 | 0 |
| Nickle | 40 | 5 |
| Iron | 20 | 2 |
| Distillation, ° C./° F. | | |
| IBP | 160/320 | 120/248 |
| 5% wt | 235/455 | 225/437 |
| 10% wt | 290/554 | 270/518 |
| 30% wt | 410/770 | 370/698 |
| 50% wt | 540/1004 | 470/878 |
| 70% wt | 650/1202 | 580/1076 |
| 90% wt | 735/1355 | 660/1220 |
| FBP | 820/1508 | 730/1346 |
| C:H Ratio (ASTM D3178) | 1.2 | 1.3 |
| SARA Analysis | | |
| Saturates | 16 | 22 |
| Aromatics | 50 | 50 |
| Resins | 28 | 25 |
| Asphaltenes | 6 | 3 |
| Asphaltenes, wt % | 6.0 | 2.5 |
| Total Nitrogen, mg/kg | 4000 | 3000 |

Note:
[1] It is expected that property will be adjusted to a higher value by post process removal of light material via distillation or stripping from product HMFO.

The Product HMFO produced by the inventive process will reach ULS HMFO limits (i.e. 0.1% wt. sulfur Product HMFO) by systematic variation of the process parameters, for example by a lower space velocity or by using a Feedstock HMFO with a lower initial sulfur content.

Example 2: RMG-380 HMFO

Pilot Unit Set Up: A pilot unit was set up as noted above in Example 1 with these changes: the first reactor was loaded with: as the first (upper) layer encountered by the feedstock 70% vol Albemarle KFR 20 series hydrodemetallization catalyst and 30% vol Albemarle KFR 30 series hydro-transition catalyst as the second (lower) layer. The second reactor was loaded with 20% Albemarle KFR 30 series hydrotransition catalyst as the first (upper) layer and 80% vol hydrodesulfurization catalyst as the second (lower) layer. The catalyst was activated by sulfiding the catalyst with dimethyldisulfide (DMDS) in a manner well known to one of skill in the art.

Pilot Unit Operation: Upon completion of the activating step, the pilot unit was ready to receive the Feedstock HMFO and Activating Gas feed. The Activating Gas was technical grade or better hydrogen gas. The Feedstock HMFO was a commercially available and merchantable ISO8217:2017 compliant HMFO, except for a high sulfur content (2.9 wt %). The mixed Feedstock HMFO and Activating Gas was provided to the pilot plant at rates and conditions as specified in Table 5 below. The conditions were varied to optimize the level of sulfur in the Product HMFO material.

TABLE 5

Process Conditions

| Case | HC Feed Rate (ml/h), [LHSV(/h)] | Nm³ H₂/m³ oil/scf H₂/ bbl oil | Temp (° C./ ° F.) | Pressure (MPa(g)/ psig) | Product HMFO Sulfur % wt. |
|---|---|---|---|---|---|
| Baseline | 108.5 [0.25] | 570/3200 | 371/700 | 13.8/2000 | 0.24 |
| T1 | 108.5 [0.25] | 570/3200 | 362/684 | 13.8/2000 | 0.53 |
| T2 | 108.5 [0.25] | 570/3200 | 382/720 | 13.8/2000 | 0.15 |
| L1 | 130.2 [0.30] | 570/3200 | 372/702 | 13.8/2000 | 0.53 |
| S1 | 65.1 [0.15] | 620/3480 | 385/725 | 15.2/2200 | 0.10 |
| P1 | 108.5 [0.25] | 570/3200 | 371/700 | /1700 | 0.56 |
| T2/P1 | 108.5 [0.25] | 570/3200 | 382/720 | /1700 | 0.46 |

Analytical data for a representative sample of the Feedstock HMFO and representative samples of Product HMFO are below:

TABLE 6

Analytical Results - HMFO (RMG-380)

| | Feedstock | Product | Product |
|---|---|---|---|
| Sulfur Content, mass % | 2.9 | 0.3 | 0.1 |
| Density @ 15° C., kg/m³ | 988 | 932 | 927 |
| Kinematic Viscosity @ 50° C., mm²/s | 382 | 74 | 47 |
| Pour Point, ° C. | −3 | −12 | −30 |
| Flash Point, ° C. | 116 | 96 | 90 |
| CCAI | 850 | 812 | 814 |
| Ash Content, mass % | 0.05 | 0.0 | 0.0 |
| Total Sediment - Aged, mass % | 0.04 | 0.0 | 0.0 |
| Micro Carbon Residue, mass % | 11.5 | 3.3 | 4.1 |
| H2S, mg/kg | 0.6 | 0 | 0 |
| Acid Number, mg KO/g | 0.3 | 0.1 | >0.05 |
| Water, vol % | 0 | 0.0 | 0.0 |

TABLE 6-continued

Analytical Results - HMFO (RMG-380)

| | Feedstock | Product | Product |
|---|---|---|---|
| Specific Contaminants, mg/kg | | | |
| Vanadium | 138 | 15 | <1 |
| Sodium | 25 | 5 | 2 |
| Aluminum | 21 | 2 | <1 |
| Silicon | 16 | 3 | 1 |
| Calcium | 6 | 2 | <1 |
| Zinc | 5 | <1 | <1 |
| Phosphorous | <1 | 2 | 1 |
| Nickle | 33 | 23 | 2 |
| Iron | 24 | 8 | 1 |
| Distillation, ° C./° F. | | | |
| IBP | 178/352 | 168/334 | 161/322 |
| 5% wt | 258/496 | 235/455 | 230/446 |
| 10% wt | 298/569 | 270/518 | 264/507 |
| 30% wt | 395/743 | 360/680 | 351/664 |
| 50% wt | 517/962 | 461/862 | 439/822 |
| 70% wt | 633/1172 | 572/1062 | 552/1026 |
| 90% wt | >720/>1328 | 694/1281 | 679/1254 |
| FBP | >720/>1328 | >720/>1328 | >720/>1328 |
| C:H Ratio (ASTM D3178) | 1.2 | 1.3 | 1.3 |
| SARA Analysis | | | |
| Saturates | 25.2 | 28.4 | 29.4 |
| Aromatics | 50.2 | 61.0 | 62.7 |
| Resins | 18.6 | 6.0 | 5.8 |
| Asphaltenes | 6.0 | 4.6 | 2.1 |
| Asphaltenes, wt % | 6.0 | 4.6 | 2.1 |
| Total Nitrogen, mg/kg | 3300 | 1700 | 1600 |

In Table 6 above, both Feedstock HMFO and Product HMFO exhibited properties consistent with ISO8217:2017 Table 2 residual marine fuel, except that the sulfur content of the Feedstock HMFO was too high to comply with IMO 2020, and which was reduced as noted above in the Product HMFO.

One of skill in the art will appreciate that the above Product HMFO produced by the inventive process has achieved not only an ISO 8217:2017 Table 2 residual marine fuel marketable as a LS HMFO (i.e. 0.5% wt. sulfur) but also an ISO 8217:2017 Table 2 residual marine fuel marketable as a ULS HMFO limits (i.e. 0.1% wt. sulfur).

Example 3: RMK-500 HMFO

The feedstock to the pilot reactor utilized in example 2 above was changed to a commercially available and merchantable ISO8217:2017 RMK-500 compliant HMFO, except that it has high Environmental Contaminants (i.e. sulfur (3.3 wt %)). Other bulk characteristic of the RMK-500 feedstock high sulfur HMFO are provide below:

TABLE 7

Analytical Results- Feedstock HMFO (RMK-500)

| Sulfur Content, mass % | 3.3 |
|---|---|
| Density @ 15° C., kg/m³ | 1006 |
| Kinematic Viscosity @ 50° C., mm²/s | 500 |

The mixed Feedstock (RMK-500) HMFO and Activating Gas was provided to the pilot plant at rates and conditions and the resulting sulfur levels achieved in the table below

TABLE 8

Process Conditions

| Case | HC Feed Rate (ml/h), [LHSV(/h)] | Nm³ H₂/m³ oil/scf H₂/bbl oil | Temp (° C./° F.) | Pressure (MPa(g)/psig) | Product (RMK-500) sulfur % wt. |
|---|---|---|---|---|---|
| A | 108.5 [0.25] | 640/3600 | 377/710 | 13.8/2000 | 0.57 |
| B | 95.5 [0.22] | 640/3600 | 390/735 | 13.8/2000 | 0.41 |
| C | 95.5 [0.22] | 640/3600 | 390/735 | 11.7/1700 | 0.44 |
| D | 95.5 [0.22] | 640/3600 | 393/740 | 10.3/1500 | 0.61 |
| E | 95.5 [0.22] | 640/3600 | 393/740 | 17.2/2500 | 0.37 |
| F | 95.5 [0.22] | 640/3600 | 393/740 | 8.3/1200 | 0.70 |
| G | 95.5 [0.22] | 640/3600 | 416/780 | 8.3/1200 | |

The resulting Product (RMK-500) HMFO exhibited observed bulk properties consistent with the Feedstock (RMK-500) HMFO (i.e. compliance with ISO 8217:2017 Table 2 as a residual marine fuel, except that the sulfur content was reduced as noted in the above table.

One of skill in the art will appreciate that the above Product HMFO produced by the inventive process has achieved a LS HMFO (i.e. 0.5% wt. sulfur) Product HMFO having bulk characteristics of a ISO 8217:2017 Table 2 residual marine fuel classified as a compliant RMK-500 residual fuel oil. It will also be appreciated that the process can be successfully carried out under hydrodesulfurization and hydrodemetallization conditions (i.e. lower temperature and pressure) that substantially reduce the hydrocracking of the feedstock material. The prior art teaches that these conditions are not suitable for heavy oils in such reactions as they would lead to rapid coking and deactivation of the catalyst. Clearly that is not the result when an ISO 8217: 2017 Table 2 compliant feedstock is utilized. When conditions were increased to much higher pressure (Example E) a product with a lower sulfur content was achieved, however it was observed that there was an increase in light hydrocarbons and wild naphtha production and increased coking of the catalyst.

It will be appreciated by those skilled in the art that changes could be made to the illustrative embodiments described above without departing from the broad inventive concepts thereof. It is understood, therefore, that the inventive concepts disclosed are not limited to the illustrative embodiments or examples disclosed, but it should cover modifications within the scope of the inventive concepts as defined by the claims.

The invention claimed is:

1. A device for the production of a Product Heavy Marine Fuel Oil, the device comprising: a gas/liquid mixing device for mixing a quantity of Feedstock Heavy Marine Fuel Oil with a quantity of Activating Gas to give a Feedstock Mixture; a Reactor Feed Furnace in fluid communication with said gas/liquid mixing device, wherein in the Reactor Feed Furnace the Feedstock Mixture is heated to a specified process temperature in the range from 500° F. to 900° F.; a Reaction System in fluid communication with the Reactor Feed Furnace, wherein the Reaction System comprises at least one first reactor train and at least one second reactor train, wherein each of the first reactor train and the second reactor train comprise of at least two reactor vessels, each reactor vessel contains one or more fixed bed internal structure selected from the group consisting of trays, perforated support plates, fixed catalyst beds, structured fixed catalyst beds, Raschig rings, Dixon rings, and combinations of these and in a sufficient amount to promote the transformation of the Feedstock Mixture to a Process Mixture under Reactive Conditions of hydrodesulfurization and minimal thermal hydrocracking and catalytic hydrocracking; at least one separating vessel in fluid communication with the Reaction System, wherein said at least one separating vessel receives said Process Mixture and separates the Process Mixture into bulk gaseous components, by-product hydrocarbons having a boiling point less than 150 F, and a Product Heavy Marine Fuel Oil, and a discharge pipe, the discharge pipe being in fluid communication with the at least one separating vessel, wherein the discharge pipe discharges the Product Heavy Marine Fuel oil from the separating vessel.

2. The device of claim 1, wherein the Feedstock Heavy Marine Fuel Oil complies with ISO 8217: 2017 Table 2 as a residual marine fuel except for a sulfur content (ISO 14596 or ISO 8754) greater than 0.5 wt % and wherein the Product Heavy Marine Fuel Oil complies with ISO 8217: 2017 Table 2 as a residual marine fuel and has a sulfur content (ISO 14596 or ISO 8754) less than 0.5 wt %.

3. The device of claim 2, wherein the Reaction system contains a catalyst, wherein the catalyst comprises: a porous inorganic oxide catalyst carrier and a transition metal catalyst, wherein the porous inorganic oxide catalyst carrier is at least one carrier selected from the group consisting of alumina, alumina/boria carrier, a carrier containing metal-containing aluminosilicate, alumina/phosphorus carrier, alumina/alkaline earth metal compound carrier, alumina/titania carrier and alumina/zirconia carrier, and wherein the transition metal catalyst is one or more metals selected from the group consisting of group 6, 8, 9 and 10 of the Periodic Table.

4. The device of claim 2, wherein the Reaction System comprises at least six reactor vessels wherein said reactor vessels are configured in a matrix of at least three reactors arranged in series to form two reactor trains and wherein the two reactor trains arranged in parallel and configured such that Process Mixture can be distributed across the matrix.

5. The device of claim 4, wherein the first reactor in each reactor train is loaded with a first catalyst mixture, the second reactor in each reactor train is loaded with a second catalyst mixture and the third reactor is loaded with a third catalyst mixture, and wherein the first catalyst mixture, second catalyst mixture and third catalyst mixture are not the same.

6. A device for the production of a Product Heavy Marine Fuel Oil, the device comprising: a gas/liquid mixing device for mixing a quantity of Feedstock Heavy Marine Fuel Oil with a quantity of Activating Gas to give a Feedstock Mixture; a Reactor Feed Furnace in fluid communication with said gas/liquid mixing device, wherein in the Reactor Feed Furnace the Feedstock Mixture is heated to the specified process temperature in the range from 500° F. to 900° F.; a Reaction System in fluid communication with the Reactor Feed Furnace, wherein the Reaction System comprises one or more reactor train, wherein each of the one or more reactor train comprise of at least two reactor vessels, and wherein each reactor vessel contains one or more internal fixed catalyst bed, wherein each internal fixed catalyst bed is defined by a internal volume of the reactor between and upstream distribution plate and a downstream support plate, and said internal volume contains one or more materials selected from the group consisting of: sulfide activated transitional metal catalyst on a porous inorganic oxide support material; inactive porous inorganic oxide support material; Raschig rings; Dixon rings; and combinations of these selected, and wherein the volume of catalyst is in an amount to promote the transformation of the Feedstock Mixture to a Process Mixture under Reactive Conditions of hydrodesulfurization and hydrodemetallization and minimal thermal hydrocracking and catalytic hydrocracking; at least one separating vessel in fluid communication with the Reaction System, wherein said at least one separating vessel receives said Process Mixture and separates the Product Heavy Marine Fuel Oil component from the Process Mixture, and at least one discharge pipe, the at least one discharge pipe being in fluid communication with the at least one separating vessel, wherein the discharge pipe discharges the Product Heavy Marine Fuel Oil component from the separating vessel.

7. The device of claim 6, wherein the sulfide activated transitional metal catalyst on a porous inorganic oxide support comprises: a porous inorganic oxide catalyst carrier and a transition metal catalyst, wherein the porous inorganic oxide catalyst carrier is at least one carrier selected from the group consisting of alumina, alumina/boria carrier, a carrier containing metal-containing aluminosilicate, alumina/phosphorus carrier, alumina/alkaline earth metal compound carrier, alumina/titania carrier and alumina/zirconia carrier, and wherein the transition metal catalyst is one or more metals selected from the group consisting of group 6, 8, 9 and 10 of the Periodic Table.

8. The device of claim 6, wherein the first reactor of the at least one reactor train contains at least one fixed catalyst bed within which the sulfide activated transitional metal catalyst on a porous inorganic oxide has hydrodemetallization activity and the second reactor of the at least one reactor train contains at least one fixed catalyst bed within which the sulfide activated transitional metal catalyst on a porous inorganic oxide has hydrodesulfurization activity.

* * * * *